(12) United States Patent
Maeda et al.

(10) Patent No.: US 7,023,019 B2
(45) Date of Patent: Apr. 4, 2006

(54) LIGHT-EMITTING SEMICONDUCTOR DEVICE, LIGHT-EMITTING SYSTEM AND METHOD FOR FABRICATING LIGHT-EMITTING SEMICONDUCTOR DEVICE

(75) Inventors: Toshihide Maeda, Kagoshima (JP); Shozo Oshio, Hirakata (JP); Katsuaki Iwama, Suita (JP); Hiromi Kitahara, Kagoshima (JP); Tadaaki Ikeda, Kagoshima (JP); Hidenori Kamei, Fukuoka (JP); Yasuyuki Hanada, Fukuoka (JP); Kei Sakanoue, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 136 days.

(21) Appl. No.: 10/469,740
(22) PCT Filed: Sep. 3, 2002
(86) PCT No.: PCT/JP02/08959
§ 371 (c)(1),
(2), (4) Date: Sep. 3, 2003
(87) PCT Pub. No.: WO03/021691
PCT Pub. Date: Mar. 13, 2003

(65) Prior Publication Data
US 2004/0104391 A1 Jun. 3, 2004

(30) Foreign Application Priority Data

Sep. 3, 2001 (JP) .............................. 2001-265540
Dec. 14, 2001 (JP) .............................. 2001-381368
Dec. 14, 2001 (JP) .............................. 2001-381369
Dec. 14, 2001 (JP) .............................. 2001-381370

(51) Int. Cl.
*H01L 33/00* (2006.01)
(52) U.S. Cl. .......................... 257/89; 257/79; 257/99; 313/502; 313/503; 313/506

(58) Field of Classification Search ................. 257/79, 257/89, 99; 313/502, 503, 506
See application file for complete search history.

(56) References Cited

U.S. PATENT DOCUMENTS 6,294,800 B1 * 9/2001 Duggal et al. ................ 257/89

(Continued)

FOREIGN PATENT DOCUMENTS

JP           60-177028 A       9/1985

(Continued)

OTHER PUBLICATIONS

Thomas L. Barry, "Fluorescence of $Eu^{2+}$-Activated Phases in Binary Alkaline Earth Orthosilicate Systems", J. Electrochem. Soc. vol. 115, No. 11, pp. 1181-1184, Nov., 1968.

(Continued)

*Primary Examiner*—David Nelms
*Assistant Examiner*—Dao H. Nguyen
(74) *Attorney, Agent, or Firm*—McDermott Will & Emery LLP

(57) ABSTRACT

A chip-type light-emitting semiconductor device includes: a substrate 4; a blue LED 1 mounted on the substrate 4; and a luminescent layer 3 made of a mixture of yellow/yellowish phosphor particles 2 and a base material 13 (translucent resin). The yellow/yellowish phosphor particles 2 is a silicate phosphor which absorbs blue light emitted by the blue LED 1 to emit a fluorescence having a main emission peak in the wavelength range from 550 nm to 600 nm, inclusive, and which contains, as a main component, a compound expressed by the chemical formula: $(Sr_{1-a1-b1-x} Ba_{a1} Ca_{b1} Eu_x)_2 SiO_4$ ($0 \leq a1 \leq 0.3$, $0 \leq b1 \leq 0.8$ and $0 < x < 1$). The silicate phosphor particles disperse substantially evenly in the resin easily. As a result, excellent white light is obtained.

19 Claims, 48 Drawing Sheets

U.S. PATENT DOCUMENTS

| | | | |
|---|---|---|---|
| 6,429,583 B1 * | 8/2002 | Levinson et al. | 313/503 |
| 6,621,211 B1 * | 9/2003 | Srivastava et al. | 313/503 |
| 6,680,569 B1 * | 1/2004 | Mueller-Mach et al. | 313/502 |

FOREIGN PATENT DOCUMENTS

| | | |
|---|---|---|
| JP | 05-230451 | 9/1993 |
| JP | 05-334999 | 12/1993 |
| JP | 10-77468 A | 3/1998 |
| JP | 10-163535 | 6/1998 |
| JP | 11-31845 | 2/1999 |
| JP | 11-87778 A | 3/1999 |
| JP | 11-145519 A | 5/1999 |
| JP | 2927279 | 5/1999 |
| JP | 11-233831 A | 8/1999 |
| JP | 2000-17257 A | 1/2000 |
| JP | 2000-31547 A | 1/2000 |
| JP | 2000-87030 A | 3/2000 |
| JP | 2000-147766 A | 5/2000 |
| JP | 2000-150966 A | 5/2000 |
| JP | P2000-208822 A | 7/2000 |
| JP | 2000-228544 A | 8/2000 |
| JP | P2000-244021 A | 9/2000 |
| JP | 2000-345152 A | 12/2000 |
| JP | 2000-349346 A | 12/2000 |
| JP | 2001-15817 A | 1/2001 |
| JP | 2001-148516 A | 5/2001 |
| JP | P2001-143869 A | 5/2001 |
| JP | 2001-196639 A | 7/2001 |
| JP | 2001-228809 A | 8/2001 |
| WO | WO 98/05078 | 2/1998 |
| WO | WO 98/12757 A1 | 3/1998 |
| WO | WO 02/11214 A1 | 2/2002 |
| WO | WO 02/054502 A1 | 7/2002 |

OTHER PUBLICATIONS

Keith H. Butler, "Fluorescence Lamp Phosphors", The Pennyslvania State University Press, pp. 270-279, 1980.

* cited by examiner

PRIOR ART

PRIOR ART (Ca$_{0.19}$Sr$_{0.55}$Ba$_{0.24}$Eu$_{0.02}$)$_2$SiO$_4$ phosphor $(Ca_{b3}Sr_{0.93-b3}Ba_{0.05}Eu_{0.02})_2SiO_4$ phosphor

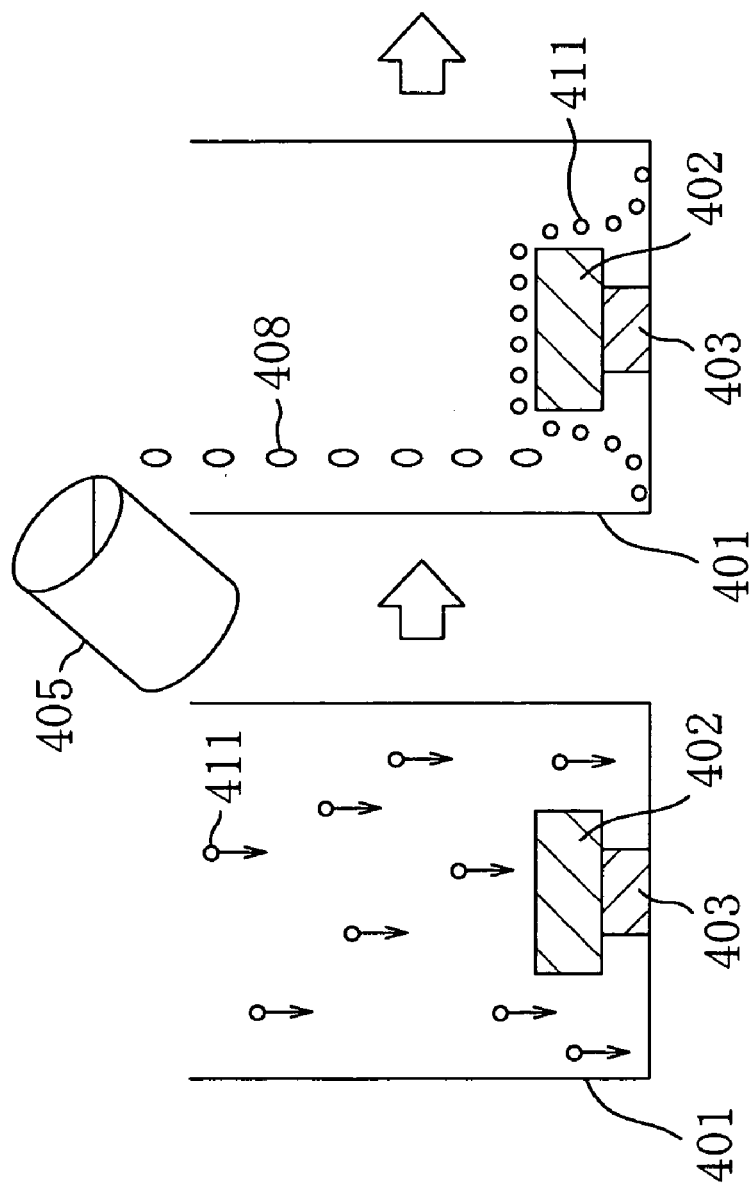

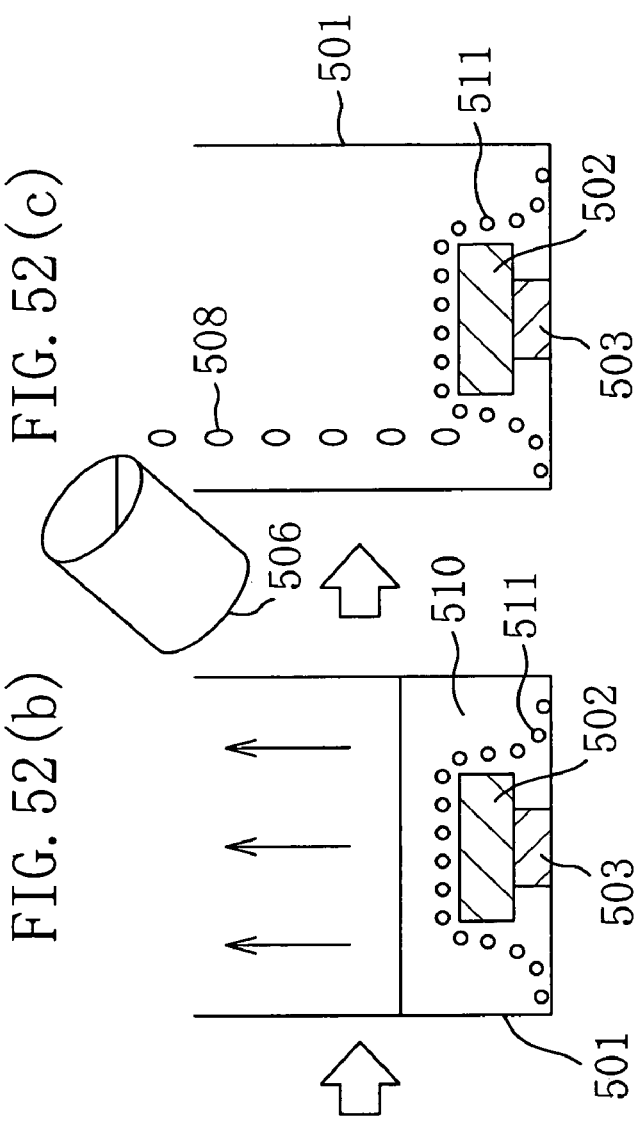
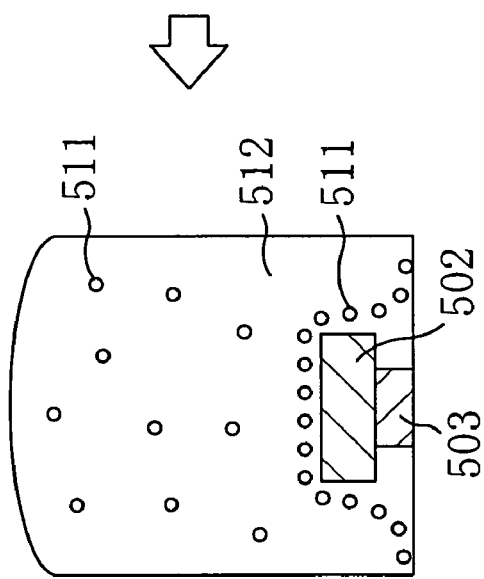
FIG. 52(a) FIG. 52(b) FIG. 52(c) FIG. 52(d)

FIG. 53 phosphor characteristics table

| sample NO | composition (including estimated values) | Ca substitution amount (at. %) | Sr substitution amount (at. %) | Ba substitution amount (at. %) | Eu substitution amount (at. %) | Si substitution amount (at. %) | Ge substitution amount (at. %) | main crystal structure(s) | emission peak wavelength (nm) | emission color | relative emission intensity(%) | chromaticity x | chromaticity y | absolute specific gravity |
|---|---|---|---|---|---|---|---|---|---|---|---|---|---|---|
| 1 | (Ca0.98Eu0.02)2SiO4 | 98 | 0 | 0 | 2.0 | 100 | 0 | monoclinic system | 506 | green | 41 | 0.2864 | 0.4834 | - |
| 2 | (Ca0.8Sr0.18Eu0.02)2SiO4 | 80 | 18 | 0 | 2.0 | 100 | 0 | orthorhombic system | 531 | green | 20 | 0.3424 | 0.4925 | - |
| 3 | (Ca0.6Sr0.38Eu0.02)2SiO4 | 60 | 38 | 0 | 2.0 | 100 | 0 | orthorhombic system | 532 | green | 15 | 0.3758 | 0.4673 | - |
| 4 | (Ca0.4Sr0.58Eu0.02)2SiO4 | 40 | 58 | 0 | 2.0 | 100 | 0 | orthorhombic system | 595 | yellow | 18 | 0.4328 | 0.4532 | - |
| 5 | (Ca0.2Sr0.78Eu0.02)2SiO4 | 20 | 78 | 0 | 2.0 | 100 | 0 | orthorhombic system | 578 | yellow | 28 | 0.4660 | 0.4629 | - |
| 6 | (Sr0.985Eu0.015)2SiO4 | 0 | 98.5 | 0 | 1.5 | 100 | 0 | monoclinic system | 545 | green | 64 | 0.3562 | 0.5343 | - |
| 7 | (Ba0.05Ca0.93Eu0.02)2SiO4 | 93 | 0 | 5 | 2.0 | 100 | 0 | monoclinic system | 512 | green | 35 | 0.2832 | 0.4830 | - |
| 8 | (Ba0.05Ca0.76Sr0.17Eu0.02)2SiO4 | 76 | 17 | 5 | 2.0 | 100 | 0 | orthorhombic system | 540 | green | 30 | 0.3744 | 0.4918 | - |
| 9 | (Ba0.05Ca0.57Sr0.36Eu0.02)2SiO4 | 57 | 36 | 5 | 2.0 | 100 | 0 | orthorhombic system | 559 | yellow | 29 | 0.4193 | 0.4779 | - |
| 10 | (Ba0.05Ca0.38Sr0.55Eu0.02)2SiO4 | 38 | 55 | 5 | 2.0 | 100 | 0 | orthorhombic system | 592 | yellow | 42 | 0.4666 | 0.4624 | - |
| 11 | (Ba0.05Ca0.19Sr0.74Eu0.02)2SiO4 | 19 | 74 | 5 | 2.0 | 100 | 0 | orthorhombic system | 578 | yellow | 60 | 0.4838 | 0.4701 | - |
| 12 | (Ba0.05Ca0.93Eu0.02)2SiO4 | 0 | 93 | 5 | 2.0 | 100 | 0 | orthorhombic system | 575 | yellow | 79 | 0.4682 | 0.4969 | 4.53 |
| 13 | (Ba0.0003Sr0.9847Eu0.015)2SiO4 | 0 | 98.47 | 0.03 | 1.5 | 100 | 0 | monoclinic system | 545 | green | 63 | 0.3594 | 0.5312 | - |
| 14 | (Ba0.001Sr0.984Eu0.015)2SiO4 | 0 | 98.40 | 0.1 | 1.5 | 100 | 0 | monoclinic system | 546 | green | 62 | 0.3692 | 0.5269 | - |
| 15 | (Ba0.003Sr0.982Eu0.015)2SiO4 | 0 | 98.20 | 0.3 | 1.5 | 100 | 0 | monoclinic system or orthorhombic system | 554 | yellow | 49 | 0.4025 | 0.5088 | - |
| 16 | (Ba0.01Sr0.975Eu0.015)2SiO4 | 0 | 97.50 | 1 | 1.5 | 100 | 0 | orthorhombic system | 578 | yellow | 51 | 0.4494 | 0.4874 | - |
| 17 | (Ba0.03Sr0.955Eu0.015)2SiO4 | 0 | 95.50 | 3 | 1.5 | 100 | 0 | orthorhombic system | 575 | yellow | 55 | 0.4517 | 0.4898 | - |
| 18 | (Ba0.24Sr0.74Eu0.02)2SiO4 | 0 | 74 | 24 | 2.0 | 100 | 0 | orthorhombic system | 559 | yellow | 86 | 0.4283 | 0.5395 | 4.67 |
| 19 | (Ba0.43Sr0.55Eu0.02)2SiO4 | 0 | 55 | 43 | 2.0 | 100 | 0 | orthorhombic system | 532 | green | 120 | 0.3358 | 0.6011 | - |
| 20 | (Ba0.62Sr0.36Eu0.02)2SiO4 | 0 | 36 | 62 | 2.0 | 100 | 0 | orthorhombic system | 510 | green | 163 | 0.2414 | 0.6346 | - |
| 21 | (Ba0.81Sr0.17Eu0.02)2SiO4 | 0 | 17 | 81 | 2.0 | 100 | 0 | orthorhombic system | 515 | green | 151 | 0.2130 | 0.6190 | - |
| 22 | (Ba0.98Eu0.02)2SiO4 | 0 | 0 | 98 | 2.0 | 100 | 0 | orthorhombic system | 504 | green | 168 | 0.1571 | 0.5632 | - |
| 23 | (Ca0.19Ba0.79Eu0.02)2SiO4 | 19 | 0 | 79 | 2.0 | 100 | 0 | hexagonal system | 513 | green | 93 | 0.2177 | 0.4226 | - |
| 24 | (Ca0.38Ba0.60Eu0.02)2SiO4 | 38 | 0 | 60 | 2.0 | 100 | 0 | hexagonal system | 512 | green | 59 | 0.2787 | 0.4226 | - |
| 25 | (Ca0.57Ba0.41Eu0.02)2SiO4 | 57 | 0 | 41 | 2.0 | 100 | 0 | hexagonal system | 513 | green | 41 | 0.2878 | 0.4318 | - |
| 26 | (Ca0.76Ba0.22Eu0.02)2SiO4 | 76 | 0 | 22 | 2.0 | 100 | 0 | orthorhombic system | 529 | green | 28 | 0.3133 | 0.4610 | - |
| 27 | (Ca0.19Sr0.55Ba0.24Eu0.02)2SiO4 | 19 | 55 | 24 | 2.0 | 100 | 0 | orthorhombic system | 568 | yellow | 60 | 0.4428 | 0.5193 | - |
| 28 | (Sr0.84Ba0.14Eu0.02)2(Si0.8Ge0.2)O4 | 0 | 84 | 14 | 2.0 | 80 | 20 | orthorhombic system | 559 | yellow | 4 | 0.3277 | 0.4284 | - |
| 29 | (Sr0.999Eu0.001)2SiO4 | 0 | 99.9 | 0 | 0.1 | 100 | 0 | monoclinic system | 535 | green | 91 | 0.2546 | 0.4122 | - |
| 30 | (Sr0.997Eu0.003)2SiO4 | 0 | 99.7 | 0 | 0.3 | 100 | 0 | monoclinic system | 534 | green | 117 | 0.2796 | 0.4711 | - |
| 31 | (Sr0.99Eu0.01)2SiO4 | 0 | 99.0 | 0 | 1.0 | 100 | 0 | monoclinic system | 535 | green | 125 | 0.3191 | 0.5533 | - |
| 32 | (Sr0.97Eu0.03)2SiO4 | 0 | 97.0 | 0 | 3.0 | 100 | 0 | monoclinic system | 542 | green | 106 | 0.3445 | 0.5873 | - |
| 33 | (Sr0.9Eu0.1)2SiO4 | 0 | 90.0 | 0 | 10.0 | 100 | 0 | monoclinic system | 548 | green | 72 | 0.3738 | 0.5660 | - |
| 34 | (Sr0.7Eu0.3)2SiO4 | 0 | 70.0 | 0 | 30.0 | 100 | 0 | orthorhombic system | 576 | yellow | 9 | 0.4663 | 0.4968 | - |
| 35 | (Sr0.949Ba0.05Eu0.001)2SiO4 | 0 | 94.9 | 5 | 0.1 | 100 | 0 | orthorhombic system | 559 | yellow | 63 | 0.3548 | 0.4577 | - |
| 36 | (Sr0.947Ba0.05Eu0.003)2SiO4 | 0 | 94.7 | 5 | 0.3 | 100 | 0 | orthorhombic system | 573 | yellow | 75 | 0.3906 | 0.4749 | - |
| 37 | (Sr0.945Ba0.05Eu0.005)2SiO4 | 0 | 94.5 | 5 | 0.5 | 100 | 0 | orthorhombic system | 569 | yellow | 81 | 0.4092 | 0.4838 | - |
| 38 | (Sr0.94Ba0.05Eu0.01)2SiO4 | 0 | 94.0 | 5 | 1.0 | 100 | 0 | orthorhombic system | 578 | yellow | 83 | 0.4464 | 0.4929 | - |
| 39 | (Sr0.935Ba0.05Eu0.015)2SiO4 | 0 | 93.5 | 5 | 1.5 | 100 | 0 | orthorhombic system | 578 | yellow | 85 | 0.4616 | 0.4938 | - |
| 40 | (Sr0.93Ba0.05Eu0.02)2SiO4 | 0 | 93.0 | 5 | 2.0 | 100 | 0 | orthorhombic system | 577 | yellow | 82 | 0.4697 | 0.4925 | - |
| 41 | (Sr0.925Ba0.05Eu0.025)2SiO4 | 0 | 92.5 | 5 | 2.5 | 100 | 0 | orthorhombic system | 578 | yellow | 78 | 0.4692 | 0.4930 | - |
| 42 | (Sr0.92Ba0.05Eu0.03)2SiO4 | 0 | 92.0 | 5 | 3.0 | 100 | 0 | orthorhombic system | 578 | yellow | 72 | 0.4769 | 0.4881 | - |
| 43 | (Sr0.85Ba0.05Eu0.1)2SiO4 | 0 | 85.0 | 5 | 10.0 | 100 | 0 | orthorhombic system | 579 | yellow | 31 | 0.4904 | 0.4458 | - |
| 44 | (Sr0.65Ba0.05Eu0.3)2SiO4 | 0 | 65.0 | 5 | 30.0 | 100 | 0 | orthorhombic system | 578 | yellow | 3 | 0.4023 | 0.2938 | - |
| 45 | (Ca0.015Sr0.931Ba0.05Eu0.001)2SiO4 | 1.5 | 93.1 | 5 | 0.1 | 100 | 0 | orthorhombic system | 570 | yellow | 78 | 0.4059 | 0.4891 | - |
| 46 | (Ca0.015Sr0.926Ba0.05Eu0.003)2SiO4 | 1.5 | 92.6 | 5 | 0.3 | 100 | 0 | orthorhombic system | 570 | yellow | 84 | 0.4430 | 0.4971 | - |
| 47 | (Ca0.015Sr0.921Ba0.05Eu0.015)2SiO4 | 1.5 | 92.1 | 5 | 1.5 | 100 | 0 | orthorhombic system | 578 | yellow | 85 | 0.4610 | 0.5009 | - |
| 48 | (Ca0.015Sr0.916Ba0.05Eu0.02)2SiO4 | 1.5 | 91.6 | 5 | 2.0 | 100 | 0 | orthorhombic system | 578 | yellow | 80 | 0.4771 | 0.5003 | - |
| 49 | (Ca0.015Sr0.911Ba0.05Eu0.025)2SiO4 | 1.5 | 91.1 | 5 | 2.5 | 100 | 0 | orthorhombic system | 578 | yellow | 71 | 0.4750 | 0.5007 | - |
| 50 | (Ca0.015Sr0.931Ba0.049Eu0.005)2SiO4 | 1.5 | 93.1 | 4.9 | 0.5 | 100 | 0 | orthorhombic system | 568 | yellow | 78 | 0.4214 | 0.4933 | - |
| 51 | (Ca0.015Sr0.926Ba0.049Eu0.015)2SiO4 | 1.5 | 92.6 | 4.9 | 1.5 | 100 | 0 | orthorhombic system | 573 | yellow | 76 | 0.4502 | 0.5005 | - |
| 52 | (Ca0.015Sr0.921Ba0.049Eu0.015)2SiO4 | 1.5 | 92.1 | 4.9 | 1.5 | 100 | 0 | orthorhombic system | 578 | yellow | 78 | 0.4577 | 0.5000 | - |
| 53 | (Ca0.015Sr0.916Ba0.049Eu0.02)2SiO4 | 1.5 | 91.6 | 4.9 | 2.0 | 100 | 0 | orthorhombic system | 578 | yellow | 75 | 0.4769 | 0.4994 | - |
| 54 | (Ca0.015Sr0.911Ba0.049Eu0.025)2SiO4 | 1.5 | 91.1 | 4.9 | 2.5 | 100 | 0 | orthorhombic system | 578 | yellow | 72 | 0.4743 | 0.5014 | - |

FIG. 54

| sample NO | phosphor | phosphor weight (%) | luminance (mcd) | total luminous flux (mv) | total radiant flux (mv) | chromaticity x | chromaticity y |
|---|---|---|---|---|---|---|---|
| A | silicate | 49.6 | 125.087 | 75.318 | 150.549 | 0.3504 | 0.3863 |
| B | silicate | 49.8 | 131.007 | 77.848 | 155.445 | 0.3582 | 0.3989 |
| C | silicate | 50.7 | 121.547 | 75.497 | 149.465 | 0.3493 | 0.3927 |
| D | YAG | 7.4 | 171.5 | 110.465 | 243.2 | 0.3167 | 0.3436 |
| E | YAG | 9.8 | 178.347 | 104.841 | 237.8 | 0.3577 | 0.3899 |
| F | silicate | 49.9 | 106.9867 | 62.734 | 127.5747 | 0.3954 | 0.4368 |
| G | silicate | 40.0 | 116.4667 | 75.562 | 151.546 | 0.3314 | 0.3633 |
| H | silicate | 30.1 | 129.46 | 95.76 | 190.5233 | 0.2677 | 0.2816 |
| I | silicate | 50.3 | 106.9333 | 64.4753 | 129.616 | 0.3791 | 0.4221 |
| J | silicate | 40.0 | 130.3533 | 86.802 | 171.4407 | 0.3159 | 0.3495 |
| K | silicate | 30.0 | 130.6667 | 99.8687 | 197.8747 | 0.2611 | 0.274 | value:average

FIG. 55

|  | sample 1 | sample 2 | sample 3 |
|---|---|---|---|
| phosphor weight % | 28.75916579 | 29.80932415 | 29.25678333 |
| Aerosil concentration(%) |  | 0.570473617 | 1.113535297 |
| luminance | 143.66 | 124.725 | 136.5 |
| chromaticity (x/y) | 0.2728/0.2876 | 0.3043/0.3254 | 0.3068/0.3331 |
| total luminous flux | 107.552 | 87.1425 | 96.386 |
| total radiant flux | 214.402 | 175.1425 | 192.506 |
| luminance σ | 8.4512 | 9.5224 | 5.6546 |
| chromaticity x σ | 0.0057 | 0.0047 | 0.0017 |
| total luminous flux σ | 8.3984 | 8.5043 | 3.7828 |
| total radiant flux σ | 14.3229 | 14.1296 | 7.9054 |

LIGHT-EMITTING SEMICONDUCTOR DEVICE, LIGHT-EMITTING SYSTEM AND METHOD FOR FABRICATING LIGHT-EMITTING SEMICONDUCTOR DEVICE

TECHNICAL FIELD

The present invention relates to light-emitting semiconductor devices utilizing blue-light-emitting diodes (hereinafter, referred to as blue LEDs) and yellow/yellowish phosphors in combination to emit white light, light-emitting systems using the light-emitting semiconductor devices, and methods for fabricating the light-emitting semiconductor devices.

BACKGROUND ART

A light-emitting semiconductor device utilizing a blue LED (strictly speaking, a blue LED chip) having a main emission peak in the blue wavelength range from 400 nm to 530 nm, both inclusive, and a luminescent layer containing an inorganic phosphor (hereinafter, simply referred to as a "phosphor") that absorbs blue light emitted by the blue LED and produces a fluorescence having an emission peak within a visible wavelength range from green to yellow (in the range of about 530 nm to about 580 nm) in combination is known to date. Light emitted from an LED that excites a phosphor is herein referred to as "excitation light". The spectrum of the light is herein referred to as an "excitation spectrum". The intensity peak thereof is herein referred to as an "excitation light peak".

Such a light-emitting semiconductor device is disclosed in Japanese Patent No. 2927279, Japanese Laid-Open Publication Nos. 10-163535, 2000-208822 and 2000-244021, for example.

In Japanese Patent No. 2927279, a light-emitting semiconductor device utilizing a blue LED using a gallium nitride-based compound semiconductor as a light-emitting layer and having an emission peak in the wavelength range from 400 nm to 530 nm, both inclusive, and an $(RE_{1-x}Sm_x)_3(Al_yGa_{1-y})_5O_{12}$:Ce phosphor (where $0 \leq x < 1$, $0 \leq y \leq 1$ and RE is at least one rare-earth element selected from among Y and Gd) (hereinafter, referred to as a "YAG-based phosphor") in combination.

Considering the fact that the YAG-based phosphor produces an emission highly efficiently at a peak around 580 nm (yellow light) under blue light emitted by the blue LED (excitation light), it is described in the patent that the light-emitting semiconductor device is implemented as a white-light-emitting semiconductor device which emits white light by adding the colors of the blue light emitted by the blue LED and of the light emitted by the YAG-based phosphor together.

In Japanese Laid-Open Publication No. 10-163535, disclosed is a white-light-emitting semiconductor device utilizing a blue or violet LED and one or more types of phosphors each absorbing light emitted by the LED to produce emission in a visible range in combination. As a phosphor, blue, green, yellow, orange and red phosphors containing (Zn, Cd)S as a phosphor base and a $(Y, Gd)_3(Al, Ga)_5O_{12}$:Ce, Eu phosphor are disclosed. The $(Y, Gd)_3(Al, Ga)_5O_{12}$:Ce, Eu phosphor is considered a YAG-based phosphor from a scientific standpoint.

In addition, in Japanese Laid-Open Publication No. 10-163535, also disclosed is a white-light-emitting semiconductor device producing an emission by adding the color of lights from the blue LED to the color of the YAG-based phosphor in which an emission chromatically point (x, y) of the emission is in the range $0.21 \leq x \leq 0.48$ and $0.19 \leq y \leq 0.45$ in a CIE chromaticity diagram.

Further, in Japanese Laid-Open Publications Nos. 2000-208822 and 2000-244021, white-light-emitting semiconductor devices utilizing blue LEDs and YAG-based phosphors in combination are disclosed. In Japanese Laid-Open Publication No. 2000-244021, disclosed is a light-emitting semiconductor device utilizing a strontium sulfide red phosphor activated by europium (SrS:Eu), in addition to a YAG-based phosphor, so as to compensate for a shortage of luminous flux of white light in a red-wavelength range emitted by the white-light-emitting semiconductor device.

It is known that such a known YAG-based phosphor has a main emission peak wavelength that varies in the range of about 530 nm to about 590 nm depending on the composition, especially the amount of Gd (gadolinium) atoms substituting Y (yttrium) atoms constituting the YAG-based phosphor, the amount of addition of $Ce^{3+}$ to be a luminescent center, or an ambient temperature. It is also known that the emission peak wavelength shifts to longer wavelengths as the substitution amount of Gd, the amount of addition of $Ce^{3+}$ to be a luminescent center or the ambient temperature increases. (see, for example, "Phosphor Handbook": Ohmsha, Ltd. or a literature: R. Mach et and G. O. Mueller: Proceedings of SPIE Vol. 3938 (2000) pp. 30–41). It should be noted that a Gd atom is heavier than an Y atom, and therefore the absolute specific gravity of the YAG-based phosphor increases as the substitution amount of Gd atoms increases.

It is known that the absolute specific gravity of a $Y_3Al_5O_{12}$:$Ce^{3+}$ phosphor containing no Gd atoms (in which the amount of Ce substituting Y is 0.1 to 2%) is 4.15 to 4.55 and that the peak emission wavelength of the phosphor at room temperature is around the wavelength range from 530 nm (if the phosphor has an absolute specific gravity of 4.15) to 557 nm (if the phosphor has an absolute specific gravity of 4.55), i.e., the wavelength range from green to yellow/yellowish (excerpts from Phosphor Index (Nichia Kagaku Kogyo Kabushiki Kaisha) and a catalog of Philips Corporation).

Now, color control of light, especially of white or whitish light, emitted by a light-emitting semiconductor device is briefly described. Conventionally, the color of light is controlled mainly by the following three methods.

(1) A method for obtaining a desired color of light by changing the output ratio between blue light emitted by a blue LED and yellow/yellowish light emitted by a YAG-based phosphor (2) A method for obtaining a desired color of light by changing the color tone of blue light emitted by the blue LED (3) A method for obtaining a desired color of light by changing the composition of the phosphor or the amount of addition of $Ce^{3+}$ luminescent center and changing the color tone of yellow/yellowish light emitted by the YAG-based phosphor Almost all the known light-emitting semiconductor devices utilizing blue LEDs and phosphors in combination as described above so as to obtain color-mixed light of the emissions from the blue LEDs and the phosphors uses YAG-based phosphors as phosphors.

In the patent and laid-open publications described above, described are: a light-emitting semiconductor having a structure in which a blue LED is mounted in a cup provided in a mount lead and is electrically connected thereto and in which a resin luminescent layer including a YAG-based phosphor is provided in the cup; a light-emitting semiconductor device having a structure in which a blue LED is placed in a casing and a resin luminescent layer including a YAG-based phosphor is provided in the casing; a light-emitting semiconductor device having a structure in which a flip-chip-type blue LED is mounted on a submount element and is electrically connected thereto and in which the flip-chip-type blue LED is molded with a resin package also serving as a luminescent layer including a YAG-based phosphor; and like devices.

Such light-emitting semiconductor devices are known as light-emitting semiconductor devices which are capable of obtaining white light and therefore are in high demand for light-emitting systems such as illumination systems or display systems.

On the other hand, some of the light-emitting semiconductor devices utilizing inorganic compounds other than YAG-based phosphors and LEDs in combination are previously known. For example, in Japanese Laid-Open Publication No. 2001-143869, described is a light-emitting semiconductor device using a silicate phosphor such as a $Ba_2SiO_4:Eu^{2+}$ phosphor, a $Sr_2SiO_4:Eu^{2+}$ phosphor, a $Mg_2SiO_4:Eu^{2+}$ phosphor, a $(BaSr)_2SiO_4:Eu^{2+}$ phosphor, or a $(BaMg)_2SiO_4:Eu^{2+}$ phosphor.

In addition, in the same Japanese Laid-Open Publication No. 2001-143869, the wavelength range of light emitted by an LED is preferably 430 nm or less, and more preferably in the range of 400 nm to 430 nm. In an embodiment of this publication, a light-emitting semiconductor device using an LED that emits light in the wavelength range of 343 to 405 nm is described. Further, the publication describes applications of the silicate phosphors as green phosphors and also describes that it is more preferable to use an organic LED than to use an inorganic LED made of an inorganic compound in terms of luminous efficacy.

That is to say, the invention disclosed in Japanese Laid-Open Publication No. 2001-143869 relates to a light-emitting semiconductor device utilizing an LED emitting near-ultraviolet light and a phosphor of an inorganic compound emitting red, green or blue light in combination.

Now, a silicate phosphor is described. A silicate phosphor expressed by the chemical formula $(Sr_{1-a3-b3-x}Ba_{a3}Ca_{b3}Eu_x)_2 SiO_4$ (where a3, b3 and x are in the ranges $0 \leq a3 \leq 1$, $0 \leq b3 \leq 1$ and $0<x<1$, respectively) is known to date. The silicate phosphor, which was studied as a phosphor for use in a fluorescent lamp, is known as a phosphor that emits light whose peak wavelength varies in the range from 505 nm to 598 nm, both inclusive, by changing the composition of Ba—Sr—Ca. In addition, the silicate phosphor is disclosed as a phosphor exhibiting relatively highly efficient emission of light when irradiated with light within the range of 170 to 350 nm in a literature (J. Electrochemical Soc. Vol. 115, No. 11(1968) pp. 1181–1184) and a literature (Fluorescent Lamp Phosphors, Kith H. Butler, The Pennsylvania State University Press (1980) pp. 270–279), for example.

However, in the literatures about the silicate phosphor, it is not described at all that the silicate phosphor exhibits highly efficient emission of light even in a wavelength range more than 350 nm, especially in the blue wavelength range greater than 430 nm and less than or equal to 500 nm. Thus, it is not previously known that the silicate phosphor can function as a phosphor that emits light in the yellow-green to orange wavelength range from 550 nm to 600 nm, both inclusive, especially yellow light, as a YAG-based phosphor, when excited by blue light in the blue wavelength range described above, especially blue light with high color purity around the wavelength range of 450 to 470 nm.

Hereinafter, the light-emitting semiconductor devices utilizing blue LEDs and YAG-based phosphors in combination will be described again. In Japanese Patent No. 2927279, Japanese Laid-Open Publications Nos. 10-163535, 2000-208822 and 2000-244021 mentioned above, for example, the thickness of a luminescent layer in a light-emitting semiconductor device and a fabrication method of the device are disclosed.

For example, in Japanese Patent No. 2927279 and other publications filed by the same applicant, a technique (pouring technique) for pouring an epoxy resin which is used as a base material for a luminescent layer and includes a YAG-based phosphor mixed and dispersed therein into a cup provided in a mount lead on which an LED chip is mounted, or into a space of a resin casing and for curing the epoxy resin is used to form a coating containing the YAG-based phosphor on the LED chip. In these publications, the thickness of the coating containing the YAG-based phosphor is set in the range of 100 to 400 μm.

In Japanese Laid-Open publication No. 2000-208822 and other publications filed by the same applicant, disclosed is a technique for applying a phosphor paste made by mixing and dispersing a YAG-based phosphor in an epoxy region to the surrounding other than a mounting surface for an LED chip and for curing the paste so that a luminescent layer is formed as a package for covering an LED. In these publications, the thickness of a package containing the YAG-based phosphor, i.e., a luminescent layer, is set in the range of 20 to 110 μm. In this case, a photolithography process, a screen-printing process or a transfer process is used as a method for applying the phosphor paste to the surrounding other than the mounting surface for the LED chip.

FIG. 7 is a cross-sectional view showing an example of a chip-type light-emitting semiconductor device fabricated by a known pouring technique. As shown in FIG. 7, the known light-emitting semiconductor device includes a casing 8; a blue LED 1 placed in the casing 8; a YAG-based luminescent layer 3 surrounding the blue LED 1 in the casing 8 and made of a mixture of yellow/yellowish phosphor particles and a resin; and an upper coating 10 covering the YAG-based luminescent layer 3 in the casing 8.

FIG. 9 is a SEM micrograph showing a cross-sectional structure of the coating 10 of the light-emitting semiconductor device in the state shown in FIG. 7. FIG. 10 is a SEM micrograph showing a magnified view of a portion near the casing 8. From an experiment done by the present inventors, if a luminescent layer is formed by the pouring technique described above, the coating is divided substantially into the luminescent layer 3 containing a high concentration of the YAG-based phosphor and the upper coating layer 10 hardly containing the YAG-based phosphor as shown in the SEM micrographs of FIGS. 7, 9 and 10 during the formation of the coating. This is mainly because of the difference in specific gravity between the YAG-based phosphor and the resin, which causes YAG-based phosphor particles 9 to sediment in the bottom of the coating by gravity. That is to say, the resultant substantial luminescent layer 3 does not have a structure in which the YAG-based phosphor particles 9 are scattered throughout the epoxy resin (base material) but has a structure in which the YAG-based phosphor particles 9 are in contact with each other and unevenly distributed in the base material, i.e., sedimented in the bottom of the coating. In this case, the state of being scattered is a state in which the phosphor particles are evenly dispersed throughout the luminescent layer. The substantial thickness of the luminescent layer 3 is smaller than that of the upper coating 10 and is 10 to 70 μm.

With respect to the distribution of the YAG-based phosphor particles in the coating, there appeared "various distributions of the photoluminescence phosphor can be achieved by controlling, for example, the material which contains the photoluminescence phosphor, forming temperature, viscosity, the configuration and particle distribution of the photoluminescence phosphor . . . " in Domestic Re-Publication of PCT Application No. WO98/05078. The possibility of formation of a luminescent layer having a structure in which YAG-based phosphor particles are evenly scattered in a base material is also suggested. However, an additional examination done by the present inventors proved that such a structure cannot be formed in reality by the pouring technique described above using a YAG-based phosphor and the disclosed resin (e.g., epoxy resin, urea resin or silicon). For confirmation, we obtained a light-emitting device already introduced commercially by the applicant of Japanese Patent No. 2927279 and estimated the cross-sectional structure of the luminescent layer, to find that the phosphor does not have a structure in which YAG-based phosphor particles are evenly scatted throughout a base material but has a structure of the luminescent layer as shown in FIG. 9, specifically a structure in which the YAG-based phosphor particles are in contact with each other and unevenly distributed in the base material so that the luminescent layer is formed sedimenting in the bottom of the coating. The substantial thickness of the luminescent layer is about 70 μm as shown in the SEM micrograph of FIG. 9.

In the method for applying a luminescent layer with a photolithography or transfer process and forming a luminescent layer as a package, the YAG-based phosphor particles also sediment in the bottom of the coating by gravity during the formation of the luminescent layer. Accordingly, the resultant substantial luminescent layer is not in the state in which the YAG-based phosphor particles are scattered throughout the base material, resulting in causing uneven distribution of phosphor particles in the package. If a luminescent layer as a package is formed using a screen publishing process, the YAG-based phosphor particles less sediment and come close to the state in which the YAG-based phosphor particles are scattered throughout the base material, but distribution unevenness of the phosphor particles is still observed. In addition, the resultant luminescent layer exhibits a low luminescence performance.

As described above, in the known light-emitting semiconductor devices, YAG-based phosphor particles are in contact with each other in a luminescent layer and unevenly distributed in a base material in most cases so that distribution unevenness of the phosphor particles is tend to be observed in the luminescent layer. In summary, with respect to the luminescent layers of the known light-emitting semiconductor devices, the phosphors used are YAG-based phosphors having a substantial thickness of 10 to 70 μm, especially 10 to 30 μm in most cases. The luminescent layers are each formed by curing a mixture in which a YAG-based phosphor is mixed and dispersed in a resin used as a base material (phosphor paste).

Now, a relationship between the structure of the luminescent layer of the light-emitting semiconductor device and the color unevenness, and a known method for suppressing the color unevenness are described.

In a light-emitting semiconductor device using a blue LED and a phosphor in combination, color unevenness in emission of light has been a problem and various measurements have taken to suppress the color unevenness. Most of the measurements are based on fabricating know-how such as the configuration and particle size of YAG-based phosphor particles, optimization of particle distribution, selection of a base material for including a phosphor, adjustment of viscosity of a phosphor paste and optimization of drying conditions.

Instead of the fabricating know-how, specific measurements for radically improving the structure of, for example, the luminescent layer have been proposed. For example, in Japanese Laid-Open Publication No. 11-31845, described is a method using a technique of applying an epoxy resin onto an LED chip as an adhesive, attaching YAG-based phosphor particles on the adhesive and then blowing off the YAG-based phosphor particles that have been excessively attached by splaying gas so that the thickness of a YAG-based luminescent layer is made uniform and color unevenness of light emitted by a light-emitting semiconductor device is suppressed. In Japanese Laid-Open Publication No. 2000-208822, described is a method for forming a luminescent layer (translucent wavelength-converting layer) on the surrounding other than a mounting surface for a blue LED as a package for covering the blue LED so that the thickness of the package from the outer contour surface of the blue LED is made substantially uniform in every direction of emission and therefore the thickness of the luminescent layer is made uniform, thereby suppressing color unevenness. In Japanese Laid-Open Publication No. 2001-177158, described is a method for polishing and creating the surface of a luminescent layer such that the surface is in parallel with a main light extracting surface.

Problems to be Solved

As has been described above, since the known light-emitting semiconductor device uses the YAG-based phosphor as a yellow/yellowish phosphor, the YAG-based phosphor particles sediment in the bottom of a coating by gravity during the formation of the luminescent layer, resulting in that the coating layer is divided into the luminescent layer in which the phosphor particles are in contact with each other and unevenly distributed in a base material and an upper coating layer hardly containing the YAG-based phosphor. Even if the YAG-based phosphor particles are not in contact with each other, the luminescent layer has a structure in which distribution unevenness of the phosphor particles is large in the base material. The reason of this distribution unevenness is not clear but the difference in specific gravity between the phosphor and the base material is at least one cause of the distribution unevenness.

As described above, the absolute specific gravity of a $Y_3Al_5O_{12}:Ce^{3+}$ phosphor containing no Gd atoms (where the substitution amount of Ce with respect to Y is 0.1 to 2% and the main emission peak wavelength at room temperature is 530 to 557 nm) is 4.15 to 4.55, though the absolute specific gravity varies to some extent depending on the composition of the phosphor. However, from an evaluation done by the present inventors, the measurement result of the absolute specific gravity of at least a $(Y_{0.7}Gd_{0.28}Ce_{0.02})_3Al_5O_{12}$ phosphor (whose main emission peak wavelength is 565 nm) in which part of Y is substituted with Gd to obtain excellent yellow/yellowish light is 4.98, and the absolute specific gravity of every phosphor in which part of the $Y_3Al_5O_{12}:Ce^{3+}$ phosphor is substituted with Gd is as high as over 4.65 (see FIG. 48).

It is known that a sulfide phosphor using the (Zn, Cd)S as a phosphor base can emit yellow/yellowish light having a main emission peak in the wavelength range of about 560 nm or more by containing Cd (see, for example, "Phosphor Handbook" edited by Phosphor Research Society, Ohmsha, Ltd. p. 248). It is also known that the absolute specific gravity is as low as about 4.13 (see Phosphor Index (Nichia Kagaku Kogyo Kabushiki Kaisha)). It should be noted that the phosphor not only has a low emission efficiency when irradiated with blue light (excitation light) but also contains noxious Cd, and therefore the phosphor is difficult to, for example, fabricate, handle and storage.

Therefore, since the known light-emitting semiconductor devices exhibit distribution unevenness of phosphor particles in luminescent layers, the devices have a problem that unevenness is created in emission of light to cause low fabrication yields. This problem of emission unevenness is commonly observed among the known light-emitting semiconductor devices configured by using YAG-based phosphors, and also observed in light-emitting semiconductor devices additionally using red phosphors to compensate for a shortage of red light, and light-emitting semiconductor devices additionally using green phosphors to enhance luminous efficacy.

The known light-emitting semiconductor devices also have a problem when viewed from a different point of view. In some of the known light-emitting semiconductor devices that include luminescent layers in which phosphor particles are in contact with each other and unevenly distributed, the luminescent layers absorb blue light emitted by blue LEDs and the light is liable to be attenuated, resulting in a problem of insufficient luminous flux of white or whitish light obtained by adding the colors of blue light from the LED and of yellow/yellowish light from the YAG-based phosphor together.

A YAG-based phosphor is a blue light excitation phosphor (a phosphor excited by blue light) that receives blue light between or equal to 410 nm and 530 nm emitted by a blue LED to convert the blue light into yellow/yellowish light between or equal to 550 nm and 600 nm with high conversion efficiency. Accordingly, in a known white-light-emitting semiconductor device configured by using such a YAG-based phosphor, a small amount of the YAG-based phosphor with high conversion efficiency is needed, so that the substantial thickness of the luminescent layer is 10 to 70 μm. In many practical light-emitting semiconductor devices, the substantial thickness is as small as 10 to 30 μm. If the YAG-based phosphor particles has a particle size (particle diameter) of about 5 to about 20 μm and the luminescent layer has a small substantial thickness, the thickness of the luminescent layer is substantially secured by only several to over ten particles, resulting in that slight surface unevenness created in the surface of the luminescent layer has a large effect to accentuate unevenness in light emission. On the other hand, if the phosphor concentration (phosphor weight/(phosphor weight+resin weight)) of the YAG-based phosphor is set lower than a normal weight of 5 to 10 wt %, i.e., lower than 5 wt %, to increase the substantial thickness of the luminescent layer, the light distribution characteristics of the light-emitting semiconductor device deteriorate.

To suppress such color unevenness, various kinds of contrivances have been made. However, a sufficient solution has yet to be found and there still exists a problem of low fabrication yields of light-emitting semiconductor devices. In addition to the color unevenness, the light-emitting semiconductor device, especially a light-emitting semiconductor device emitting white or whitish light has a difficulty in controlling color, i.e., a problem that the color of light emitted by the device is expressed in a narrow range, because emission peak wavelength of yellow/yellowish light emitted by the YAG-based phosphor is limited in the range from about 550 nm to 590 nm, both inclusive. This is because the color of light emitted by the light-emitting semiconductor device is determined by adding the colors of blue light emitted by the blue LEDs and of yellow/yellowish light emitted by the YAG-based phosphors together.

A light-emitting system using such a known light-emitting semiconductor device has a problem that color unevenness is readily created in the light-emitting system and a problem that the fabrication yield of the light-emitting system is low due to the color unevenness. In addition, the low fabrication yield of the light-emitting semiconductor device increases the fabrication cost of the light-emitting system.

DISCLOSURE OF INVENTION

An object of the present invention is suppressing color unevenness in a light-emitting semiconductor device configured by utilizing a blue-light-emitting device and a phosphor in combination so as to provide a light-emitting semiconductor device or a light-emitting semiconductor system exhibiting small color unevenness, especially a white-light-emitting semiconductor device exhibiting a luminous flux higher than or equal to that of a known white-light-emitting semiconductor device utilizing a YAG-based phosphor and a blue-light-emitting device in combination and a light-emitting system exhibiting small color unevenness and a high luminous flux.

An inventive light-emitting semiconductor device is a light-emitting semiconductor device including: a blue-light-emitting device having a light-extracting surface and emitting blue light from the light-extracting surface; and a luminescent layer provided to cover at least the light-extracting surface of the blue-light-emitting device and including a yellow/yellowish phosphor which absorbs blue light emitted by the blue-light-emitting device to emit a yellow/yellowish fluorescence. The yellow/yellowish phosphor is a silicate phosphor containing, as a main component, at least one type of a compound expressed by the chemical formula:

$(Sr_{1-a1-x}Ba_{a1}Ca_{b1}Eu_x)_2SiO_4$ (where $0 \leq a1 \leq 0.3$, $0 \leq b1 \leq 0.8$ and $0 < x < 1$).

Considering the fact that the blue-light-emitting device can achieve a light-emitting semiconductor device emitting excellent white light, the blue-light-emitting device preferably emits light having a main emission peak in the wavelength range greater than 430 nm and less than or equal to 500 nm, more preferably in the wavelength range from 440 nm to 490 nm, both inclusive, and still more preferably in the wavelength range from 450 nm to 480 nm, both inclusive. The yellow/yellowish phosphor preferably emits a fluorescence having a main emission peak in the wavelength range from 550 nm to 600 nm, both inclusive, more preferably in the wavelength range from 560 nm to 590 nm, both inclusive, and still more preferably in the wavelength range from 565 nm to 585 nm, both inclusive.

In terms of crystal stability to heat in the phosphor, heat resistance in light-emitting characteristics, luminous intensity of yellow/yellowish emission and color of light, the values a1, b1 and x in the chemical formula are preferably in the ranges $0 < a1 \leq 0.2$, $0 < b1 \leq 0.7$ and $0.05 < x < 0.1$, respectively, more preferably in the ranges $0 < a1 \leq 0.15$, $0 < b1 \leq 0.6$ and $0.01 < x < 0.05$, respectively, and most preferably in the ranges $0.01 \leq a1 \leq 0.1$, $0.001 \leq b1 \leq 0.05$ and $0.01 < x \leq 0.02$, respectively.

FIG. 8 is a graph showing excitation-light spectra and emission spectra of a silicate phosphor and a YAG-based phosphor. As shown in FIG. 8, the silicate phosphor is a yellow/yellowish phosphor which has an excitation-light peak around 250 to 300 nm and absorbs light in the wide wavelength range of 100 to 500 nm to emit a yellow/yellowish fluorescence having an emission peak in the wavelength range of 550 to 600 nm, i.e., from yellow-green, yellow to orange ranges. Accordingly, if the yellow/yellowish phosphor is combined with the blue-light-emitting device, the resultant light-emitting semiconductor device emits light by adding the color of the fluorescence emitted by the yellow/yellowish phosphor to the color of the blue light emitted by the blue-light-emitting device.

Now, a relationship among the composition range, the crystal structure and the color of emitted light of the silicate phosphor, the characteristics of the silicate phosphor emitting yellow/yellowish light, for example, are described in further detail. As a first case, if both of the values a1 and b1 in the chemical formula of the silicate phosphor are close to zero, the silicate phosphor is likely to have a monoclinic structure or a crystal structure in which an orthorhombic system and a monoclinic system are mixed. As a second case, if the value a1 deviates to larger values from the most preferable range and the value b1 is close to zero, the crystal field around $Eu^{2+}$ ions is weak. As a third case, if the value a1 is close to zero and the value b1 deviates to larger values from the most preferable range, the silicate phosphor is likely to have a monoclinic structure. As a fourth case, if both of the values a1 and b1 deviate to larger values from the respective most preferable ranges and the value 1−a1−b1−x is close to zero, the silicate phosphor is likely to have a hexagonal structure. In any of the first through fourth cases, the silicate phosphor might be a greener phosphor and emit light with low color purity for yellow. If the value x deviates to smaller values from the most preferable range, the concentration of $Eu^{2+}$ luminescent centers is low, resulting in low luminous intensity of the silicate phosphor. If the value x deviates to larger values from the most preferable range, the luminous intensity is low because of concentration quenching (of luminescence) or self-absorption caused by $Eu^{2+}$ ions and, moreover, thermal quenching that the luminous intensity decreases as the ambient temperature of the silicate phosphor increases might occur.

Comparison in excitation spectrum between the silicate phosphor and the YAG-based phosphor shown in FIG. 8 as an example shows that the silicate phosphor is a phosphor having a low luminous efficacy (e.g., having a luminous intensity only half of that of the YAG-based phosphor under 470-nm excitation) when excited by blue light in the wavelength range greater than 430 nm and less than or equal to 500 nm. Therefore, a larger amount of a phosphor is used in the case where the silicate phosphor is used than in the case where the YAG-based phosphor is used, in order to obtain the same color of light with a white-light-emitting semiconductor device that emits white light by adding the colors of the blue light from the blue LED and the yellow light from the yellow/yellowish phosphor together. Accordingly, the luminescent layer is relatively thick if the silicate phosphor is used. As a result, the phosphor is less affected by the unevenness created in the surface of the luminescent layer, so that variation in thickness of the luminescent layer becomes substantially small, thus obtaining a light-emitting semiconductor device which emits light with small color unevenness.

The blue-light-emitting device is a device selected from the group consisting of a blue-light-emitting diode, a laser diode, a surface emitting laser diode, a resonant cavity light emitting diode, an inorganic electroluminescence device and an organic electroluminescence device. In terms of increasing the output power and the lifetime of the light-emitting semiconductor device, diodes such as a light-emitting diode, a laser diode, a surface emitting laser diode and a resonant cavity light emitting diode are superior to other devices.

The Ca mole fraction b1 of the yellow/yellowish phosphor is preferably a mole fraction b2 in the range $0 \leq b2 \leq 0.6$.

In terms of crystal stability to heat in the phosphor, heat resistance in light-emitting characteristics, luminous intensity of yellow/yellowish emission and color of light, the mole fraction b2 is preferably in the range $0 < b2 \leq 0.4$, more preferably in the range $0 < b2 \leq 0.3$, and most preferably in the range $0.001 \leq b2 \leq 0.05$.

The orthorhombic silicate phosphor within any of the composition ranges emits yellow/yellowish light highly efficiently with high color purity for yellow when excited the blue excitation light. As a result, light emitted by the light-emitting semiconductor device not only has a high luminous flux but also is white or whitish light with a high color purity for white.

In the light-emitting semiconductor device, the blue-light-emitting device may be a blue-light-emitting inorganic device made of a semiconductor selected from the group consisting of a gallium nitride-based compound semiconductor, a zinc selenide semiconductor and a zinc oxide semiconductor. Such a blue-light-emitting inorganic device, especially a blue-light-emitting device including a light-emitting layer made of a gallium nitride-based compound semiconductor, exhibits a high luminous efficacy. Accordingly, if such a blue-light-emitting inorganic device, especially a blue-light-emitting device including a light-emitting layer made of a gallium nitride-based compound semiconductor, is combined with the silicate phosphor, a light-emitting semiconductor device emitting light with a high luminous flux is obtained.

In the light-emitting semiconductor device, the color of light emitted by the light-emitting semiconductor device may have an emission chromatically point (x, y) in the ranges $0.21 \leq x \leq 0.48$ and $0.19 \leq y \leq 0.45$, respectively, in a CIE chromaticity diagram.

This chromatically range includes a large part of the white range. Accordingly, if the color of light emitted by the light-emitting semiconductor device is set within the chromatically range, a highly-demanded white-light-emitting semiconductor device is obtained.

A red/reddish phosphor having an emission peak in the red/reddish wavelength range greater than 600 nm and less than or equal to 660 nm may be provided.

Then, the red/reddish phosphor compensates for a red spectrum which cannot be compensated by the yellow/yellowish phosphor alone, so that the light emitted by the light-emitting semiconductor device includes a wide range of the red spectrum.

Further, a green/greenish phosphor having a main emission peak in the green/greenish wavelength range greater than or equal to 500 nm and less than 550 nm may be provided.

Then, the green/greenish phosphor compensates for a green spectrum which has a high luminous efficacy and which cannot be compensated by the yellow/yellowish phosphor alone, so that the light emitted by the light-emitting semiconductor device includes a wide range of the green spectrum. Accordingly, the light emitted by the light-emitting semiconductor device is white light with a high luminous efficacy with respect to white. The red/reddish phosphor and the green/greenish phosphor may be combined with the yellow/yellowish phosphor.

The green/greenish phosphor is preferably a silicate phosphor containing, as a main component, a compound expressed by the chemical formula:

$$(Sr_{1-a3-b3-x}Ba_{a3}Ca_{b3}Eu_x)_2SiO_4$$

(where $0 \leq a3 \leq 1$, $0 \leq b3 \leq 1$ and $0 < x < 1$).

Then, the composition and crystal structure of the green/greenish phosphor are made similar to those of the silicate phosphor emitting yellow/yellowish light. Accordingly, the color unevenness in the light-emitting semiconductor device including the green/greenish phosphor becomes relatively small, and in addition, a new technique is no more required in a process for fabricating the light-emitting semiconductor device, resulting in a simple fabrication process.

The luminescent layer may include a plurality of such silicate phosphor made of compounds mutually differing in composition and each emitting yellow/yellowish light having a main emission peak in the wavelength range from 550 nm to 600 nm, both inclusive. Then, it is possible to control the color of white light obtained by adding the colors of blue light emitted by the blue-light-emitting device and of yellow/yellowish light emitted by the silicate phosphors.

The luminescent layer preferably includes a translucent resin as a base material; and the yellow/yellowish phosphor is preferably present in the form of dispersed particles in the base material.

Since such a luminescent layer includes substantially neither light absorption factor nor light scattering factor, the luminescent layer exhibits improved light transmissivity. Accordingly, the blue light from the blue-light-emitting device either passes through the luminescent layer without being absorbed and attenuated or contributes to excitation of the phosphor. In addition, since the luminescent layer is in the state that a larger part of the surfaces of the phosphor particles can be irradiated with the blue light, the cross-sectional area of the phosphor particles to be excited increases substantially, so that the phosphor particles in the luminescent layer emit light effectively.

Moreover, since the phosphor in which the phosphor particles are dispersed has its substantial thickness increased, the influence of variation in thickness of the luminescent layer becomes small, thus reducing emission unevenness caused by the variation in thickness of the luminescent layer. As the translucent base material, a resin or like materials may be used. As the resin, a resin such as an epoxy resin, an acrylic resin, a polyimide resin, a urea resin or a silicone resin may be used, and an epoxy resin or a silicone resin is preferably used.

The luminescent layer may be made by forming (sintering) the silicate phosphor.

The light-emitting semiconductor device preferably has a structure in which blue light emitted by the blue-light-emitting device passes through the luminescent layer so that the color of the fluorescence emitted by the phosphor is added to the color of the blue light, thereby emitting white light.

The inventive light-emitting semiconductor device may have any of the structures including the following members.

A first structure is a structure in which a substrate is further provided, the blue-light-emitting device is flip-chip mounted on the substrate, and the luminescent layer functions as a molding resin for molding the blue-light-emitting device.

In such a case, the substrate preferably includes a Zener diode.

A second structure is a structure in which a mount lead with a cup is further provided, the blue-light-emitting device is mounted in the cup, and the luminescent layer is provided within the cup.

A third structure is a structure in which a casing for placing the blue-light-emitting device therein is further provided, and the luminescent layer may be provided within the casing.

The light-emitting semiconductor device with such structures is implemented as a light-emitting semiconductor device emitting white light with a high luminous flux. The light-emitting semiconductor device can be fabricated through a relatively simple process, so that the fabrication yield enhances.

Among the light-emitting semiconductor devices having the first through third structures, the light-emitting semiconductor device with the first structure has the characteristic that the color unevenness is inherently smaller than those in the other light-emitting semiconductor devices with the second and third structures. Therefore, the light-emitting semiconductor device with the first structure is preferably used because the color unevenness in the light-emitting semiconductor device is further reduced so that the production yield further enhances.

The luminescent layer preferably has a substantial thickness in the range from 50 μm to 1000 μm, both inclusive, where the light extraction surface of the blue-light-emitting device is located.

If the substantial thickness of the luminescent layer is set within the range from 50 μm to 1000 μm, both inclusive, and more preferably within the range from 100 μm to 700 μm, both inclusive, the cross-sectional area of the silicate phosphor to be excited by the blue light increases, as compared to the case of the known YAG phosphor. Accordingly, the luminous intensity of the yellow light emitted by the silicate phosphor increases, and the light-emitting semiconductor device emits white light with excellent color tone by adding the colors the yellow light and of the blue light emitted by the blue-light-emitting device together. Moreover, as described above, since the luminescent layer has substantially no light absorption and attenuation factor, blue light emitted by a blue-light-emitting device either passes through the luminescent layer without being absorbed and attenuated or contributes to excitation of the phosphor, thus increasing the luminous intensity of the yellow light emitted by the silicate phosphor. Accordingly, if an optimum phosphor concentration (weight ratio between resin and phosphor: phosphor weight/(phosphor weight+resin weight)) is selected, the light-emitting semiconductor device emits white light with a luminous flux higher than that of the known light-emitting semiconductor device using the YAG-based phosphor.

As compared to the known light-emitting semiconductor device using the YAG-based phosphor, the substantial thickness of the luminescent layer increase largely. Therefore, even if surface unevenness in the substantial luminescent layer is large to some extent, the thickness of the entire luminescent layer is less affected by the surface unevenness, so that apparent thickness variation is reduced. As a result, emission unevenness caused by the variation in thickness of the luminescent layer is also reduced.

If the substantial thickness of the luminescent layer is smaller than the preferable thickness ranges, the cross-sectional area of the silicate phosphor to be excited by the blue light is small so that the substantial luminous efficacy of the phosphor is low. Accordingly, the light-emitting semiconductor device emits bluer light in which the emission from the blue-light-emitting device is dominant, resulting in that there may be cases where white light with excellent color tone cannot be obtained or a high luminous flux cannot be obtained. On the other hand, if the substantial thickness is larger than the thickness ranges, the cross-sectional area of the silicate phosphor to be excited by the blue light is large so that the substantial luminous efficacy of the phosphor is high but most of the blue light is absorbed in the phosphor to be converted into yellow/yellowish light. Accordingly, the light-emitting semiconductor device emits yellower light in which the yellow/yellowish emission from the silicate phosphor is dominant, resulting in that there may be cases where white light with excellent color tone cannot be obtained. Further, there may also be cases where a high luminous flux cannot be obtained because the phosphor particles are prone to be partially in contact with each other to cause blue light from the blue-light-emitting device to be more and more absorbed and attenuated.

In the known light-emitting semiconductor device using the YAG-based phosphor, if the luminescent layer is made thick as in the inventive light-emitting semiconductor device, the YAG-based phosphor has an extremely high luminous efficacy when irradiated with blue light under a phosphor concentration condition (10 to 80 wt. %) in the luminescent layer including a general silicate phosphor. Accordingly, only yellower emission in which light emitted by the YAG-based phosphor is dominant is obtained and the luminous flux also decreases. If the phosphor concentration is reduced so as to secure a desired color of light and to obtain such a thick luminescent layer, YAG-based phosphor particles are liable to disperse unevenly in a base material (a resin). This results in that the chromaticity and the luminance of the resultant emission vary largely and, in addition, the light distribution characteristics are prone to deteriorate. For this reason, the light-emitting semiconductor device has only a small commercial value.

As is explicitly shown in the case where phosphor particles are unevenly distributed in the base material and which is herein described using the micrographs in FIGS. 9 and 10, an average thickness of the luminescent layer with which the presence of the phosphor particles in the base material can be visually observed clearly by a cross-sectional observation of the light-emitting semiconductor device with an electron microscope of a magnification from ×50 to ×1000 is defined as a "substantial thickness of the luminescent layer".

The upper surface of a portion of the luminescent layer located at least on the light-extracting surface of the blue-light-emitting device is preferably flat and substantially parallel to the light-extracting surface.

Most of the blue-light-emitting devices are fabricated to have flat light-extracting surfaces (especially flat main light-extracting surfaces) because of the easiness of the fabrication. Therefore, if the surface of the luminescent layer is formed to be parallel to the light-extracting surface (especially the main light-extracting surface), the distance from the outer contour surface of the light-extracting surface to the outer contour surface of the luminescent layer, i.e., the thickness of the luminescent layer, is made substantially uniform in almost every part of the luminescent layer located on the light-extracting surface, so that the variation in thickness of the luminescent layer is further suppressed and, therefore, emission unevenness of the light-emitting semiconductor device is reduced.

The blue-light-emitting device may be provided in a plural presence and the luminescent layer may be provided to cover respective light-emitting surfaces of the plurality of blue-light-emitting devices.

An inventive light-emitting system is a light-emitting system including: a blue-light-emitting device emitting blue light; a luminescent layer including a yellow/yellowish phosphor which absorbs blue light emitted by the blue-light-emitting device to emit a yellow/yellowish fluorescence; and a supporter for supporting the blue-light-emitting device and the luminescent layer. The yellow/yellowish phosphor is a silicate phosphor containing, as a main component, at least one type of a compound expressed by the chemical formula:

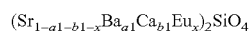

$$(Sr_{1-a1-b1-x}Ba_{a1}Ca_{b1}Eu_x)_2SiO_4$$

(where $0 \leq a1 \leq 0.3$, $0 \leq b1 \leq 0.8$ and $0<x<1$).

The inventive light-emitting semiconductor device including the blue-light-emitting device and the luminescent layer exhibits small color unevenness, resulting in a high production yield and a low production cost. Accordingly, if a light-emitting system is configured using the light-emitting semiconductor device, the light-emitting semiconductor system not only has reduced color unevenness but also is fabricated at a low cost. Moreover, since such a light-emitting semiconductor device exhibits a luminous flux higher than that of the known light-emitting semiconductor device using the YAG-based phosphor, the luminous flux of the light-emitting system enhances.

The blue-light-emitting device may be provided in a plural presence and the luminescent layer may be provided to cover respective light-emitting surfaces of the plurality of blue-light-emitting devices.

In this description, various kinds of display systems using light-emitting semiconductor devices (e.g., LED information display terminals, LED traffic lights, LED stoplights of vehicles, and LED directional lights) and various kinds of lighting systems (e.g., LED interior/exterior lights, courtesy LED lights, LED emergency lights, and LED surface emitting sources) are broadly defined as light-emitting systems.

An inventive method for fabricating a luminescent layer of a light-emitting semiconductor device is a method for fabricating a light-emitting semiconductor device including: a blue-light-emitting device emitting light having a main emission peak in the wavelength range greater than 430 nm and less than or equal to 500 nm; and a luminescent layer including a yellow/yellowish phosphor which absorbs blue light emitted by the blue-light-emitting device to emit a fluorescence having a main emission peak in the wavelength range from 550 nm to 600 nm, both inclusive. The method includes the steps of a) covering at least a light-extracting surface of the blue-light-emitting device with a phosphor paste including the yellow/yellowish phosphor which has an absolute specific gravity in the range from 3.0 to 4.65, both inclusive, and emits light having a main emission peak in the wavelength range from 560 nm to 600 nm, both inclusive, at room temperature, and with a resin which has an absolute specific gravity in the range greater than or equal to 0.8 and less than or equal to the absolute value of the yellow/yellowish phosphor; and b) curing the phosphor paste, thereby forming the luminescent layer. In the step a), a phosphor including, as a base material, a compound containing at least one element selected from the group consisting of Mg, Ca, Sr, Ba, Sc, Y, lanthanoid, Ti, Zr, Hf, V, Nb, Ta, Mo, W, Zn, B, Al, Ga, In, Si, Ge, Sn and P and at least one element selected from the group consisting of O, S, Se, F, Cl and Br is used as the yellow/yellowish phosphor. The component does not include an element having a large specific gravity such as Cd.

In this manner, if a yellow/yellowish phosphor having an absolute specific gravity smaller than that of a YAG-based phosphor is used in the method for fabricating the luminescent layer by curing the phosphor paste including the yellow/yellowish phosphor and the resin, the difference in specific gravity between the resin (generally having an absolute value smaller than that of the phosphor except for special cases) and the phosphor is reduced. Thus, the phosphor is less liable to sediment in the phosphor paste by gravity before or during the curing of the phosphor paste, resulting in that the resultant luminescent layer has a structure in which the phosphor particles are dispersed substantially evenly throughout the resin or a like structure. In addition, since a phosphor containing no noxious Cd, preferably a phosphor including an oxide, is used, fabrication, handling, storage, control and the like therefor are easy.

In the step a), a yellow/yellowish phosphor having a particle size in the range from 0.5 μm to 30 μm, both inclusive, may be used.

Then, it is possible to obtain a luminescent layer exhibiting a high luminous intensity and having a structure in which phosphor particles are dispersed.

In the step a), a silicate phosphor containing, as a main component, at least one type of a compound expressed by the chemical formula

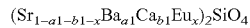

(where $0 \leq a1 \leq 0.3$, $0 \leq b1 \leq 0.8$ and $0 < x < 1$)

may be used as the yellow/yellowish phosphor.

It should be noted that the values a1, b1 and x are preferably in the ranges $0 < a1 \leq 0.2$, $0 \leq b1 \leq 0.7$ and $0.005 < x < 0.1$. A silicate phosphor having a composition within the preferable ranges and emitting a fluorescence with a main emission peak in the wavelength range from 560 nm to 600 nm, both inclusive, has an absolute specific gravity smaller than that of a YAG-based phosphor in general, i.e., in the range from 3.0 to 4.65, both inclusive. In addition, the silicate phosphor also serves as a yellow/yellowish phosphor which emits yellow/yellowish light when excited by blue light. Therefore, if a luminescent layer is formed using the silicate phosphor in combination with a resin (e.g., an epoxy resin) having an absolute specific gravity in the range greater than or equal to 0.8 and less than or equal to the absolute value of the yellow/yellowish phosphor, the luminescent layer is implementable as a luminescent layer exhibiting a high luminous intensity and having a structure in which phosphor particles are dispersed in an actual process. In the case where the value a1 is larger than the preferable range, as the value a1 increases, the absolute specific gravity of the silicate phosphor increases so that the phosphor particles are more liable to sediment in the phosphor paste and, as a result, it might be impossible to obtain a luminescent layer with a structure in which the phosphor particles are dispersed. This action is due to the fact that a Ba atom is heavier than a Sr atom.

Now, a relationship among the composition, the absolute specific gravity, and the main emission peak wavelength of a YAG-based phosphor is simply described. Though the absolute gravity of a YAG-based phosphor varies largely depending on the composition, especially the amount of Gd substituting Y, a YAG-based phosphor having a main emission peak in the wavelength range from 560 nm to 600 nm, both inclusive, under room temperature has a large substitution amount of Gd in general, resulting in having an absolute gravity greater than 4.55, greater, moreover, than 4.60, 4.65, and even exceeding 4.7. That is to say, such a YAG-based phosphor is heavy.

Ultra-fine particles including primary particles having an average particle size in the range from 1 nm to 100 nm, both inclusive, may be included in the phosphor paste and a luminescent layer may be formed by curing the phosphor paste. The sedimentation speed of the ultra-fine particles in a resin is extremely low and is almost zero. Therefore, in this manner, the ultra-fine particles suspended in the resin act in such a manner as preventing the sedimentation of the yellow/yellowish phosphor, so that the sedimentation speed of the yellow/yellowish phosphor decreases. As a result, a luminescent layer with a structure in which phosphor particles are dispersed is easily obtained.

In addition, the device may be configured such that blue light emitted by a blue-light-emitting diode passes through the luminescent layer so that the color of a (yellow/yellowish, red/reddish or green/greenish) fluorescence emitted by the phosphor is added to the color of the blue light, thereby emitting white light. Then, the colors of the blue light and the (yellow/yellowish, red/reddish or green/greenish) fluorescence emitted by the phosphor are added together as intended, thereby obtaining white light.

Examples of methods for suppressing the sedimentation of the phosphor particles while the phosphor paste is curing include the following methods.

A first method is a method for fabricating a light-emitting semiconductor device including the steps of: a) covering a light-extracting surface of a blue-light-emitting device with a phosphor paste including a resin and phosphor particles; and b) curing the phosphor paste while applying a vibration to the phosphor paste.

A second method is a method for fabricating a light-emitting semiconductor device including the steps of: a) covering a light-extracting surface of a blue-light-emitting device with a phosphor paste including a resin and phosphor particles; and b) curing the phosphor paste while turning over the phosphor paste.

A third method is a method for fabricating a light-emitting semiconductor device including the steps of a) covering a light-extracting surface of a blue-light-emitting device with a phosphor paste including a resin and phosphor particles; and b) curing the phosphor paste, wherein the steps a) and b) are performed a plurality of times.

A fourth method is a method for fabricating a light-emitting semiconductor device including the steps of a) covering a light-extracting surface of a blue-light-emitting device with a phosphor paste including a resin and phosphor particles and having a viscosity in the range from 1 Pa·S to 100 Pa·S, both inclusive; and b) curing the phosphor paste, wherein the steps a) and b) are performed a plurality of times.

A fifth method for fabricating a light-emitting semiconductor device including the steps of a) covering a light-extracting surface of a blue-light-emitting device with a phosphor paste including a resin and phosphor particles; and b) curing the phosphor paste with ultraviolet radiation.

A sixth method for fabricating a light-emitting semiconductor device including the steps of a) covering a light-extracting surface of a blue-light-emitting device with a phosphor paste including a resin and phosphor particles; and b) curing the phosphor paste while agitating the phosphor paste.

Examples of methods for obtaining a light-emitting semiconductor device with a structure in which a maximum amount of phosphor particles are made close to the blue-light-emitting device include the following methods.

A first method is a method including the steps of: a) covering at least a light-extracting surface of a blue-light-emitting device which emits light having a main emission peak in the wavelength range greater than 430 nm and less than or equal to 500 nm, with a first phosphor paste including a base material of a translucent resin and phosphor particles including a yellow/yellowish phosphor; b) covering the first phosphor paste with a second phosphor paste including at least a translucent resin and containing a yellow/yellowish phosphor at a concentration lower than that in the first phosphor paste, after the step a) has been performed; and c) curing the first and second phosphor pastes. In the step a), as the yellow/yellowish phosphors, a silicate phosphor which is a yellow/yellowish phosphor absorbing light emitted by the blue-light-emitting device to emit light having a main emission peak in the wavelength range from 550 nm to 600 nm, both inclusive, and which contains, as a main component, at least one type of a compound expressed by the chemical formula $(Sr_{1-a1-b1-x}Ba_{a1}Ca_{b1}Eu_x)_2SiO_4$ (where $0 \leq a1 \leq 0.3$, $0 \leq b1 \leq 0.8$ and $0 < x < 1$)

is used.

A second method is a method including the steps of: a) attaching phosphor particles including a yellow/yellowish phosphor to at least a light-extracting surface of a blue-light-emitting device which emits light having a main emission peak in the wavelength range greater than 430 nm and less than or equal to 500 nm; b) covering at least the light-extracting surface of the blue-light-emitting device with a translucent resin, after the step a) has been performed; and c) curing the resin. In the step a), as the yellow/yellowish phosphor, a silicate phosphor which is a yellow/yellowish phosphor absorbing light emitted by the blue-light-emitting device to emit light having a main emission peak in the wavelength range from 550 nm to 600 nm, both inclusive, and which contains, as a main component, at least one type of a compound expressed by the chemical formula $(Sr_{1-a1-b1-x}Ba_{a1}Ca_{b1}Eu_x)_2SiO_4$ (where $0 \leq a1 \leq 0.3$, $0 \leq b1 \leq 0.8$ and $0 < x < 1$)

is used.

In this method, in the step a), the yellow/yellowish phosphor particles may be sprinkled on the blue-light-emitting device. Alternatively, in the step a), the blue-light-emitting device may be immersed in a suspension containing phosphor particles including a yellow/yellowish phosphor and a volatile solvent, and then the solvent may be evaporated.

A third method is a method including the steps of: a) covering at least a light-extracting surface of a blue-light-emitting device which emits light having a main emission peak in the wavelength range greater than 430 nm and less than or equal to 500 nm, with a phosphor paste including a translucent resin and phosphor particles, which includes a yellow/yellowish phosphor and to whose surfaces positively charged substances are attached; and b) curing the phosphor paste. In the step a), as the yellow/yellowish phosphor, a silicate phosphor which is a yellow/yellowish phosphor absorbing light emitted by the blue-light-emitting device to emit light having a main emission peak in the wavelength range from 550 nm to 600 nm, both inclusive, and which contains, as a main component, at least one type of a compound expressed by the chemical formula $(Sr_{1-a1-b1-x}Ba_{a1}Ca_{b1}Eu_x)_2SiO_4$ (where $0 \leq a1 \leq 0.3$, $0 \leq b1 \leq 0.8$ and $0 < x < 1$)

is used.

BRIEF DESCRIPTION OF DRAWINGS

FIGS. 51(a) through 51(c) are cross-sectional views showing respective process steps in a second example of the fabrication method according to the third embodiment.

FIGS. 52(a) through 52(d) are cross-sectional views showing respective process steps in a third example of the fabrication method according to the third embodiment.

FIG. 53 is a table showing typical compositions and characteristics of silicate phosphors for reference.

FIG. 54 is a table showing experimental data on luminance characteristics for a light-emitting semiconductor device using a YAG-based phosphor and a light-emitting semiconductor device using a silicate phosphor.

FIG. 55 is a table showing respective characteristics of samples in which ultra-fine-powdery silicon dioxide such as ultra-fine-powdery silica is introduced, as a thixotropy improver, in a silicate phosphor for a light-emitting semiconductor device.

BEST MODE FOR CARRYING OUT THE INVENTION

Embodiment 1

Hereinafter, a first embodiment of the present invention relating to a light-emitting semiconductor device and a method for suppressing color unevenness in the light-emitting semiconductor device will be described with reference to the drawings.

Figure 1:
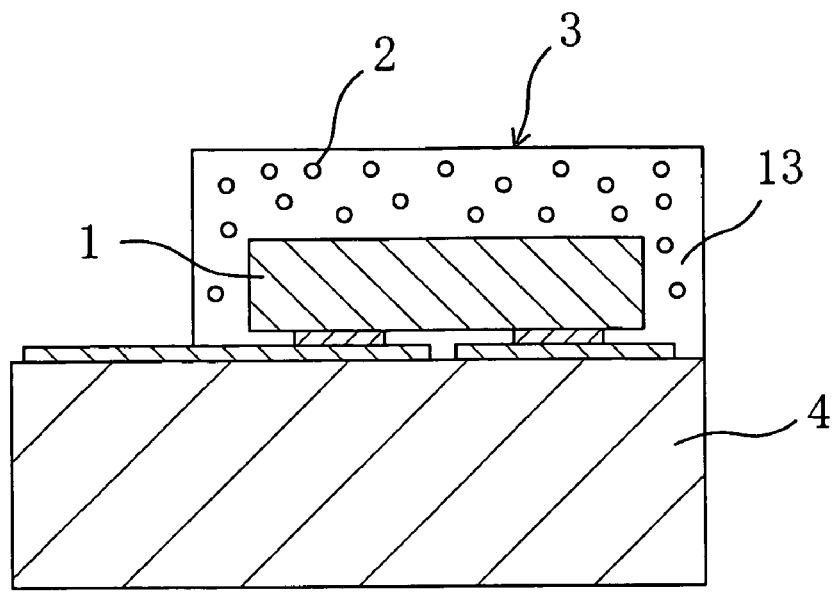
FIG. 1 is a vertical cross-sectional view showing a first exemplary light-emitting semiconductor device according to a first embodiment of the present invention.

FIG. 1 is a vertical cross-sectional view showing a first exemplary light-emitting semiconductor device as a relatively typical example of this embodiment. As shown in FIG. 1, the first exemplary light-emitting semiconductor device is a chip-type light-emitting semiconductor device including: a substrate 4 (a submount element) functioning as a Zener diode; a flip-chip-type blue LED 1 mounted on the substrate 4 to be electrically connected to the Zener diode in the substrate; and a luminescent layer 3 encapsulating the blue LED 1 and made of a mixture of yellow/yellowish phosphor particles 2 and a base material 13 (a translucent resin). The blue LED 1 has a main light-extracting surface facing upward as shown in FIG. 1. The luminescent layer 3 is situated so that blue light emitted from the main light-extracting surface passes therethrough.

Figure 2:
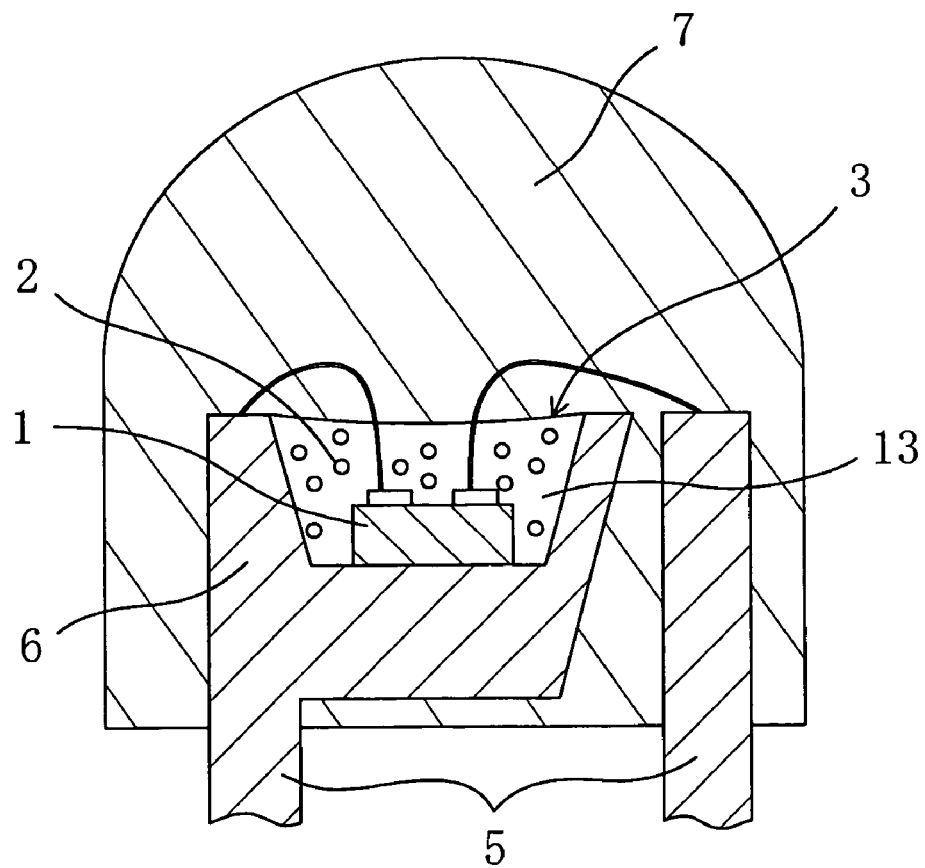
FIG. 2 is a vertical cross-sectional view showing a second exemplary light-emitting semiconductor device according to the first embodiment of the present invention.

FIG. 2 is a vertical cross-sectional view showing a second exemplary light-emitting semiconductor device according to this embodiment. As shown in FIG. 2, the second exemplary light-emitting semiconductor device is a bulletlike light-emitting semiconductor device including: a lead frame 5; a cup 6 provided in a mount lead of the lead flame 5; a blue LED 1 mounted in a recess of the cup 6 to be electrically connected to the lead frame 5 via bonding wires; a luminescent layer 3 formed in the cup 6 and made of a mixture of yellow/yellowish phosphor particles 2 and a base material 13 (a resin); and an encapsulating resin 7 for encapsulating the lead frame 5, the luminescent layer 3 and the bonding wires. The side wall of the recess of the cup 6 functions as a reflecting plate that reflects light. The blue LED 1 has a main light-extracting surface facing upward as shown in FIG. 2. The luminescent layer 3 is situated so that blue light emitted from the main light-extracting surface passes therethrough.

Figure 3:
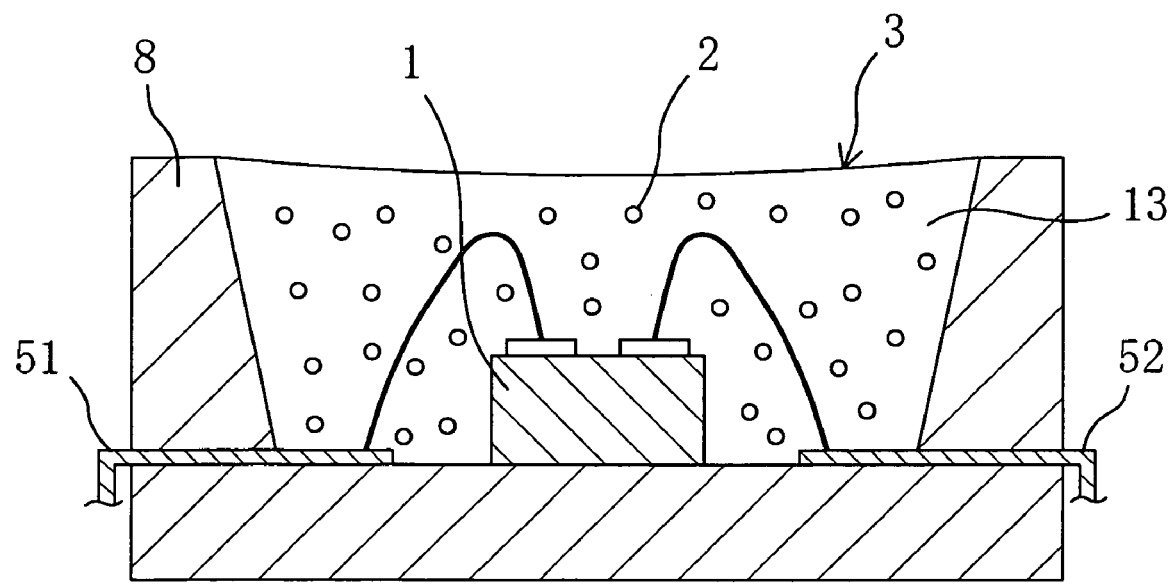
FIG. 3 is a vertical cross-sectional view showing a third exemplary light-emitting semiconductor device according to the first embodiment of the present invention.

FIG. 3 is a vertical cross-sectional view showing a third exemplary light-emitting semiconductor device according to this embodiment. As shown in FIG. 3, the third exemplary light-emitting semiconductor device is a chip-type light-emitting semiconductor device including; an integrated resin casing 8 having a recess; a blue LED 1 placed in the recess of the casing 8; externally connecting terminals 51 and 52 extending from on the bottom of the recess to the outside through the respective sides of the casing 8; bonding wires connecting the externally connecting terminals 51 and 52 to pad electrodes on the blue LED 1; and a luminescent layer 3 formed in the casing 8 and made of a mixture of yellow/yellowish phosphor particles 2 and a resin. The side wall of the recess of the casing 8 functions as a reflecting plate that reflects light. The blue LED 1 has a main light-extracting surface facing upward as shown in FIG. 3. The luminescent layer 3 is situated so that blue light emitted from the main light-extracting surface passes therethrough.

In each of the first through third exemplary light-emitting semiconductor devices shown in FIGS. 1 through 3, the blue LED 1 is an LED which emits light having a main emission peak in the wavelength range greater than 430 nm and less than or equal to 500 nm, and the yellow/yellowish phosphor particles 2 is a phosphor which absorbs blue light emitted by the blue LED 1 to emit a luminescence having a main emission peak in the wavelength range from 550 nm to 600 nm, both inclusive. The luminescent layer 3 is a luminescent layer including the yellow/yellowish phosphor particles 2.

A blue-light-emitting device according to the present invention may be a device selected from among a laser diode, a surface emitting laser diode, an inorganic electroluminescence device and an organic electroluminescence device, as well as the blue LED (blue-light-emitting diode) of this embodiment. However, in terms of increase in the output and the lifetime of the light-emitting semiconductor device, diodes such as a light-emitting diode, a laser diode and a surface emitting laser diode are superior to other devices.

The inventive light-emitting semiconductor device is a light-emitting semiconductor device configured by combining the blue LED 1 and the luminescent layer 3 containing the yellow/yellowish phosphor particles 2 that absorbs blue light emitted by the blue LED 1 to emit a fluorescence having an emission peak in the wavelength range from 550 nm to 600 nm, both inclusive. The yellow/yellowish phosphor particles 2 contained in the luminescent layer 3 is excited by part of the light from the blue LED 1 to produce a fluorescence with a wavelength different from that of the light from the blue LED. Accordingly, the color mixture of the fluorescence from the yellow/yellowish phosphor and the light from the blue LED that has been output and does not contribute to excitation of the yellow phosphor is produced, thereby allowing emission of white or whitish light.

Now, the yellow/yellowish phosphor particles 2 are a silicate phosphor containing, as a main component, a compound expressed by the following Chemical Formula (1):

$$(Sr_{1-a1-b1-x}Ba_{a1}Ca_{b1}Eu_x)_2SiO_4 \qquad (1)$$

In Chemical Formula (1), the values a1, b1 and x are in the range $0 \leq a1 \leq 0.3$, $0 \leq b1 \leq 0.8$ and $0 < x < 1$, respectively).

This silicate phosphor can be in the three kinds of crystal structures of an orthorhombic system, a monoclinic system and a hexagonal system, as will be described later in detail using experimental data. In the inventive light-emitting semiconductor device, it is sufficient for the yellow/yellowish phosphor to emit a fluorescence having a main emission peak in the wavelength range from 550 nm to 600 nm, both inclusive, by absorbing blue light emitted by the blue LED 1. The crystal structure of the silicate phosphor may be any one of the orthorhombic system, the monoclinic system and the hexagonal system.

An experiment done by the present inventors shows that such a yellow/yellowish phosphor is limited to a silicate phosphor containing, as a main component, a compound expressed by the following Chemical Formula (2):

$$(Sr_{1-a1-b2-x}Ba_{a1}Ca_{b2}Eu_x)_2SiO_4 \qquad (2)$$

In Chemical Formula (2), the values a1, b2 and x are in the ranges $0 \leq a1 \leq 0.3$, $0 \leq b2 \leq 0.6$ and $0 < x < 1$, respectively. It is preferable that the values a1, b2 and x are in the ranges $0 < a1 \leq 0.2$, $0 < b2 \leq 0.4$ and $0.005 < x < 0.1$, respectively. It is more preferable that the values a1, b2 and x are in the ranges $0 < a1 \leq 0.15$, $0 < b2 \leq 0.3$ and $0.01 < x < 0.05$, respectively. It is most preferable that the values a1, b2 and x are in the ranges $0.01 \leq a1 \leq 0.1$, $0.001 \leq b2 \leq 0.05$ and $0.01 < x \leq 0.02$, respectively.

With a composition in which the values a1 and b2 in Chemical Formula (2) are smaller than the ranges mentioned above, the silicate phosphor is liable to have an unstable crystal structure and to include a monoclinic crystal structure, resulting in that the emission characteristics change depending on the operation temperature. On the other hand, with a composition in which these values are larger than the ranges, even if the crystal structure is an orthorhombic system, the phosphor emits greenish light, proving to be not a desirable yellow/yellowish phosphor but a green/greenish phosphor. Accordingly, even if the phosphor is combined with a blue LED, a white-light-emitting semiconductor device exhibiting an excellent color of light is not achieved. With a composition in which the amount of addition of Eu x is smaller than the range, the luminous intensity is low. With a composition in which the amount is larger than the range, there arises noticeably not only a problem that the luminous intensity is low because of concentration quenching (of luminescence) or self-absorption caused by $Eu^{2+}$ ions but also a problem of thermal quenching that the luminous intensity decreases as the ambient temperature increases. The yellow/yellowish phosphor used in the present invention is preferably a silicate phosphor having an orthorhombic crystal structure because the silicate phosphor emits the yellow/yellowish light which is excellent in color purity and, therefore, a light-emitting semiconductor device emitting white light with excellent color can be provided. Part of Sr, Ba or Ca may be substituted with Mg or Zn to stabilize the crystal structure of the silicate phosphor or to enhance the luminous intensity.

To control the color of light emitted by the silicate phosphor, part of Si may be substituted with Ge. That is to say, the inventive light-emitting semiconductor device may be a light-emitting semiconductor device using a yellow/yellowish phosphor containing, as a main component, a compound expressed by the following Chemical Formula (3):

$$(Sr_{1-a1-b1-x}Ba_{a1}Ca_{b1}Eu_x)_2Si_{1-z}Ge_zO_4 \qquad (3)$$

where the values a1, b1, x and z are in the ranges $0 \leq a1 \leq 0.3$, $0 \leq b1 \leq 0.8$, $0 < x < 1$ and $0 \leq z < 1$ (preferably $0 \leq z \leq 0.2$, respectively). If part of Si is substituted with Ge, the tendency of the luminous intensity to greatly decrease is observed. However, if at least the substitution amount of Ge is 20 atomic percent (at. %) or more, the main emission peak shifts to shorter wavelengths, thus obtaining emission of greenish light. To hold luminous intensity, the substitution amount of Ge z is preferably as small as possible and the value z is preferably within the range lower than 0.2.

Further, a red phosphor that absorbs light such as blue light emitted by the blue LED or yellow/yellowish light emitted by the silicate phosphor and has a main emission peak in the red wavelength range greater than 600 nm and less than or equal to 660 nm may be additionally used in order to compensate for the red spectrum of the light emitted by the light-emitting semiconductor device. A green phosphor that absorbs light such as blue light from the blue LED and has a main emission peak in the green wavelength range greater than or equal to 500 nm and lower than 550 nm where the luminous efficacy is high may be also additionally used to enhance the luminous flux.

Materials for such red and green phosphors are not limited to the materials used in this embodiment. Such a red or green phosphor may be a phosphor made of an inorganic compound or a phosphor made of an organic compound.

Usages of such red and green phosphors are not limited to the method of this embodiment so long as the light-emitting semiconductor device further includes these phosphors (luminescence materials). These phosphors may be included in a luminescent layer or may be disposed apart from the luminescent layer so long as each of the phosphors absorbs the blue light to emit red or green light and the blue light passes through at least the luminescent layer.

Examples of the red phosphor include: phosphors such as a $CaS:Eu^{2+}$ phosphor and an $SrS:Eu^{2+}$ phosphor known as a cathodoluminescence material or an electroluminescence material; a rare-earth complex or a resin structure including the rare-earth complex disclosed in, for example, Japanese Laid-Open Publications Nos. 11-246510 and 2000-63682; and an $LiEuW_2O_8$ phosphor disclosed in, for example, Japanese Laid-Open Publication No. 2001-267632.

The use of such a red phosphor increases the intensity of red emission spectrum of the light-emitting semiconductor device, especially a white-light-emitting semiconductor device, resulting in enhancement of R9 recited in JIS Z 8726-1990 or color gamut ratio Ga recited in JIS Z 8726-1990 for reference, which are known as special color rendering indices representing faithfulness toward red in the field of illumination, thus allowing the light-emitting semiconductor device to exhibit the color of light in which these indices are high.

Examples of the green phosphor include: an $SrGa_2S_4$:$Eu^{2+}$ phosphor known as a cathodoluminescence material or an electroluminescence material; and a silicate phosphor emitting a fluorescence having an emission peak in the wavelength range from 500 nm to 600 nm, both inclusive, and containing, as a main component, a compound expressed by the following Chemical Formula (4):

$$(Sr_{1-a3-b3-x}Ba_{a3}Ca_{b3}Eu_x)_2SiO_4 \qquad (4)$$

In the formula, the values a3, b3 and x are in the ranges $0 \leq a3 \leq 1$, $0 \leq b3 \leq 1$ and $0 < x < 1$, respectively.

This $(Sr_{1-a3-b3-x}Ba_{a3}Ca_{b3}Eu_x)_2SiO_4$ silicate phosphor is a phosphor different from the above-described silicate phosphor emitting yellow/yellowish light, only in composition and crystal structure. Accordingly, the $(Sr_{1-a3-b3-x}Ba_{a3}Ca_{b3}Eu_x)_2SiO_4$ silicate phosphors have similar properties to those of the yellow/yellowish-light-emitting silicate phosphor. Therefore, the use of green-light-emitting silicate phosphor in combination with the yellow-light-emitting silicate phosphor is more preferable in terms of not only light-emitting semiconductor device characteristics but also the fabrication thereof.

To provide a light-emitting semiconductor device emitting a desired color of light, a plurality of such silicate phosphors having mutually different compositions and each emitting yellow/yellowish light having an emission peak in the wavelength range from 550 nm to 600 nm, both inclusive, may be included in a luminescent layer. The silicate phosphors are phosphors which can emit light covering a large area of the yellow/yellowish wavelength range by changing the compositions. Therefore, if a plurality of types of such silicate phosphors are combined, it is possible to enlarge the color expression range of light which is emitted by the light-emitting semiconductor device, especially a light-emitting semiconductor device emitting white or whitish light, and determined by adding the colors of blue light from a blue LED and of yellow/yellowish light from the silicate phosphors.

In terms of color control for light, especially for white or whitish light, emitted by the light-emitting semiconductor device, it is effective to include, in a luminescent layer, at least one type of silicate phosphor containing a component expressed by Chemical Formula (4) as a main component and differing from a yellow/yellowish phosphor in composition. The silicate phosphor is a phosphor that emits light when excited by blue light with any of the composition ranges for the values a3 and b3 and, moreover, that has an emission peak wavelength variable in the wide wavelength range of about 505 to 598 nm by changing the composition of the phosphor. If such a phosphor is additionally included in the luminescent layer, the light-emitting semiconductor device emits light by adding the colors of blue light emitted by the blue LED and yellow/yellowish light emitted by the yellow/yellowish-light-emitting silicate phosphor emitting light and at least one of blue-green, green, yellow and orange lights emitted by an $(Sr_{1-a3-b3-x}Ba_{a3}Ca_{b3}Eu_x)_2SiO_4$ together, i.e., adding at least three colors together. Therefore, it is possible to enlarge the range of color control for light emitted by the light-emitting semiconductor device.

The light-emitting semiconductor device shown in any one of FIGS. 1 through 3 may use a substrate containing Cr and a blue LED in combination in order to compensate for the red spectrum of the light emitted by the light-emitting semiconductor device. Then, blue light emitted by the blue LED is utilized, thereby allowing the Cr-containing substrate capable of conversion into longer wavelengths to emit red light. In this way, white light with high color rendering performance can be emitted by color mixing of the blue light from the blue LED, the yellow light from the silicate phosphor and the red light from the Cr-containing substrate. That is to say, the present invention is naturally applicable to any type of light-emitting semiconductor devices such as a flip-chip-type, bulletlike or chip-type.

It is sufficient for the silicate phosphor to have a particle size of 0.1 μm to 100 μm, both inclusive, in an evaluation of particle distribution with a laser diffraction particle size analyzer (e.g., LMS-30 produced by Seishin Enterprise Co., Ltd.). However, in terms of ease of the synthesis, availability of a phosphor or formability of a luminescent layer, the particle size preferably ranges from 0.5 μm to 30 μm, both inclusive, more preferably from 1 μm to 20 μm, both inclusive, and still more preferably from 2 μm to 10 μm, both inclusive. With respect to the particle-size distribution, it is sufficient for the silicate phosphor to include no particles smaller than 0.01 μm or greater than 1000 μm. However, for the same purpose as for the particle size, the particle-size distribution in the silicate phosphor is preferably close to the normal distribution in the particle-size range from 1 μm to 50 μm, both inclusive.

Such a silicate phosphor can be fabricated by a synthesizing method described in, for example, the above-mentioned literature (J. Electrochemical Soc. Vol. 115, No. 11(1968) pp. 1181–1184). A method for fabricating a silicate phosphor for the light-emitting semiconductor device of this embodiment will be described later. Hereinafter, properties of a silicate phosphor will be described in further detail.

Figure 8:
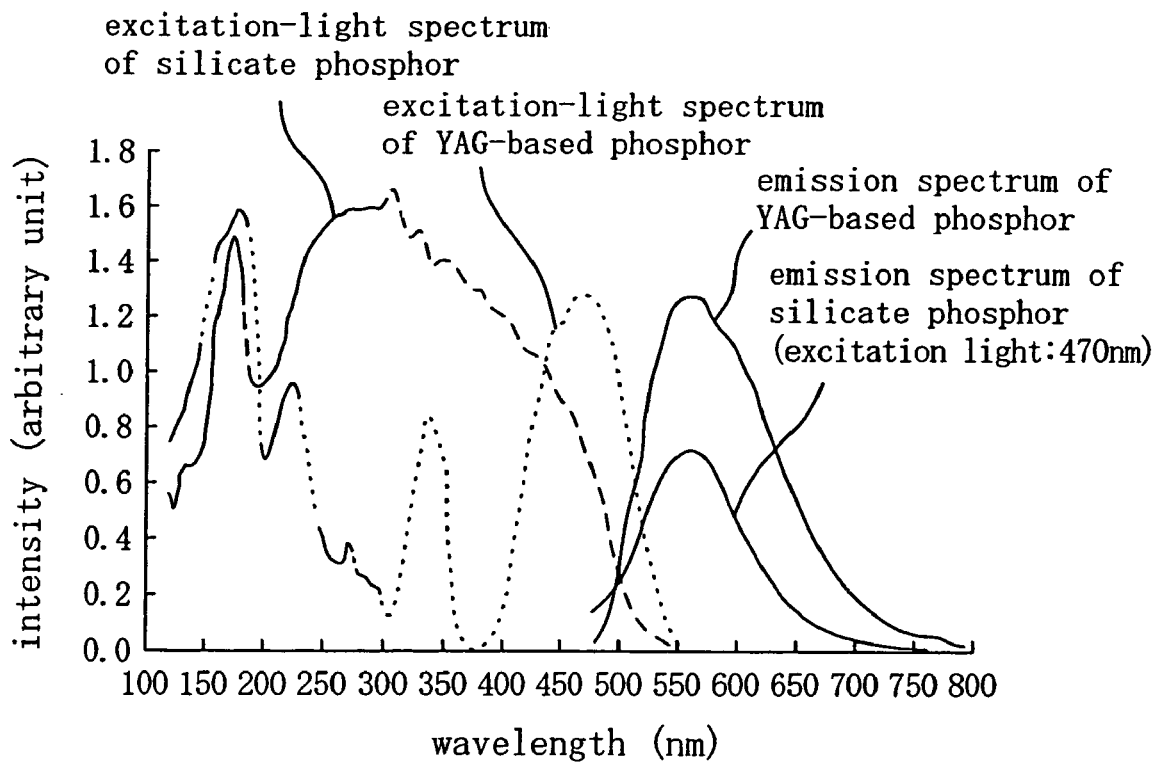
FIG. 8 is a graph showing excitation-light spectra and emission spectra of a silicate phosphor and a YAG-based phosphor.
Figure 9:
FIG. 9 is a SEM micrograph showing a cross-sectional structure of a coating of the light-emitting semiconductor device in the state shown in FIG. 7.
Figure 10:
FIG. 10 is a SEM micrograph showing a magnified view of a portion near a casing.

FIG. 8 is a graph showing examples of an excitation spectrum (i.e., a spectrum of light for exciting the silicate phosphor) and an emission spectrum of the orthorhombic silicate phosphor used in this embodiment. FIG. 8 also shows examples of an excitation light spectrum and an emission spectrum of a YAG-based phosphor for comparison in the same graph.

As shown in FIG. 8, the YAG-based phosphor is a phosphor having three excitation-light peaks around 100 nm to 300 nm, 300 nm to 370 nm, and 370 nm to 550 nm, respectively, and absorbing light in these narrow wavelength ranges to emit a yellow/yellowish fluorescence having an emission peak in the wavelength range of 550 to 580 nm, i.e., from yellow-green to yellow. On the other hand, the silicate phosphor is a yellow/yellowish phosphor having an excitation-light peak around 250 to 300 nm and absorbing light in the wide wavelength range of 100 to 500 nm to emit a yellow/yellowish fluorescence having an emission peak in the wavelength range of 550 to 600 nm (an example of which is shown in FIG. 8), i.e., from yellow-green, yellow to orange. In addition, the silicate phosphor exhibits a low luminous intensity, i.e., 100 to 30% of that of the YAG-based phosphor in general, when irradiated with blue light (excitation light) greater than 430 nm and less than or equal to 500 nm. Specifically, when the wavelength of the excitation light is 470 nm, the luminous intensity of the silicate phosphor is half (50%) of the luminous intensity of the YAG-based phosphor.

If the silicate phosphor has a composition in which the values a1, b1, b2 and x are within the respective given ranges shown in Formulas (1) and (2), the excitation light and emission spectra thereof are similar to those shown in FIG. 8.

Now, characteristics of a luminescent layer using the silicate luminescent layer are described.

The exemplary excitation spectrum and emission spectrum shown in FIG. 8 show that the silicate phosphor is a yellow/yellowish phosphor having an excitation light peak around 250 to 300 nm and absorbing light in the wide wavelength range of 100 to 500 nm to emit a yellow/yellowish fluorescence having an emission peak in the wavelength range from 550 to 600 nm, i.e., yellow-green, yellow to orange. Accordingly, combination of the silicate phosphor with a blue LED allows a light-emitting semiconductor device to emit light by adding the colors of the blue light from the blue LED and the fluorescence from the yellow/yellowish phosphor together.

Comparison in excitation spectrum between the silicate phosphor and the YAG-based phosphor shown in FIG. 8 as examples indicates that the silicate phosphor is a phosphor having a relatively high internal quantum efficiency but having a low external quantum efficiency when irradiated with blue light (excitation light) in the wavelength range greater than 430 nm and less than or equal to 500 nm because the reflectance of blue excitation light is high. That is to say, the silicate phosphor is a phosphor having a so-called low luminous efficacy (external quantum efficiency). For example, in response to the excitation light of 470 nm, the silicate phosphor emits a fluorescence having an intensity only half of the intensity of the light emitted by the YAG-based phosphor. Therefore, in the case where a uniform color of light is to be obtained in a white-light-emitting semiconductor device that emits white light by adding the colors of the blue light from the blue LED and the yellow light from the yellow/yellowish phosphor together, if the silicate phosphor is used, a larger amount of a phosphor is used than in the case where the YAG-based phosphor is used, so that the thickness of a luminescent layer is relatively thick. As a result, the phosphor is less affected by the unevenness created in the surface of the phosphor, so that variation in thickness of the luminescent layer becomes substantially small, thus obtaining a light-emitting semiconductor device which emits light with small color unevenness.

If a luminescent layer is formed using the above-described silicate phosphor and a resin, distribution of phosphor particles in the luminescent layer is small, as compared to a known luminescent layer using a YAG-based phosphor. If a light-emitting semiconductor device is configured by using a YAG-based phosphor, phosphor particles are in contact with each other in a luminescent layer, thus arising a problem that the intensity of the resultant white or whitish light is low, as described above. Such a problem of low intensity because of this reason is caused not only in the case where a YAG-based phosphor is used but also in any case where the light-emitting semiconductor device has a luminescent layer in which phosphor particles are in contact with each other.

On the other hand, if conditions for forming a luminescent layer are selected as those for the light-emitting semiconductor device of this embodiment, phosphor particles are relatively evenly dispersed in the luminescent layer, thus obtaining a light-emitting semiconductor device that emits light with small color unevenness. The reason why the use of the silicate phosphor of this embodiment reduces distribution unevenness of the phosphor particles in the luminescent layer has been minutely investigated but has not clarified completely yet. However, the reduction in distribution unevenness of the phosphor particles definitely relates to at least the fact that the difference in specific gravity between the phosphor and the resin is smaller than that between the YAG-based phosphor and the resin.

Hereinafter, the point where the luminescent layer in the light-emitting semiconductor device of this embodiment has a structure in which phosphor particles are relatively evenly dispersed throughout a base material (a scattering structure) will be described with reference to FIGS. 1 through 3.

In the luminescent layer 3 shown in FIGS. 1 through 3, as has been described above, the yellow/yellowish phosphor particles 2 are a phosphor that absorbs blue light emitted by a blue LED and having a main emission peak in the wavelength range from 550 nm to 600 nm, both inclusive, and are also a silicate phosphor. The base material 13 is a translucent resin such as an epoxy resin, an acrylic resin, a polyimide resin, a urea resin or a silicone resin.

The luminescent layer 3 of the inventive light-emitting semiconductor device may include a phosphor in addition to the yellow/yellowish phosphor or may include a substance other than a phosphor. Moreover, the luminescent layer 3 may contain a plurality of types of such yellow/yellowish phosphors.

In the light-emitting semiconductor device of this embodiments so long as the luminescent layer 3 has a structure in which the yellow/yellowish phosphor particles 2 are dispersed in the base material 13 as shown in FIGS. 1 through 3, the size and the shape of the yellow/yellowish phosphor particles 2 in the luminescent layer 3 are not specifically limited. It has been proved that if silicate phosphor particles are used as phosphor particles in the luminescent layer, the use of the phosphor particles having a particle size in the range from 0.5 μm to 30 μm, both inclusive, allows the luminescent layer to have a structure in which the phosphor particles are dispersed as shown in FIGS. 1 through 3.

The smaller the size of the yellow/yellowish phosphor particles 2 is, the more dispersed the particles in the luminescent layer 3 are. However, since small phosphor particles have a large specific surface area (of particles), the ratio of the surface area of the particles where a lot of lattice defects are present is high with respect to the volume of the phosphor particles, so that the luminous intensity of light from the luminescent layer 3 decreases. On the other hand, if the phosphor particles are large in size, the yellow/yellowish phosphor particles 2 readily sediment by gravity during the formation of the luminescent layer 3, so that the luminescent layer 3 has a structure in which the phosphor particles are less dispersed. In view of this, the particle size of the yellow/yellowish phosphor is preferably in the above-described range (i.e., the range from 0.5 μm to 30 μm, both inclusive), more preferably from 1 μm to 25 μm, both inclusive, and still more preferably from 3 μm to 20 μm, both inclusive.

A material for the base material 13 is not limited to the material described in this embodiment so long as the luminescent layer 3 has a structure in which phosphor particles are dispersed as shown in FIGS. 1 through 3. The base material 13 may be any material other than a resin so long as the material is translucent. If the base material 13 is a resin, the kind and the absolute specific gravity of the resin is not limited to this embodiment basically.

In the case where the base material 13 is a resin, as the absolute specific gravity of the resin comes close to the absolute specific gravity of the yellow/yellowish phosphor particles 2, the phosphor particles are tend to disperse more and more in the luminescent layer 3. As will be described later, the absolute specific gravity of a resin is smaller than that of the yellow/yellowish phosphor particles 2 in general, the absolute specific gravity of the resin is preferably as large as possible within the range lower than the absolute specific gravity of the yellow/yellowish phosphor particles 2.

If the absolute specific gravity of the resin is small, the yellow/yellowish phosphor particles 2 readily sediment by gravity during the formation of the luminescent layer 3, so that the phosphor particles are less readily to disperse in the luminescent layer 3. In view of this, the absolute specific gravity of the resin is preferably set in the range greater than or equal to 0.8 and less than or equal to the absolute specific gravity of the phosphor particles, more preferably in the range greater than or equal to 1.0 and less than or equal to the absolute specific gravity of the phosphor particles, and still more preferably in the range greater than or equal to 1.5 and less than or equal to the absolute specific gravity of the phosphor particles According to "Plastic Data Handbook" (edited by Kimimasa ITO and published by Kogyo Chosakai Publishing Co. Ltd.) or "Nonmetallic Material Data Book" (published by Japanese Standards Association), for example, the absolute specific gravity of an epoxy resin is between 1.0 and 2.1, inclusive, the absolute specific gravity of an acrylic resin is between 1.0 and 1.4, inclusive, the absolute specific gravity of a polyimide resin is between 1.3 and 1.5, inclusive, the absolute specific gravity of a urea resin is about 1.5 and the absolute specific gravity of a silicone resin is between 1.7 and 2.0, inclusive.

In each of the exemplary light-emitting semiconductor devices shown in FIGS. 1 through 3, the luminescent layer 3 uses a mixture of phosphor particles and a resin (base material). Alternatively, the luminescent layer may be made by forming (or sintering) a luminescence material.

—General Fabrication Method—

Concrete examples for fabricating an inventive light-emitting semiconductor device will be described in detail later. Now, a summary of a method for fabricating a luminescent layer 3 having a structure in which phosphor particles are dispersed and preferred embodiments thereof are described.

A luminescent layer 3 with a structure in which phosphor particles are dispersed can be formed by placing a phosphor paste, in which yellow/yellowish phosphor particles 2 having an absolute specific gravity within a given range are dispersed in a base material 13 having an absolute specific gravity within a given range, in a position in a light-emitting semiconductor device through a process such as injection or application, and then by curing the phosphor paste.

The phosphor paste can be fabricated by weighing and mixing the yellow/yellowish particles 2 and the base material 13 such as a resin such that the phosphor paste has a given phosphor concentration. To mix these materials, various techniques may be used. Examples of the techniques include mixing using a mortar, stirring using an agitator and mulling using a roller.

In the mixing, the weight percentage of the yellow/yellowish phosphor particles 2 with respect to the base material 13 (i.e., the phosphor concentration) is preferably in the range from 10 wt % to 80 wt %, both inclusive, and more preferably in the range from 20 wt % to 60 wt %, both inclusive. If the phosphor concentration is lower than the ranges, the luminescent layer 3 exhibits weak emission of the yellow/yellowish phosphor so that the light-emitting semiconductor device configured by using the luminescent layer 3 emits bluer light, resulting in that it is difficult to obtain white light with excellent color tone. On the other hand, if the phosphor concentration is higher than the range, the luminescent layer 3 exhibits strong emission of the yellow/yellowish phosphor so that the light-emitting semiconductor device configured by using the luminescent layer 3 emits yellower light, resulting in that is difficult to obtain white light with excellent color tone.

In the inventive method for fabricating the luminescent layer, a technique for curing the phosphor paste is not limited to a specific technique. The phosphor paste may be cured by: using a material that cures by mixing two liquids such that the curing due to mixing of the two liquids occurs in the phosphor paste; heating the phosphor paste using a thermosetting material; or irradiating the paste with light using a photo-curing material. The luminescent layer 3 can be obtained with any one of the curing techniques for the phosphor paste.

To form the luminescent layer 3 in which phosphor particles are dispersed, it is preferable to suppress the sedimentation speed of the yellow/yellowish phosphor particles 2 in the base material 13.

Hereinafter, the sedimentation speed of phosphor particles being sedimenting in a solvent will be described for reference. According to Stokes' low, a ball having a radius r (unit: m) and a density $\rho_2$ is being sedimenting in a fluid having a density $\rho_1$ and a viscosity coefficient $\eta$ (i.e., viscosity, unit: Pa·s or P (poise)) at a sedimentation speed $\mu$ (m/s) expressed by the following equation (5):

$$\mu = \{2 \times r^2 \times (\rho_2 - \rho_1) \times g\}/(9 \times \eta) \quad (5)$$

In Equation (5), g indicates a gravitational acceleration (unit: m·s$^{-2}$).

Therefore, qualitatively, the sedimentation speed of phosphor particles being sedimenting in a resin as a solvent decreases as the particle size of the phosphor particles decreases, the speed also decreases as the difference in specific gravity between the phosphor particles and the resin narrows, and also decreases as the viscosity of the resin increases.

From Stokes' law described above, it is possible to reduce the sedimentation speed of the yellow phosphor 3 in the resin by using the following measures 1. through 4.

1. Using light phosphor particles having a small absolute specific gravity
2. Using a resin having a large absolute specific gravity
3. Using phosphor particles having a small particle size
4. Using a resin having a large viscosity It should be noted that these measures 1. through 4. are subjected to various constraints such as a constraint on fabrication processes, on cost or on emission performance of the luminescent layer.

In the inventive method for fabricating the luminescent layer, each of the absolute specific gravity of the yellow/yellowish phosphor particles 2 that are limited in main emission peak wavelength range and in element and the absolute specific gravity of the resin are limited within a given range. As a preferred embodiment, the particle size of the yellow/yellowish phosphor is further limited to a given range. As a more preferred embodiment, the kind and composition of the yellow/yellowish phosphor are limited.

First, as the yellow/yellowish phosphor particles 2, used is a phosphor containing no Cd (cadmium) and emitting light having a main emission peak wavelength in the range from 560 nm to 600 nm, both inclusive, preferably in the range greater than 560 nm and less than or equal to 600 nm, and more preferably in the range from 565 nm to 600 nm, both inclusive, under room temperature. Next, the absolute specific gravity of the yellow/yellowish phosphor particles 2 is limited within the range from 3.0 to 4.65, both inclusive, preferably within the range from 3.0 to 4.60, both inclusive, and more preferably within the range greater than or equal to 3.0 and less than 4.55. In addition, the absolute specific gravity of the resin is limited within the range greater than or equal to 0.8 and less than or equal to the absolute specific gravity of the yellow/yellowish phosphor, preferably within the range greater than or equal to 1.0 and less than or equal to the absolute specific gravity of the yellow/yellowish phosphor, and more preferably within the range greater than or equal to 1.5 and less than or equal to the absolute specific gravity of the yellow/yellowish phosphor.

In this way, the difference in specific gravity between the yellow/yellowish phosphor particles 2 and the resin narrows so that the sedimentation speed of the phosphor particles in the resin decreases, as indicated by Stokes' low in Equation (5), resulting in that the luminescent layer with a structure in which the phosphor particles are dispersed is easily formed.

Especially, examples of yellow/yellowish phosphors containing no Cd include a phosphor including, as a base material, a compound containing at least one element selected from the group consisting of Mg, Ca, Sr, Ba, Sc, Y, lanthanoid, Ti, Zr, Hf, V, Nb, Ta, Mo, W, Zn, B, Al, Ga, In, Si, Ge, Sn and P and at least one element selected from the group consisting of O, S, Se, F, Cl and Br. These elements are relatively less noxious.

The reason why the main peak wavelength of the yellow/yellowish phosphor particles 2 is limited within the range from 560 nm to 600 nm, both inclusive, is to obtain white light having a desired color tone. The reasons why the absolute specific gravity of the resin is limited within the above-mentioned ranges and why the phosphor containing no Cd is exclusively used have been already explained.

In the inventive method for fabricating the light-emitting layer of the light-emitting semiconductor device, the yellow/yellowish phosphor particles 2 are not specifically limited in kind basically so long as the yellow/yellowish phosphor particles 2 contain no Cd, exhibits a main emission peak wavelength in the range from 560 nm to 600 nm, both inclusive, under room temperature and has an absolute specific gravity in the range from 3.0 to 4.65, both inclusive. The yellow/yellowish phosphor particles 2 may or may not be the silicate phosphor particles described above.

On the other hand, none of the known light-emitting semiconductor devices uses, as phosphor particles, such light yellow/yellowish phosphor particles 2 which contain no noxious substance, emit yellow/yellowish light when excited by blue light, and have an absolute specific gravity in the ranges described in this embodiment, so that the formation of the luminescent layer for the known devices requires a yellow-light-emitting YAG-based phosphor having a large absolute specific gravity. The yellow-light-emitting YAG-based phosphor particles have an absolute specific gravity in the range greater than 4.65 and less than or equal to about 4.98. The spectrum of emission from the yellow-light-emitting YAG-based phosphor particles shifts to longer wavelengths, as the absolute specific gravity thereof increases. Therefore, it is difficult for the known light-emitting devices to obtain excellent characteristics which are obtained in the light-emitting device of this embodiment.

In a preferred embodiment of the present invention, the particle size of the yellow/yellowish phosphor particles 2 is limited within the range from 0.5 μm to 30 μm, both inclusive, preferably within the range from 1 μm to 25 μm, both inclusive, and more preferably within the range from 3 μm to 20 μm, both inclusive. The reason why the particle size of the yellow/yellowish phosphor particles 2 is limited in this preferred embodiment has been already explained.

In a further preferred embodiment, a silicate phosphor containing, as a main component, a compound expressed by Chemical Formula (1), i.e., a compound expressed by $(Sr_{1-a1-b1-x}Ba_{a1}Ca_{b1}Eu_x)_2SiO_4$, is used as the yellow/yellowish phosphor particles 2. Although the absolute specific gravity of the silicate phosphor varies to some extent depending on the composition, the absolute specific gravity of the yellow/yellowish phosphor particles 2 is easily set within the range from 3.0 to 4.65, both inclusive, thereby allowing a luminescent layer having a structure in which phosphor particles are dispersed to be formed easily. The specific gravity of the silicate phosphor containing a compound expressed by Chemical Formula (1) as a main component increases, as the substitution amount of Ba increases, while decreasing as the substitution amount of Ca increases.

Now, the absolute specific gravities of phosphors are supplementary described. True density measurements of phosphors by constant volume expansion with He gas replacement method using a Multivolume Pycnometer 1305 produced by Micromeritics Instrument Co. show that the absolute specific gravities of a YAG-based phosphor $((Y_{0.7}Gd_{0.28}Ce_{0.02})_3Al_5O_{12}$: main emission peak wavelength of 565 nm), a silicate phosphor $((Ba_{0.05}Sr_{0.93}Eu_{0.02})_2SiO_4$: main emission peak wavelength of 575 nm) and a silicate phosphor containing a smaller amount of Si and having a composition different from the former silicate phosphor $((Ba_{0.24}Sr_{0.74}Eu_{0.02})_2SiO_4$: main emission peak wavelength of 559 nm), are 4.98, 4.53 and 4.67, respectively (measurement accuracy: +1%). As an example, with respect to the phosphor which emits light having a main emission peak around 565 nm, it was proved that the absolute specific gravity of the silicate phosphor is smaller than that of the YAG-based phosphor by about 10%.

Figure 48:
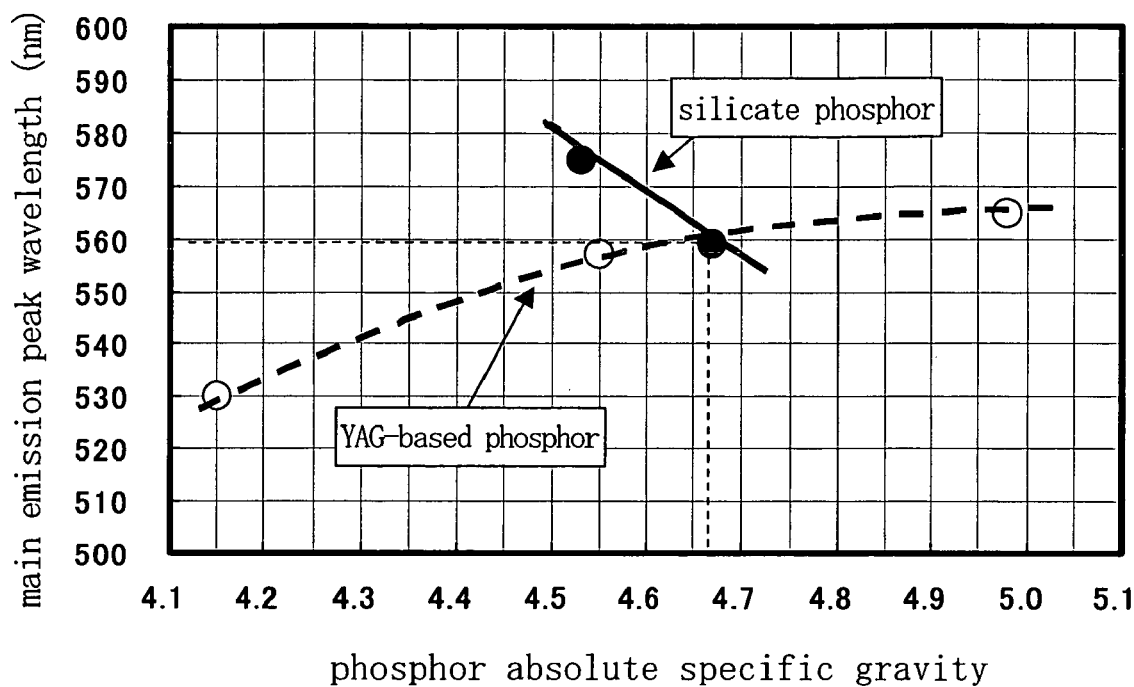
FIG. 48 is a graph showing a relationship between absolute specific gravity and main emission peak wavelength for a YAG-based phosphor and a silicate phosphor.

FIG. 48 is a graph showing respective relationships between the absolute specific gravity and the main emission peak wavelength for a YAG-based phosphor and a silicate phosphor. As shown in FIG. 48, it is impossible or, if not impossible, difficult for a YAG-based phosphor to serve as a phosphor that emits yellow/yellowish light having a main emission peak in the wavelength range from 560 nm to 600 nm, both inclusive, especially, in the wavelength range from 565 nm to 600 nm, both inclusive, and having an absolute specific gravity of 4.65 or less. On the other hand, it is easy for a silicate phosphor containing a compound expressed by Chemical Formula (1), i.e., $(Sr_{1-a1-b1-x}Ba_{a1}Ca_{b1}Eu_x)_2SiO_4$, to serve as a phosphor that emits yellow/yellowish light having a main emission peak in the wavelength range from 560 nm to 600 nm, both inclusive, especially, in the wavelength range from 565 nm to 600 nm, both inclusive, and having an absolute specific gravity of 4.65 or less.

Now, the viscosities of a resin and a phosphor paste are described. The inventive method for fabricating a luminescent layer of a light-emitting semiconductor device is not limited to fabrication methods which will be described later. However, if the viscosities of a resin and a phosphor paste are too low, phosphor particles sediment by gravity so that a structure in which the phosphor particles disperse in the resin cannot be achieved, as described above. On the other hand, if the viscosity of the resin is too high, there occurs a disadvantage that handling the light-emitting semiconductor device is cumbersome in a fabrication process. In view of these aspects, each of the viscosities of the resin and phosphor is in the range from 0.01 Pa·s to 10 Pa·s, both inclusive, preferably in the range from 0.03 Pa·s to 3 Pa·s, both inclusive, and more preferably in the range from 0.1 Pa·s to 1 Pa·s, both inclusive. However, the viscosity of a liquid fluid such as a resin or a phosphor paste varies depending on temperature and pressure, i.e., decreases as the temperature increases while increasing as the pressure increases. Therefore, it is difficult to define the viscosity simply. The viscosity of the resin or the phosphor paste may be adjusted within the ranges described above by adjusting conditions including pressure and temperature during the fabrication.

In the inventive method for forming the luminescent layer of the light-emitting semiconductor device, the phosphor paste may be formed by curing with ultra-fine particles whose primary particles have an average particle size in the range from 1 nm to 100 nm, both inclusive, preferably in the range from 3 nm to 50 nm, both inclusive, included in the phosphor paste.

As expressed by Equation (5), the sedimentation speed of ultra-fine particles with an extremely small particle radius is extremely low in a phosphor paste. Accordingly, if such ultra-fine particles are included in the phosphor paste, the ultra-fine particles, which sediment extremely slowly, act in such a manner as preventing sedimentation of the yellow/yellowish phosphor particles 2. As a result, by adding the ultra-fine particles to the phosphor paste, the sedimentation speed of the yellow/yellowish phosphor particles 2 in the phosphor paste decreases, so that the luminescent layer 3 having a structure in which the phosphor particles are dispersed in the resin is easily obtained.

Examples of such ultra-fine particles include a silicon dioxide powder known by the name of Aerosil (Degussa Co., Ltd.: Germany). Materials for ultra-fine particles which may be added to the phosphor paste is not limited to silicon dioxide and may be an ultra-fine particle material whose primary particles have an average particle size in the range from 1 nm to 100 nm, both inclusive. Instead of silicon dioxide, aluminum oxide, for example, may be used as the ultra-fine particle material.

Ultra-fine particles having a particle size of about 5 nm or less cannot be measured with the laser diffraction particle size analyzer as mentioned above. Therefore, the particle sizes (diameters) of ultra-fine particles are actually measured based on the object observed by an electron microscope observation, thereby defining an average value of the particle sizes as the average size of the primary particles.

As described above, with the method for forming the luminescent layer of the light-emitting semiconductor device, the luminescent layer 3 having a structure in which phosphor particles are dispersed is formed. The light-emitting semiconductor device including the luminescent layer having the structure in which phosphor particles are dispersed achieves remarkable effects with the following actions.

Specifically, such a luminescent layer contains substantially neither light absorption factor nor light scattering factor. Therefore, as compared to the known luminescent layer in which phosphor particles are in contact with each other, for example, phosphor particles are less likely to be in contact with each other, or even if these particles are in contact with each other, the contact area is largely reduced, so that the luminescent layer has substantially no light absorption and attenuation factor. Accordingly, the luminescent layer exhibits improved light transmissivity, thus allowing blue light emitted by a blue LED to pass through the luminescent layer without being absorbed and attenuated or to contribute to excitation of the phosphor. In addition, since the luminescent layer is in the state that the entire surface of the phosphor particles can be irradiated with the blue light, the cross-sectional area of the phosphor particles to be excited increases substantially, so that the phosphor particles in the luminescent layer emit light effectively. Part of the blue light which is applied to the phosphor particles but does not contribute to the excitation of the phosphor is reflected off the surfaces of the phosphor particles and then emitted as blue light to the outside of the luminescent layer. Since blue LEDs of the same type emit blue light with the same output, in a white-light-emitting semiconductor device that obtains white light by adding the colors of blue light emitted by a blue LED and yellow light emitted by a yellow phosphor together, the luminescent layer having fewer light absorption and attenuation factors and using a phosphor having a high internal quantum efficiency can exhibit a high luminous flux, even if the luminescent layer is made of a phosphor material having a low luminous efficacy (external quantum efficiency) in response to excitation by the blue light.

Figure 7:
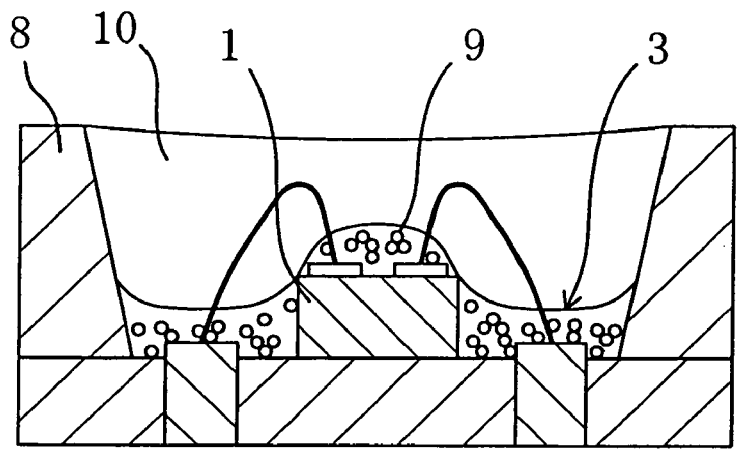
FIG. 7 is a cross-sectional view showing an example of a chip-type light-emitting semiconductor device fabricated by a known pouring technique.

If the luminescent layer of the light-emitting semiconductor device of this embodiment and the known luminescent layer have the same surface area (e.g., the area of the uppermost surface of the luminescent layer 3 in the light-emitting semiconductor device shown in FIGS. 1 through 3), the substantial thickness of the luminescent layer having a structure in which phosphor particles are dispersed in a resin as in this embodiment (see the luminescent layer 3 shown in FIG. 2, for example) increases, as compared to the known luminescent layer in which many phosphor particles are in contact with each other (see the luminescent layer 3 in FIG. 7). Accordingly, in the light-emitting semiconductor device of this embodiment, even if the surface unevenness of the luminescent layer 3 enlarges to some extent, variation in thickness of the luminescent layer 3 is less affected by the surface unevenness of the luminescent layer 3, resulting in reducing variation in emission caused by thickness variation in the luminescent layer 3.

Embodiment 2

Now, an embodiment of a light-emitting system according to the present invention is described with reference to the drawings.

Various kinds of displaying systems using light-emitting semiconductor devices (e.g., LED information display terminals, LED traffic lights, LED stoplights of vehicles and LED directional lights) and various kinds of lighting systems (e.g., LED interior/exterior lights, courtesy LED lights, LED emergency lights, and LED surface emitting sources) are herein defined broadly as light-emitting systems.

Figure 4:
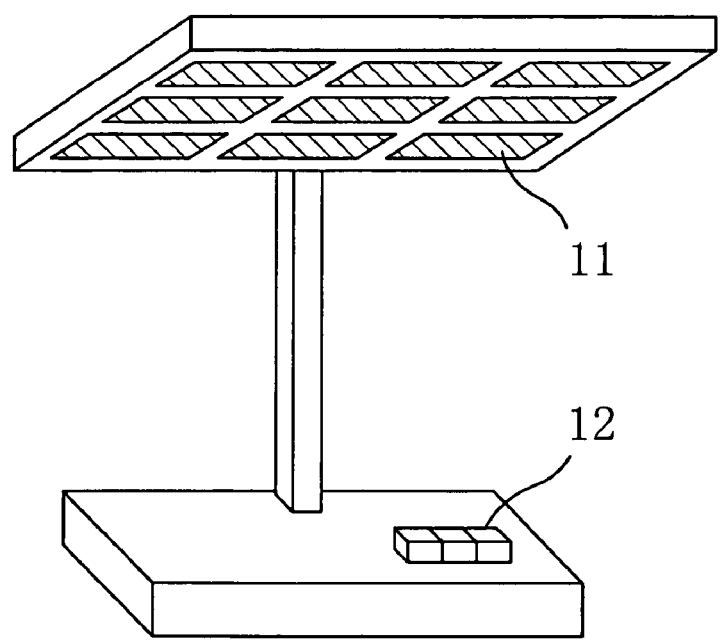
FIG. 4 is a perspective view schematically showing a configuration of a desk-lamp-type lighting system as a first exemplary light-emitting system according to a second embodiment of the present invention.
Figure 5:
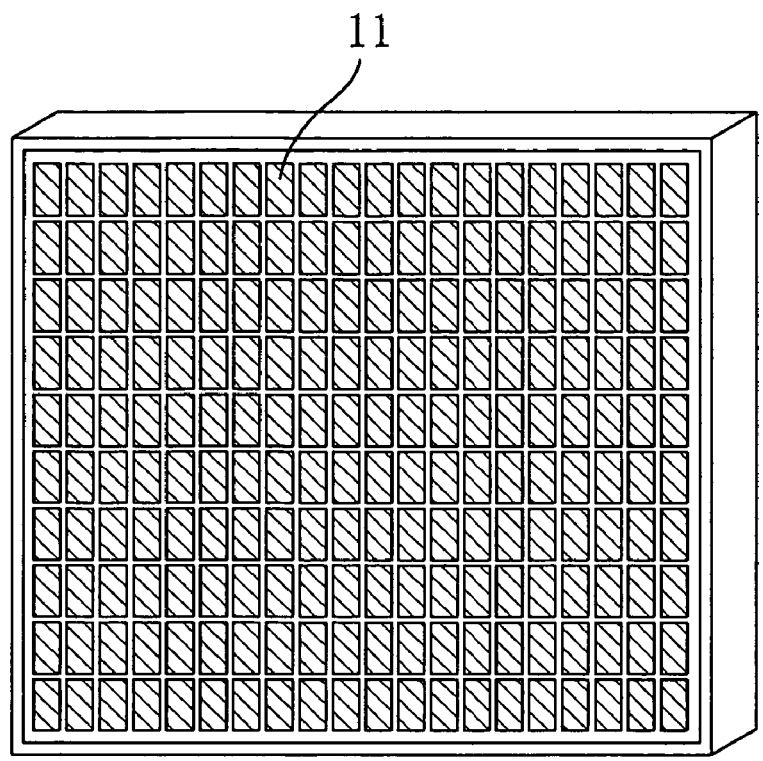
FIG. 5 is a perspective view schematically showing a configuration of an image displaying system as a second exemplary light-emitting system according to the second embodiment of the present invention.
Figure 6:
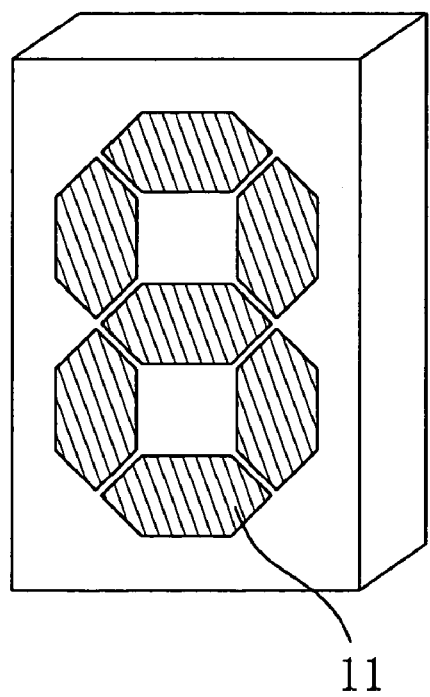
FIG. 6 is a perspective view schematically showing a configuration of a pattern displaying system as a third exemplary light-emitting system according to the second embodiment of the present invention.

FIGS. 4 through 6 are perspective views respectively showing examples of a light-emitting system according to a second embodiment of the present invention. FIG. 4 is a perspective view schematically showing a configuration of a desk-lamp-type lighting system as a first exemplary light-emitting system of the present invention.

As shown in FIG. 4, the first exemplary light-emitting system includes: a lighting unit in which a large number of light-emitting semiconductor devices 11 according to the present invention as described in the first embodiment are arranged; and a switch 12 for lighting the light-emitting semiconductor devices 11. When the switch 12 is turned on, the light-emitting semiconductor devices 11 are energized to emit light (not shown).

The lighting system shown in FIG. 4 is merely a preferred example of the light-emitting system, and the inventive light-emitting system is not limited to this example. The inventive light-emitting system is preferably configured using the inventive light-emitting semiconductor devices 11 as disclosed in the first embodiment, for example. Alternatively, the inventive light-emitting system may be configured by combining the white-light-emitting semiconductor device of the first embodiment with an LED which emits light such as blue, green, yellow or red light. The color of light emitted by the light-emitting semiconductor devices 11, the size and the number of the devices 11, and the shape of a light-emitting portion, for example, are not specifically limited. In addition, the lighting system may be of the laser-emitting semiconductor type that converges light from the light-emitting semiconductor devices to emit laser light. In this way, the lighting system is not only excellent in field of view as a lighting system but also capable of improving the intensity of light emitted therefrom.

In the first exemplary lighting system, the color temperature is preferably in the range from 2000 K to 12000 K, both inclusive, more preferably in the range from 3000 K to 10000 K, both inclusive, and still more preferably in the range from 3500 K to 8000 K, both inclusive. However, the lighting system as the inventive light-emitting system is not limited to these color temperature ranges.

FIG. 5 is a perspective view schematically showing a configuration of an image displaying system as a second exemplary light-emitting system according to the present invention.

As shown in FIG. 5, the second exemplary image displaying system includes a display unit in which a large number of inventive light-emitting semiconductor devices 11 as described in the first embodiment are arranged in matrix. The image displaying system may be freely fabricated in total size and preferably has a width between 1 cm and 10 m, both inclusive, a height between 1 cm and 10 m, both inclusive, and a depth between 5 mm and 5 m, both inclusive. The number of the light-emitting semiconductor devices 11 may be selected according to the size of the image displaying system.

As is the first exemplary lighting system, the image displaying system as an example of the light-emitting system is preferably configured using the light-emitting semiconductor devices 11 described in the first embodiment. Instead of the inventive light-emitting semiconductor devices, a device utilizing an LED which emits light such as blue, green, yellow or red light and a luminescent layer in combination may be used, for example. The color of light emitted by the light-emitting semiconductor devices 11, the size and the number of the devices 11, the shape of a light-emitting portion thereof, and the arrangement of the light-emitting semiconductor devices 11 are not specifically limited. In addition, external shape thereof is not specifically limited.

FIG. 6 is a perspective view schematically showing a configuration of a pattern displaying system as a third exemplary light-emitting system according to the present invention.

As shown in FIG. 6, the third exemplary pattern displaying system includes a display unit in which the inventive light-emitting semiconductor devices 11 as described in the first embodiment are arranged such that arbitrary numerals of 0 to 9 can be displayed according to emission or non-emission of each pixel.

The pattern displayed by the pattern displaying system is not limited to the numeral shown in FIG. 6 and may be any pattern representing kanji characters, katakana characters, alphabet characters and Greek characters. Even if the pattern displaying system displays numerals, the size and the number of the light-emitting semiconductor devices 11 and the configuration of pixels are not specifically limited to the configuration shown in FIG. 6.

As is the first exemplary lighting system, the pattern displaying system as an example of the light-emitting system is preferably configured using the light-emitting semiconductor devices 11 described in the first embodiment. Instead of the inventive light-emitting semiconductor devices, a device utilizing an LED which emits light such as blue, green, yellow or red light and a luminescent layer in combination may be used. The color of light emitted by the light-emitting semiconductor devices 11, the size and the number of the devices 11, the shape of a light-emitting portion thereof, and the arrangement of the light-emitting semiconductor devices 11 are not specifically limited. In addition, the external shape thereof is not specifically limited.

The light-emitting systems as shown in FIGS. 4 through 6 has an advantage that the configuration with a plurality of light-emitting semiconductor devices 11 using LED chips of only one type allows the light-emitting semiconductor devices to operate at the same driving voltage with the same injected current. In this case, the light-emitting system has an advantage that the characteristics of the respective light-emitting devices also change substantially in the same manner due to exogenous factors such as ambient temperature, so that the luminous intensity or color tone of the light-emitting devices less varies with variation in voltage or temperature. The systems also have an advantage that the circuit configuration thereof can be made simple.

If light-emitting semiconductor devices having substantially flat pixel surfaces are used for configuration of a light-emitting system, it is possible to obtain a light-emitting system whose entire light-emitting surface is substantially flat, e.g., a displaying system having a flat display surface or a surface-emitting lighting system, thus providing an image displaying system exhibiting excellent image quality or a well-designed lighting system.

In the case where the inventive light-emitting system is a lighting system or a displaying system, for example, the use of a light-emitting semiconductor device having a structure as described in the first embodiment suppresses color unevenness in the light-emitting system. The light-emitting semiconductor device of the first embodiment exhibits small color unevenness, resulting in a high production yield and a low production cost. That is to say, if the light-emitting system is configured using the light-emitting semiconductor device of the first embodiment, color unevenness as the light-emitting system is reduced and, in addition, the light-emitting system is fabricated at a low cost. Moreover, since the light-emitting semiconductor device of the first embodiment exhibits a luminous flux higher than that of a known light-emitting semiconductor device using a YAG-based phosphor, the luminous flux of the entire light-emitting system improves.

In this description, various kinds of display systems using light-emitting semiconductor devices (e.g., LED information display terminals, LED traffic lights, LED stoplights of vehicles, and LED directional lights) and various kinds of lighting systems (e.g., LED interior/exterior lights, courtesy LED lights, LED emergency lights, and LED surface emitting sources) are broadly defined as light-emitting systems.

—Embodiment Relating to Method for Fabricating Light-Emitting Semiconductor Device—

(Method for Fabricating Silicate Phosphor)

A method for fabricating a silicate phosphor for use in the inventive light-emitting semiconductor device is not limited to a fabrication method that will be described below. The silicate phosphor is fabricated by, for example, the following method.

The silicate phosphor can be obtained through the following processes, for example, a first process: weighing and blending of phosphor materials
a second process: mixing of the phosphor materials
a third process: firing of the mixed phosphor materials
a fourth process: subsequent process of the fired material
(including pulverizing, classification, cleaning and drying).

Hereinafter, the respective processes will be described in further detail.

(First Process: Weighing and Blending of Phosphor Materials)

First, phosphor materials are weighed and blended. As the phosphor materials, various kinds of powders such as alkaline-earth metal compounds, silicon compounds and europium compounds may be used. Examples of the alkaline-earth metal compounds include alkaline-earth metal carbonates (strontium carbonate, barium carbonate and calcium carbonate), nitrates (strontium nitrate, barium nitrate and calcium nitrate), hydroxides (strontium hydroxide, barium hydroxide and calcium hydroxide), oxides (strontium oxide, barium oxide and calcium oxide), nitrates (strontium nitrate, barium nitrate and calcium nitrate), oxalates (strontium oxalate, barium oxalate and calcium oxalate). Halides (e.g., strontium chloride, barium chloride, calcium chloride, strontium fluoride, barium fluoride, calcium fluoride, strontium bromide, barium bromide and calcium bromide) may also be used. Examples of the silicon compounds include oxide such as silicon dioxide and silicon oxide. However, nonoxide such as silicon nitride may also be used under some conditions. To enhance the reactivity between the phosphor materials, silicon dioxide of an ultra-fine power such as an ultra-fine-powdery silica known by the name of "Aerosil" produced by Degussa Co., Ltd. (Germany) is preferably used. Examples of the europium compounds include europium oxide, europium fluoride and europium chloride. As a germanium material for the Ge-containing phosphor mentioned above, germanium compound such as germanium oxide may be used.

In the first process, these alkaline-earth metal compound, silicon compound and europium compound are weighed and blended such that the phosphor has a desired composition of elements such as alkaline-earth metal, silicon and europium.

To enhance the reactivity between the phosphor materials, a phosphor material or a temporary or primary fired phosphor material mixed with a flux may be used. As the flux, various kinds of halides and boron compounds may be used. Examples of the halides include strontium fluoride, barium fluoride, calcium fluoride, europium fluoride, ammonium fluoride, lithium fluoride, sodium fluoride, potassium fluoride, strontium chloride, barium chloride, calcium chloride, europium chloride, ammonium chloride, lithium chloride, sodium chloride and potassium chloride. Examples of the boron compounds include boric acid, boric oxide, strontium borate, barium borate and calcium borate. In the compound used as the flux, the number of moles is between 0.0001 and 1, both inclusive, and normally between 0.001 and 0.3, both inclusive, with respect to one mole of the phosphor.

(Second Process: Mixing of Phosphor Materials)

Next, the phosphor materials that have been weighed and blended to have specified mole fractions or weight percentages in the first process are mixed, thereby obtaining a phosphor material mixture. Various techniques may be used to mix the phosphor materials. Examples of mixing include mixing using a mortar, mixing using a ball mill, mixing using a V-shaped mixer, mixing using a cross rotary mixer, mixing using a jet mill and mixing using an agitator, all of which are well-known techniques. Dry mixing for mixing only the phosphor materials without using any solvent or wet mixing for adding the phosphor materials to a solvent such as water or an organic solvent so that the phosphor materials are spread and mixed in the solvent may be used as a method for the mixing. Ethanol or methanol may be used as the organic solvent. In the case of the dry mixing, the suspension made of the phosphor materials and the solvent is generally filtered using, for example, a Buchner filter, to obtain a phosphor material mixture, and then the filtered phosphor material mixture is dried at a temperature of about 60 to 200° C. for several to dozens of hours with, for example, a dryer, thereby obtaining a phosphor material mixture.

(Third Process: Firing of Phosphor Material Mixture)

Then, the phosphor material mixture is fired by the following procedure. A heater such as an electric furnace or a gas furnace is used for the firing. The heater is not specifically limited in type and may be of any type so long as the phosphor material mixture can be fired at a desired temperature in a desired atmosphere for a desired period of time. Examples of the electric furnaces as the heater include a tubular atmospheric furnace, a box-type controlled atmospheric furnace, a conveyor belt furnace, a roller-hearth furnace and a tray pusher continuous furnace. In general, the phosphor material mixture is put in a firing vessel such as a crucible or a boat with a lid put on the firing vessel in some cases, and then the phosphor material mixture is heated together with the firing vessel. Alternatively, only the phosphor material mixture may be fired. The firing vessel may be made of platinum, quartz, alumina, zirconia, magnesia, silicon carbide, silicon nitride, ceramic or carbon, or the firing vessel may be made by mixing these materials if necessary.

The silicate phosphor can be fabricated so long as the firing temperature is in the range from 800° C. to 1600° C., both inclusive. If the firing temperature is higher than the temperature range, phosphor particles are fired or dissolved, so that it is difficult to obtain a powdery silicate phosphor. On the other hand, if the firing temperature is lower than the temperature range, it is difficult to obtain intensive emission of light from the phosphor. To obtain a powdery silicate phosphor exhibiting a higher luminous efficacy, the firing temperature is preferably in the range from 1000° C. to 1500° C., both inclusive, more preferably in the range from 1100° C. to 1450° C., both inclusive, and still more preferably in the range from 1200° C. to 1400° C., both inclusive.

It is sufficient for the firing time to be in the range from 10 minutes to 1000 hours, both inclusive. However, to increase the efficiency in fabrication or to enhance the quality of the phosphor, for example, the firing time is preferably in the range from 30 minutes to 500 hours, both inclusive, and more preferably in the range from 1 hour to 100 hours, both inclusive. It is not specifically limited how many times the firing process is performed. However, to enhance the efficiency in fabricating the phosphor, the firing process is preferably performed less frequently and is most preferably performed only once.

The firing atmosphere may be freely selected from among air, a low-pressure atmosphere, a vacuum atmosphere, an inert-gas atmosphere, a nitrogen atmosphere, an oxygen atmosphere, an oxidizing atmosphere and a reducing atmosphere. However, since $Eu^{2+}$ ions need to be formed as a luminescent center in the phosphor, it is necessary to perform firing in an atmosphere in which at least $Eu^{2+}$ ions can be formed in the phosphor at the final stage or near final stages of firing. As this atmosphere, a reducing atmosphere using a mixed gas of nitrogen and hydrogen or using carbon monoxide, especially an ambient using a mixed gas of nitrogen and hydrogen, is preferably used for the purposes of simplifying the apparatus, reducing the cost thereof, and easily handling gases or materials for the atmosphere. In the case of the atmosphere using a mixed gas of nitrogen and hydrogen, the hydrogen concentration is preferably in the range from 0.1% to 10%, both inclusive, and more preferably in the range from 1% to 5%, both inclusive, in terms of securing minimum reduction power and safety of gas. To enhance the reactivity between the mixed phosphor materials, it is preferable that the materials are temporary fired in the air, for example, at a temperature between 400° C. and 1400° C. in advance.

(Fourth Process: Subsequent Process of the Fired Substance)

Lastly, the fired substance (phosphor) obtained by the firing process is subjected to a subsequent process, thereby obtaining a silicate phosphor. The subsequent process mainly includes a pulverizing step (which means a step of reducing the substance into a powder), a classifying step, a cleaning step and a drying step.

In the pulverizing step, the as-fired phosphor obtained by the firing (agglomeration of particles) is reduced into particles. To pulverize the fired substance, various techniques may be used. Examples of these techniques include pulverizing with a mortar, pulverizing with a ball mill, pulverizing utilizing a V-shaped mixer, pulverizing utilizing a cross rotary mixer, pulverizing with a jet mill and pulverizing with a crusher, a motor grinder, a vibrating cup mill, a disk mill, a rotor speed mill, a cutting mill and a hammer mill. As a method for pulverizing, dry pulverizing for pulverizing the fired substance without using any solvent or wet pulverizing for adding the fired substance to a solvent such as water or an organic solvent to pulverize the fired substance within the solvent may be used. As the organic solvent, ethanol or methanol may be used.

In the classifying step, the aggregation of phosphor particles obtained through the pulverizing is changed into an aggregation of particles having a given particle-size distribution. As the classification, various techniques may be used. Examples of these techniques include classification with a screen and classification utilizing sedimentation of phosphor particles in a solvent such as water or alcohol. In the classification with a screen, the use of a screen of about 50 to 1000 mesh can achieve a silicate phosphor having a particle size within the range (described in the first embodiment) suitable to application to a light-emitting semiconductor device. As a method for classification, dry classification using neither solvent nor wet classification for adding the pulverized substance to a solvent such as water or an organic solvent to classify the pulverized substance together with the solvent may be used. Two or more of these classifying techniques are used in some cases for the purpose of obtaining a sharp particle distribution.

In the cleaning step, a residual flux component contained in the fired substance after the firing and fine particles mixed in the product during the pulverizing or classification step are mainly removed. Various techniques may also be used as the cleaning step. Examples of these techniques include cleaning with acid, cleaning with alkali, cleaning with water such as distilled water or pure water, and cleaning with an organic solvent such as ethanol or methanol. The phosphor particles after the pulverizing or classification are cleaned by using a solvent appropriately selected according to the type or composition of the phosphor materials. The wet pulverizing step or the wet classifying step may be used such that the step also serves as the cleaning step. The cleaning step may be omitted depending on the type of the phosphor to be produced.

In the drying step, the aggregation of phosphor particles obtained through the pulverizing, classifying and cleaning steps is heated and a large or small amount of a solvent such as water or an organic solvent contained in the aggregation is evaporated and dried, thereby obtaining an aggregation of phosphor particles which is a final product or close to a final product. Various kinds of techniques may be used as the drying step. Examples of these techniques include drying with a thermostatic dryer or a vacuum dryer. If the thermostatic dryer is used, drying is performed at about 60 to 300° C. for about 30 minutes to 100 hours. The drying step as well as the cleaning step may be omitted for some types of a phosphor to be produced.

The pulverizing, classifying, cleaning and drying steps may be flexibly combined in any sequence and the number of times for performing each of the steps may also be determined flexibly according to the type and purpose of the phosphor.

—Concrete Example of Method for Producing Silicate Phosphor—

Hereinafter, a concrete example of a method for producing a silicate phosphor and effects of a flux will be described with reference to experimental data.

Figure 11:
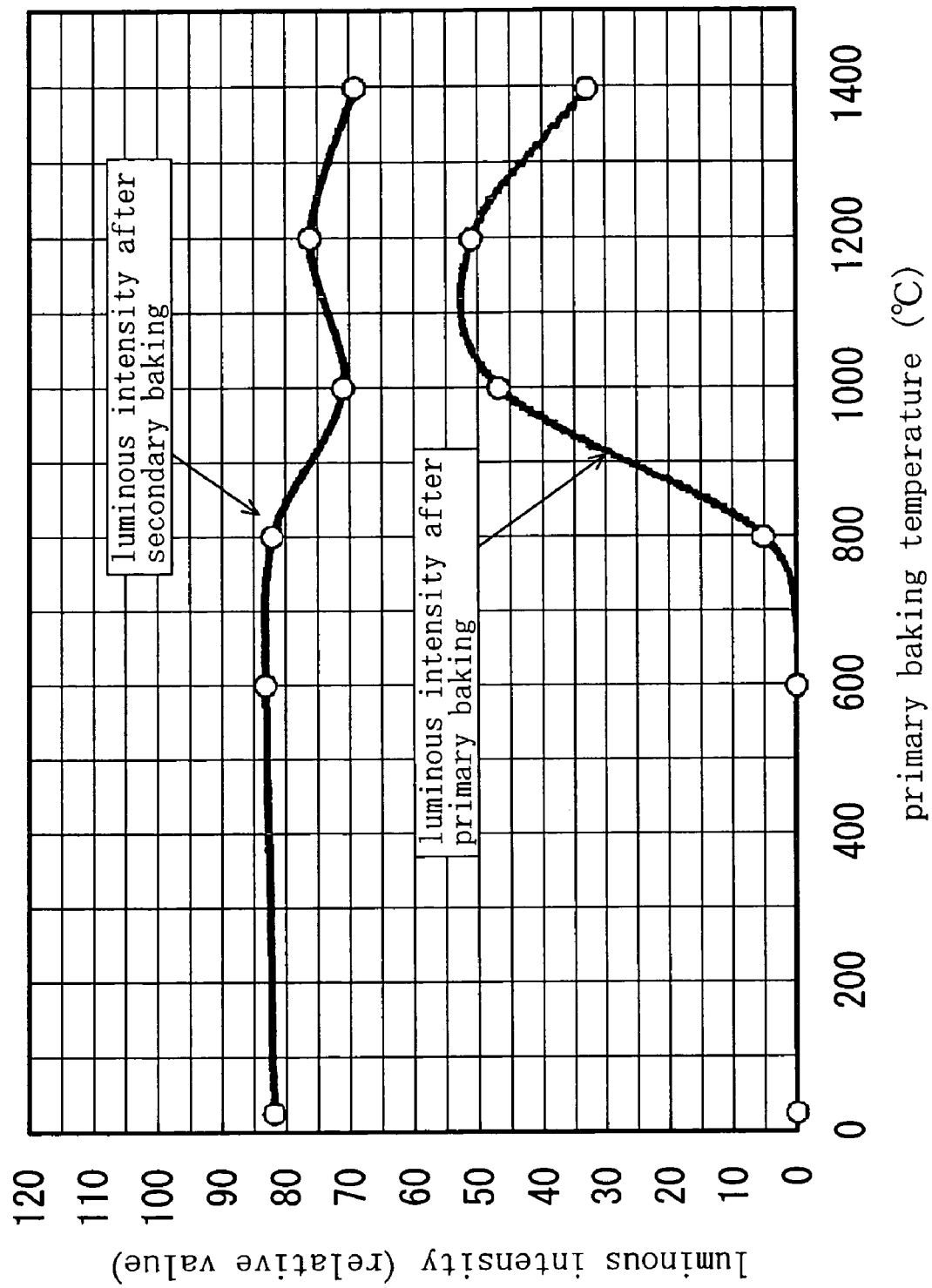
FIG. 11 is a graph showing a luminous intensity (main emission peak intensity) of a silicate phosphor after primary firing and a luminous intensity (main emission peak intensity) of a silicate phosphor after secondary firing, as functions of a primary firing temperature.

FIG. 11 is a graph showing a luminous intensity (main emission peak intensity) of a silicate phosphor after primary firing and a luminous intensity (main emission peak intensity) of a silicate phosphor after secondary firing, as functions of a primary firing temperature. The luminous intensity after the primary firing shown in FIG. 11 is data on a primary fired substance obtained by firing phosphor materials, which have been blended to have the phosphor composition of $(Sr_{0.93}Ba_{0.05}Eu_{0.02})_2SiO_4$, at a temperature between room temperature and 1400° C. for two hours in a reducing ambient (containing a mixed gas of nitrogen and hydrogen) (primary firing). The luminous intensity after the secondary firing shown in FIG. 11 is data on a secondary fired substance obtained by weighing barium chloride ($BaCl_2$) and adding the $BaCl_2$ as a flux to the primary fired substance such that the ratio of the $(Sr_{0.93}Ba_{0.05}Eu_{0.02})_2SiO_4$ silicate phosphor to the $BaCl_2$ is 1 mol.:0.1 mol., mixing these substances fully, and then firing the mixture at 1400° C. for two hours in a reducing ambient (secondary firing). The luminous intensity of the primary fired substance is shown in FIG. 11 for reference. In this manner, the silicate phosphor can be produced through the procedure of the primary firing (which may be omitted), the addition and mixing of the flux and the secondary firing.

From the X-ray diffraction pattern of the primary fired substance, it is confirmed that a $(Sr_{0.93}Ba_{0.05}Eu_{0.02})_2SiO_4$ silicate phosphor having an orthorhombic structure is present in the primary fired substance fired at a primary firing temperature of 800° C. or more. It is also confirmed that each of the primary fired substances obtained by being fired at primary firing temperatures of 1000° C., 1200° C. and 1400° C., respectively, has an orthorhombic crystal structure, i.e., has substantially one kind of crystal structure.

From the X-ray diffraction pattern of the secondary fired substance, it is confirmed that every secondary fired substrate is a $(Sr_{0.93}Ba_{0.05}Eu_{0.02})_2SiO_4$ silicate phosphor having an orthorhombic structure, irrespective of the primary firing temperature. Specifically, FIG. 11 shows that the silicate phosphor can be obtained through the primary firing at 800 to 1400° C. without using a flux, and that if an additional firing (secondary firing) is performed with a flux added and mixed into the primary fired substance fired at room temperature (i.e., without primary firing) to 1400° C., a silicate phosphor having a higher luminous intensity (which is about 1.4 to 1.6 times of a silicate phosphor obtained with no flux) can be obtained.

—First Concrete Example of Method for Fabricating Light-Emitting Semiconductor Device—

Now, a concrete example of a method for fabricating a light-emitting semiconductor device according to the present invention is described with reference to the drawings. As a first concrete example, a method for fabricating a white-light-emitting semiconductor device using a transfer technique and fabrication apparatus therefor are described. FIGS. 12(a) through 12(d) are cross-sectional views showing respective process steps for fabricating a light-emitting semiconductor device of the first concrete example.

Figure 12A:
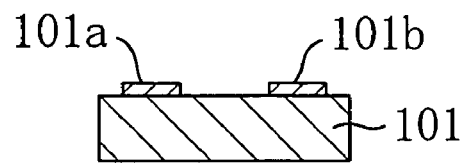
FIGS. 12(a) through 12(d) are cross-sectional views showing respective process steps for fabricating a light-emitting semiconductor device of a first concrete example.

First, a blue-light-emitting semiconductor chip 101 as a blue LED shown in FIG. 12(a) is prepared. The blue-light-emitting semiconductor chip 101 is, for example, a blue LED using an element such as GaN and exhibiting an emission spectrum having a peak in the wavelength range from 450 nm to 560 nm. The blue-light-emitting semiconductor chip 101 includes an anode 101a and a cathode 101b on the principal surface thereof.

Figure 12B:
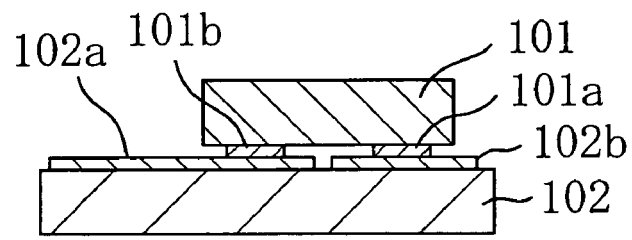

In a process step shown in FIG. 12(b), the blue-light-emitting semiconductor chip 101 is mounted and fixed on a Zener diode 102 by a flip-chip bonding process. In this case, the blue-light-emitting semiconductor chip 101 and the Zener diode 102 are electrically connected to each other. Specifically, the anode 101a of the blue-light-emitting semiconductor chip 101 and a cathode 102b of the Zener diode are electrically connected to each other, and the cathode 101b of the blue-light-emitting semiconductor chip 101 and an anode 102a of the Zener diode 102 are electrically connected to each other.

Figure 12C:
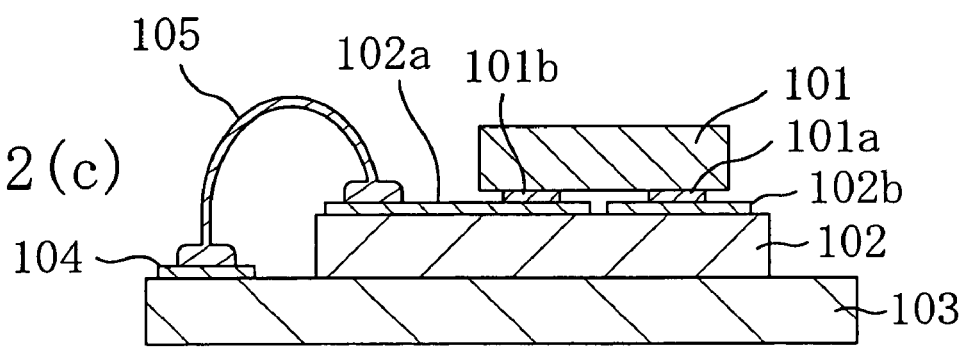

Next, in a process step shown in FIG. 12(c), the Zener diode 102 onto which the blue-light-emitting semiconductor chip 101 is fixed is mounted and fixed on a substrate 103. In this case, the Zener diode 102 is fixed on the substrate 103 using an adhesive material such as a silver paste. As the adhesive material, other adhesive materials such as solder may be used.

Thereafter, the anode 102*a* of the Zener diode 102 is connected to an electrode terminal 104 provided on the substrate 103. In this embodiment, to establish this connection, the anode 102*a* is connected to the electrode terminal 104 using a gold wire 105. In this manner, the cathode 101*b* of the blue-light-emitting semiconductor chip 101 is electrically connected to the electrode terminal 104 of the substrate 103. The cathode 102*b* of the Zener diode 102 may be connected to the electrode terminal 104 provided on the substrate 103, or the anode 102*a* and cathode 102*b* of the Zener diode 102 may be connected to respective electrode terminals 104 provided on the substrate 103.

Then, in a process step shown in FIG. 12(*d*), a resin including phosphor particles is formed such that light emitted by the blue-light-emitting semiconductor chip 101 (blue LED) passes through the resin. Specifically, the substrate 103 is placed in a mold 107 and a molding resin is poured into the mold 107. In general, molding apparatus having a large number of such molds 107 is used to form a large number of white-light-emitting semiconductor devices at a time. In this case, an epoxy resin 106 in which phosphor particles 108 are dispersed is used as the molding resin. After that, the white-light-emitting semiconductor devices are taken off from the molds 107. As the epoxy resin, an NTT8506 epoxy resin produced by Nitto Denko Co. is used. Subsequently, the epoxy resin is cured.

Figure 13A:
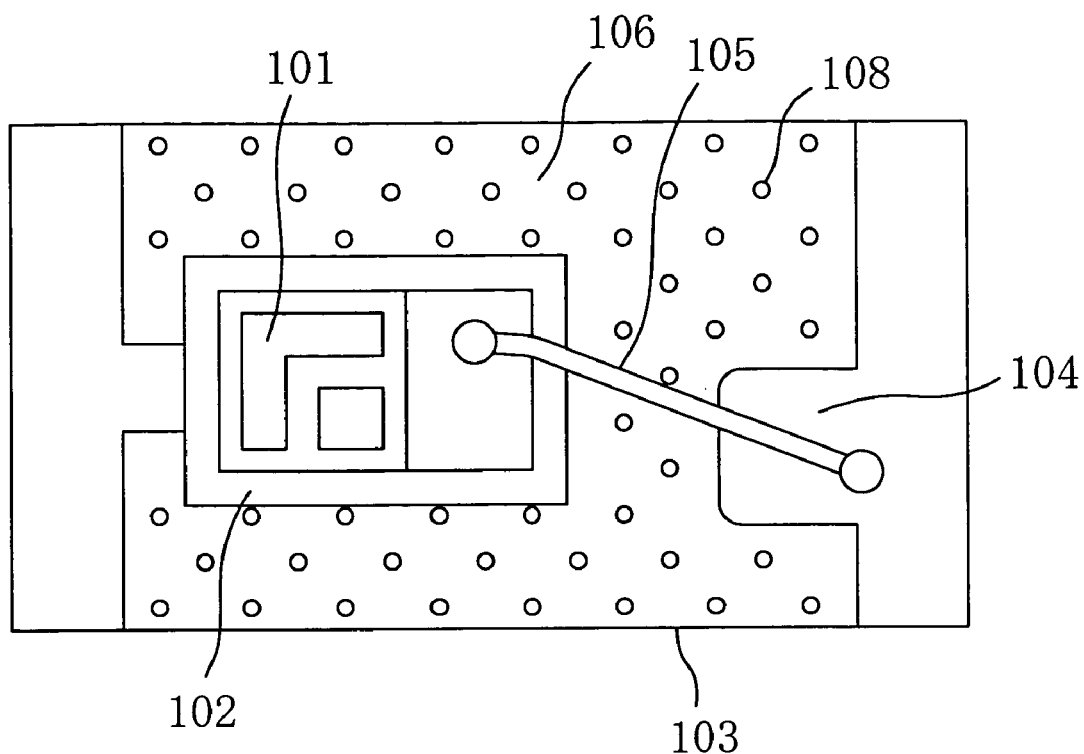
FIGS. 13(a) and 13(b) are respectively a top view and a cross-sectional view showing a light-emitting semiconductor device formed by a fabrication method of the first concrete example.
Figure 13B:
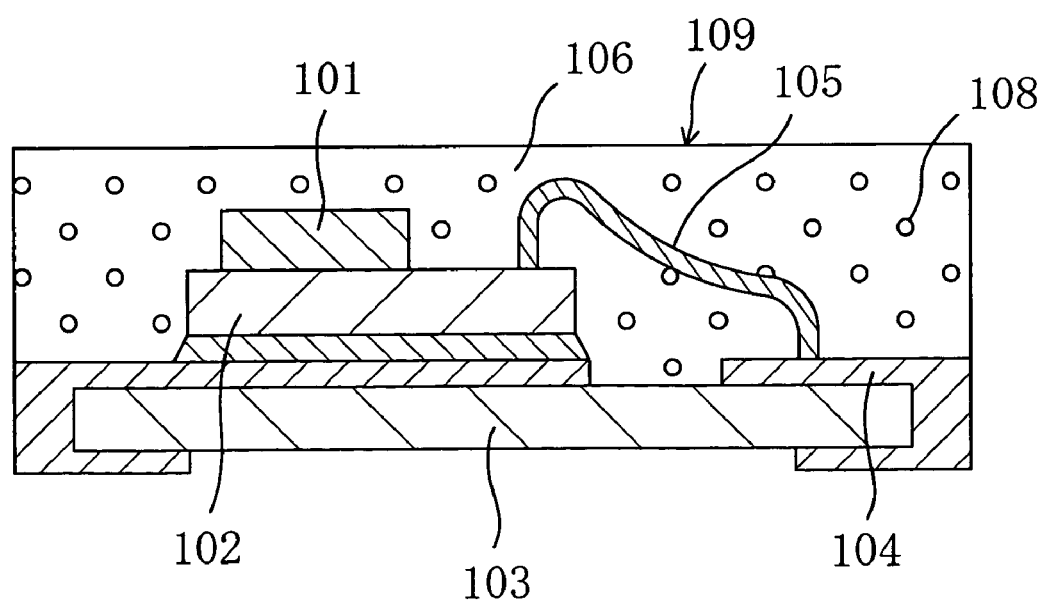

FIGS. 13(*a*) and 13(*b*) are respectively a top view and a cross-sectional view showing a light-emitting semiconductor device formed by a fabrication method of the first concrete example. In FIG. 13(*a*), the epoxy resin 106 and the phosphor particles 108 are treated as transparent substances. As shown in FIGS. 13(*a*) and 13(*b*), obtained is a light-emitting semiconductor device including: a blue-light-emitting semiconductor chip (blue LED 101) mounted on the substrate 103 via the Zener diode 102 and a luminescent layer 109 in which phosphor particles (yellow phosphor particles) 108 are relatively evenly dispersed throughout the epoxy resin 106.

In this way, the method for fabricating a white-light-emitting semiconductor device using the transfer technique includes: the process step of connecting the blue LED 101 as a blue-light-emitting device to the Zener diode 102 (substrate); and the process step of providing the phosphor particles 108 and the resin 106 such that the light emitted by the blue LED 101 passes therethrough.

Figure 49:
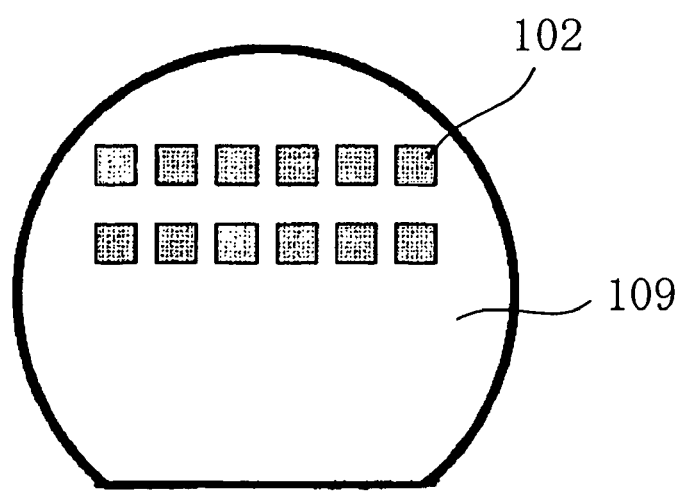
FIG. 49 is a plan view showing a state of a wafer with a plurality of Zener diodes in connecting blue LEDs to the respective Zener diodes.

More specifically, the method includes: the step of connecting, on a wafer 109 including a plurality of Zener diodes 102 as shown in FIG. 49, blue LEDs as blue-light-emitting devices to the respective Zener diodes; the step of providing a resin including a phosphor such that light emitted by the blue LEDs passes therethrough; and the process step of separating the Zener diodes.

Such a fabrication method allows the fabrication of a white-light-emitting semiconductor device including a blue LED, a Zener diode (a substrate) to which the blue LED is electrically connected and a luminescent layer in which phosphor particles are dispersed in a resin and which is provided such that the light emitted by the blue LED passes through the luminescent layer.

In addition, it is also possible to fabricate a white-light-emitting semiconductor device including no Zener diode and including a blue LED and a luminescent layer in which phosphor particles are dispersed in a resin and which is provided such that the light emitted by the blue LED passes through the luminescent layer.

Examples of materials constituting the blue LED of this concrete example include a gallium nitride-based compound semiconductor, a zinc selenide semiconductor and a zinc oxide semiconductor. As a phosphor material, the phosphor used in the first embodiment may be used and, in particular, a silicate phosphor is preferably selected.

—Second Concrete Example of Method for Fabricating Light-Emitting Semiconductor Device—

Figure 14A:
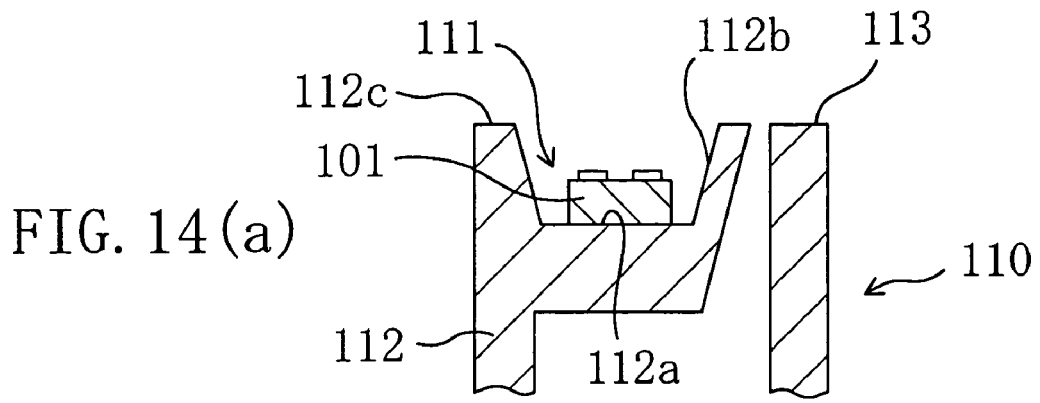
FIGS. 14(a) through 14(c) are cross-sectional views showing first-half stages of a process for fabricating a light-emitting semiconductor device of a second concrete example.
Figure 14B:
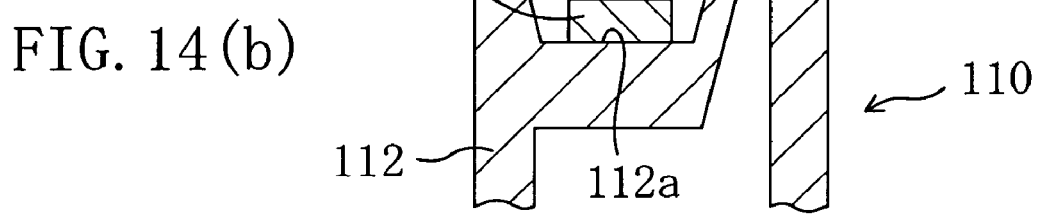

Now, a method for fabricating a bulletlike light-emitting semiconductor device and fabrication apparatus are described as a second concrete example with reference to the drawings. FIGS. 14(*a*) through 14(*c*) are cross-sectional views showing first-half stages of a process for fabricating the light-emitting semiconductor device of the second concrete example. FIGS. 15(*a*) and 15(*b*) are cross-sectional views showing the latter half of the process for fabricating the light-emitting semiconductor device of the second concrete example.

First, in a process step shown in FIG. 14(*a*), the blue LED 101 is mounted and fixed on a frame 110 (a lead frame). The frame 110 includes: a recess 111 for placing the blue-light-emitting semiconductor device 101 therein; a terminal 112 continuous to the recess 111; and a terminal not continuous to the recess 111. These terminals 112 and 113 are connected to each other by the same metal as these terminals at the opposite side of the recess 111 so as to prevent the terminals from going away from each other in the actual device, but the connection between the terminals will be cut off in a subsequent process step. The terminal 112 may not be connected to the recess 111. In this case, as shown in FIG. 14(*a*), the blue LED 101 is placed on the bottom of the recess 111 and is fixed to the terminal 112 using an adhesive material such as a silver paste. Alternatively, other adhesive materials such as solder may be used as the adhesive material.

Thereafter, in a process step shown in FIG. 14(*b*), an anode and a cathode of the blue LED 101 are electrically connected to a terminal 112*c* and the terminal 113, respectively, via gold wires 114.

Then, in a process step shown in FIG. 14(*c*), a mixture of phosphor particles 116 and a resin 115 is poured into the recess 111 of the frame 110. In this case, an epoxy resin is used as the resin 115 and the phosphor particles 116 are dispersed in the epoxy resin. The epoxy resin is cured under conditions that the heating temperature is 115° C. and the heating time is 12 hours, or that the heating temperature is 120° C. and the heating time is five hours. In this manner, a luminescent layer 119 in which the phosphor particles 116 are dispersed in the resin 115 is formed. In this second concrete example, an epoxy resin produced by Fine Polymers Co. is used as the epoxy resin. If a resin material which does not need heat for curing such as an epoxy resin (YL6663 produced by Yuka Shell Co. Ltd.) which cures with ultraviolet radiation or a resin material which cures with an curing agent is used as the resin 115 to be poured into the recess 111, softening of the resin 115 that occurs during the heating is suppressed. Accordingly, it is possible to prevent the sedimentation of the phosphor particles 116 from being promoted due to the softening of the resin 115 before the resin 115 cures. Therefore, by using a resin material that does not need heat for curing, the phosphor particles 116 more evenly disperse in the resin 115.

Figure 15A:
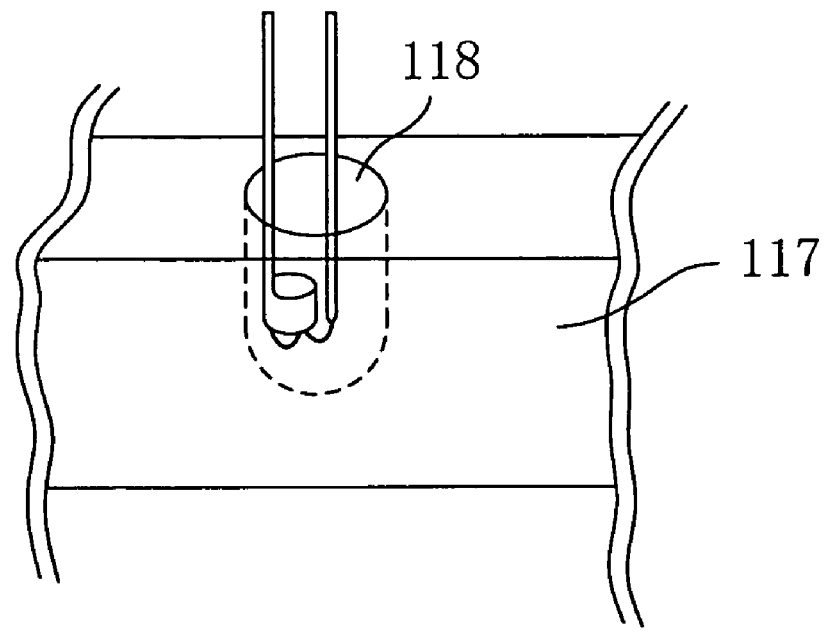
FIGS. 15(a) and 15(b) are cross-sectional views showing the latter half of the process for fabricating the light-emitting semiconductor device of the second concrete example.

Thereafter, in a process step shown in FIG. 15(a), the frame 110 is placed in a mold 117, while being turned over. Then, a resin 118 for molding is poured into the mold 117. In this case, an epoxy resin is used as the resin 118 for molding. As the resin 118 for molding, an epoxy resin which cures with heat is preferably used in terms of the reliability of a white-light-emitting semiconductor device. However, a resin which does not cure with heat may be used.

Figure 15B:
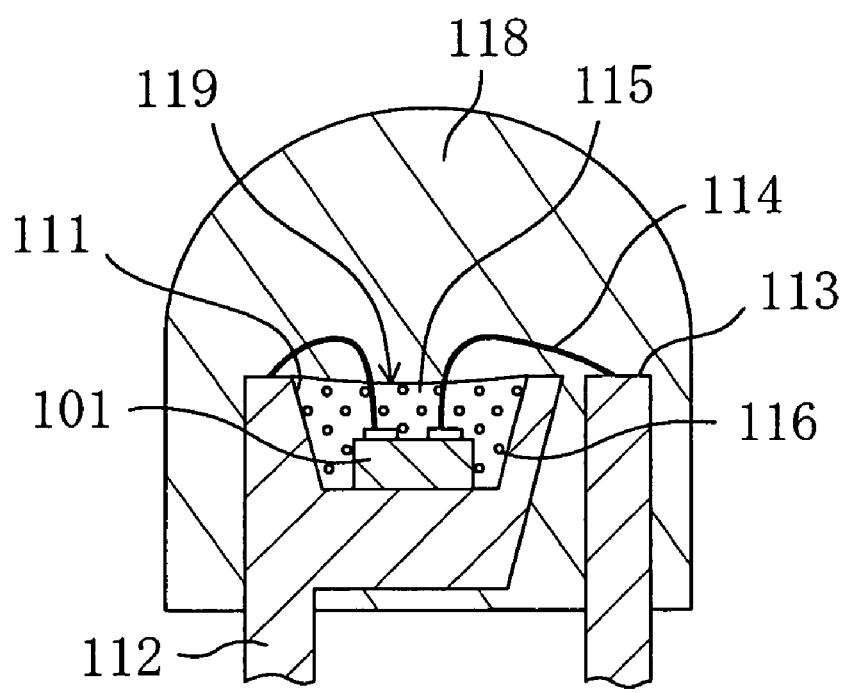

Subsequently, the resin is cured, thereby obtaining a bulletlike white-light-emitting semiconductor device as shown in FIG. 15(b). That is to say, a bulletlike light-emitting semiconductor device including the luminescent layer 119 in which the phosphor particles 116 are dispersed in the resin 115 and emitting white light with an excellent color tone as described in the first embodiment is obtained.

In this case, it is sufficient for the frame 110 on which the blue LED 101 is placed to have a recessed shape in cross-section. Thus, the frame 110 includes: a mounting portion 112a (the bottom face of the recess in this case) for mounting the blue LED; a side 112b surrounding the mounting portion 112a; and terminals 112c and 113 such that a luminescent layer can be formed in a space (the recess 111) made by the mounting portion 112a and the side 112b. The shape of the recess 111 may be any one of a bottomless cylinder, a bottomless polygonal prism, a bottomless cone, a bottomless pyramid, a topless or bottomless truncated cone and a topless or bottomless truncated pyramid.

Thus, the side 112b is configured to reflect light emitted by the blue LED 101 placed on the mounting portion 112a (the bottom), so that it is possible to improve the external light extraction efficiency of the entire light-emitting semiconductor device.

It is preferable that the resin 115 in which the phosphor particles 116 are dispersed is supplied to the recess 111 to a level lower than the height of the side thereof. That is to say, the luminescent layer 119 is preferably lower than the upper edge of the recess 111. This is common among the cases where the shapes of the recess 111 are a cylinder, a polygonal prism, a cone, a pyramid, a truncated cone and truncated pyramid, respectively. In this manner, in the case where a plurality of white-light-emitting semiconductor devices are provided and lights emitted by the respective white-light-emitting semiconductor devices are to be utilized, it is possible to solve the problem of crosstalk that occurs between adjacent ones of the white-light-emitting semiconductor devices when blue light emitted by one excites phosphor particles included in a resin in the other. In particular, a device which emits white light by utilizing blue light from the blue-light-emitting semiconductor device and yellow light from a phosphor excited by the blue light has a structure with which the blue light is also emitted to the outside, so that such a problem of crosstalk is serious. However, if the luminescent layer 119 is lower than the height of the side 112b of the recess 111, such a problem of crosstalk can be eliminated.

As described above, the method for fabricating the light-emitting semiconductor device of the second concrete example is a fabrication method (or fabrication apparatus) including: a step of (means for) mounting a blue LED 101 on a mounting portion 112a; and a step of (means for) forming a luminescent layer 119 made of a mixture of phosphor particles 116 and a resin 115 such that light emitted by the blue LED passes through the luminescent layer 119.

Still more specifically, the fabrication method (or fabrication apparatus) includes: a step of (or means for) providing the blue-light-emitting diode on the mounting portion; a step of (or means for) providing a first resin including a phosphor in such a situation that light emitted by the blue-light-emitting diode passes through the resin; and a step of (or means for) providing a second resin including no phosphor in such a situation that light emitted by the blue-light-emitting diode passes through the resin. In this case, a resin which does not cure with heat is preferably selected as the first resin, while a resin which cures with heat is preferably selected as the second resin.

As a material constituting the blue LED, a nitride gallium-based compound semiconductor, a zinc selenide semiconductor and a zinc oxide semiconductor may be used. As a phosphor material, the materials used in the first embodiment may be used and, in particular, a silicate phosphor is preferably selected.

In this concrete example, the epoxy resin is used as the resin 115. Alternatively, any other resins such as a silicone resin may be used.

The anode and cathode of the blue LED are electrically connected to the respective terminals via the gold wires. However, the wires may be made of any material so long as electric connections are established. For example, aluminum wires may used.

—Third Concrete Example of Method for Fabricating Light-Emitting Semiconductor Device—

Figure 16A:
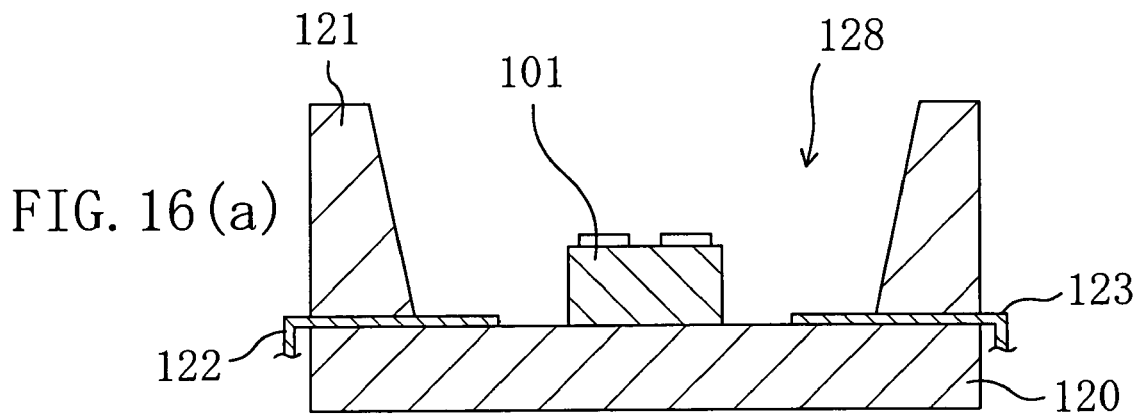
FIGS. 16(a) through 16(c) are cross-sectional views showing first-half stages of a process for fabricating a light-emitting semiconductor device of a third concrete example.
Figure 16B:
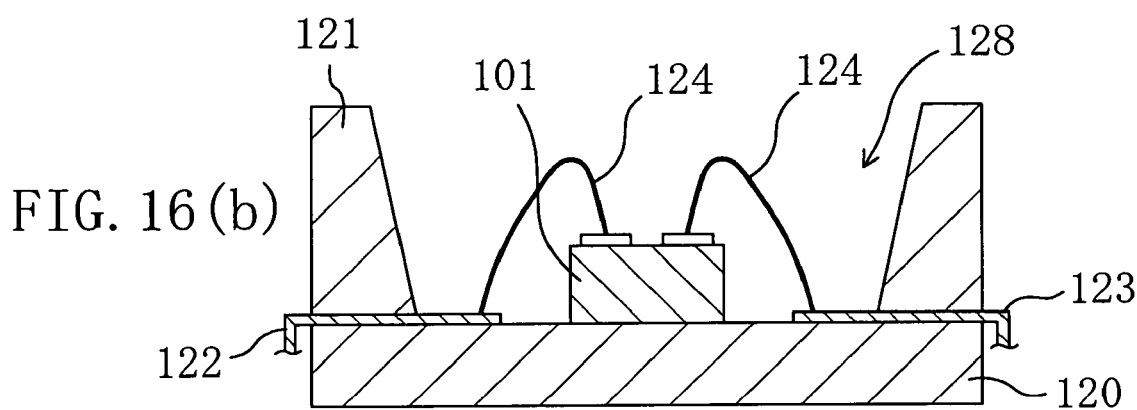
Figure 16C:
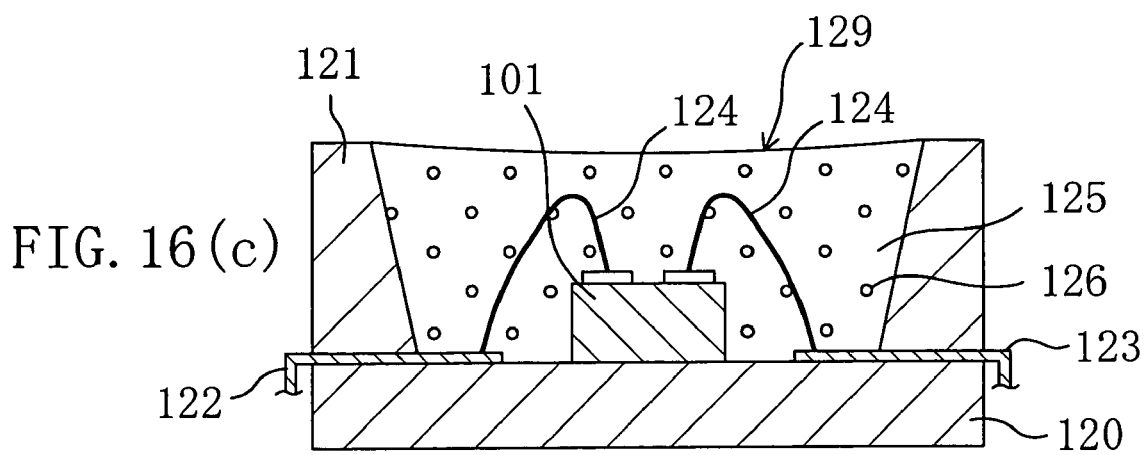

Now, a method for fabricating a side-view type white-light-emitting semiconductor device and fabrication apparatus are described as a third concrete example. FIGS. 16(a) through 16(c) are cross-sectional views showing first-half stages of a process for fabricating the light-emitting semiconductor device of the third concrete example.

First, in a process step shown in FIG. 16(a), the blue LED 101 is mounted and fixed in a casing 120. The casing 120 includes: a base 120 for placing the blue LED 101 thereon; a side 121; and externally connecting terminals 122 and 123 extending from on the bottom of a recess 128 to the outside through the side 121 of the casing 120. In this case, as shown in FIG. 16(a), the blue LED 101 is placed on the bottom of the recess 128 and fixed thereon using an adhesive material such as a silver paste.

Thereafter, in a process step shown in FIG. 16(b), an anode and a cathode of the blue LED 101 are electrically connected to the terminals 122 and 123 via gold wires 124.

Then, in a process step shown in FIG. 16(c), a mixture of a resin 125 and phosphor particles 126 is poured into the recess 128 of the casing 120. In this concrete example, an epoxy resin is used as the resin 125 and the phosphor particles 126 are dispersed in the epoxy resin. The epoxy resin is cured under conditions that the heating temperature is 115° C. and the heating time is 12 hours, or that the heating temperature is 120° C. and the heating time is five hours. In this manner, a luminescent layer 129 in which the phosphor particles 126 are dispersed in the resin 125 is formed. In this third concrete example, an epoxy resin produced by Fine Polymers Co. is used as the epoxy resin. If a resin material which does not need heat for curing such as an epoxy resin (YL6663 produced by Yuka Shell Co. Ltd.) which cures with ultraviolet radiation or a resin material which cures with an curing agent is used as the resin 125 to be poured into the recess 128, softening of the resin 125 that occurs during the heating is suppressed. Accordingly, it is possible to prevent the sedimentation of the phosphor particles 126 from being promoted due to the softening of the resin 125 before the resin 125 cures. Therefore, by using a resin material that does not need heat for curing, the phosphor particles 126 disperse more evenly in the resin 125.

Subsequently, the resin is cured, thereby obtaining a side-view type white-light-emitting semiconductor device as shown in FIG. 16(c). That is to say, a bulletlike light-emitting semiconductor device including the luminescent layer 129 in which the phosphor particles 126 disperse in the resin 125 and emitting white light with an excellent color tone as described in the first embodiment is obtained.

In this case, it is sufficient for the casing 120 on which the blue LED 101 is placed to have a recessed shape in cross-section. Thus, the casing 120 includes a base 120 for mounting the blue LED thereon, a side 121 surrounding the recess 128 on the base 120; and the externally connecting terminals 122 and 123 such that a luminescent layer can be formed in a space (the recess 128) made by the base 120 and the side 121. The shape of the recess 128 may be any one of a bottomless cylinder, a bottomless polygonal prism, a bottomless cone, a bottomless pyramid, a topless or bottomless truncated cone and a topless or bottomless truncated pyramid.

Thus, the side 121 is configured so as to serve as a reflecting plate for reflecting light emitted by the blue LED 101 placed on the base 120, so that it is possible to enhance the external light extraction efficiency of the entire light-emitting semiconductor device.

It is preferable that the resin 125 in which the phosphor particles 126 are dispersed is supplied to a level lower than the height of the side 121 (the side wall of the recess). That is to say, the luminescent layer 129 is preferably lower than the upper edge of the recess 128. This is common among the cases where the shapes of the recess 128 are a cylinder, a polygonal prism, a cone, a pyramid, a truncated cone and truncated pyramid, respectively. In this manner, in the case where a plurality of white-light-emitting semiconductor devices are provided and lights emitted by the respective light-emitting semiconductor devices are to be utilized, it is possible to solve the problem of crosstalk that occurs between one of the white-light-emitting semiconductor devices and an adjacent one of the white-light-emitting semiconductor devices when blue light emitted by the one excites phosphor particles included in a resin in the other. In particular, a device which emits white light by utilizing blue light from the blue-light-emitting semiconductor device and yellow light from a phosphor excited by the blue light has a structure with which the blue light is also emitted to the outside, so that such a problem of crosstalk is serious. However, if the luminescent layer 129 is lower than the height of the side 121, such a problem of crosstalk can be eliminated.

As described above, the method for fabricating the light-emitting semiconductor device of the third concrete example is a fabrication method including: a step of mounting a blue LED 101 (blue-light-emitting device) on a base 120; and a step of forming a luminescent layer 129 made of a mixture of phosphor particles 126 and a resin 125 such that light emitted by the blue LED passes through the luminescent layer.

More specifically, the fabrication method includes: a step of mounting the blue-light-emitting device on the base; a step of providing the luminescent layer such that light emitted by the blue-light-emitting device passes through the luminescent layer; and a step of providing a permeable resin including no phosphor such that the light emitted by the blue-light-emitting diode passes through the resin. In this case, a resin which does not cure with heat is preferably selected as the resin constituting the luminescent layer and a resin which cures with heat is preferably selected as the resin including no phosphor.

As a material constituting the blue LED, a nitride gallium-based compound semiconductor, a zinc selenide semiconductor and a zinc oxide semiconductor may be used. As a phosphor material, the materials used in the first embodiment may be used and, in particular, a silicate phosphor is preferably selected.

In this concrete example, the epoxy resin is used as the resin 125. Alternatively, any other resins such as a silicone resin may be used.

The anode and cathode of the blue LED are electrically connected to the respective terminals via gold wires. However, the wires may be made of any material so long as electric connections are established. For example, aluminum wires may be used.

In the processes for fabricating the light-emitting semiconductor devices according to the respective concrete examples, the phosphor particles are preferably dispersed as evenly as possible in the resin. In view of this, concrete examples for dispersing the phosphor particles evenly throughout the resin in the processes for fabricating a light-emitting semiconductor device will be described below.

—First Concrete Example for Dispersing Phosphor Particles Evenly—

Figure 17A:
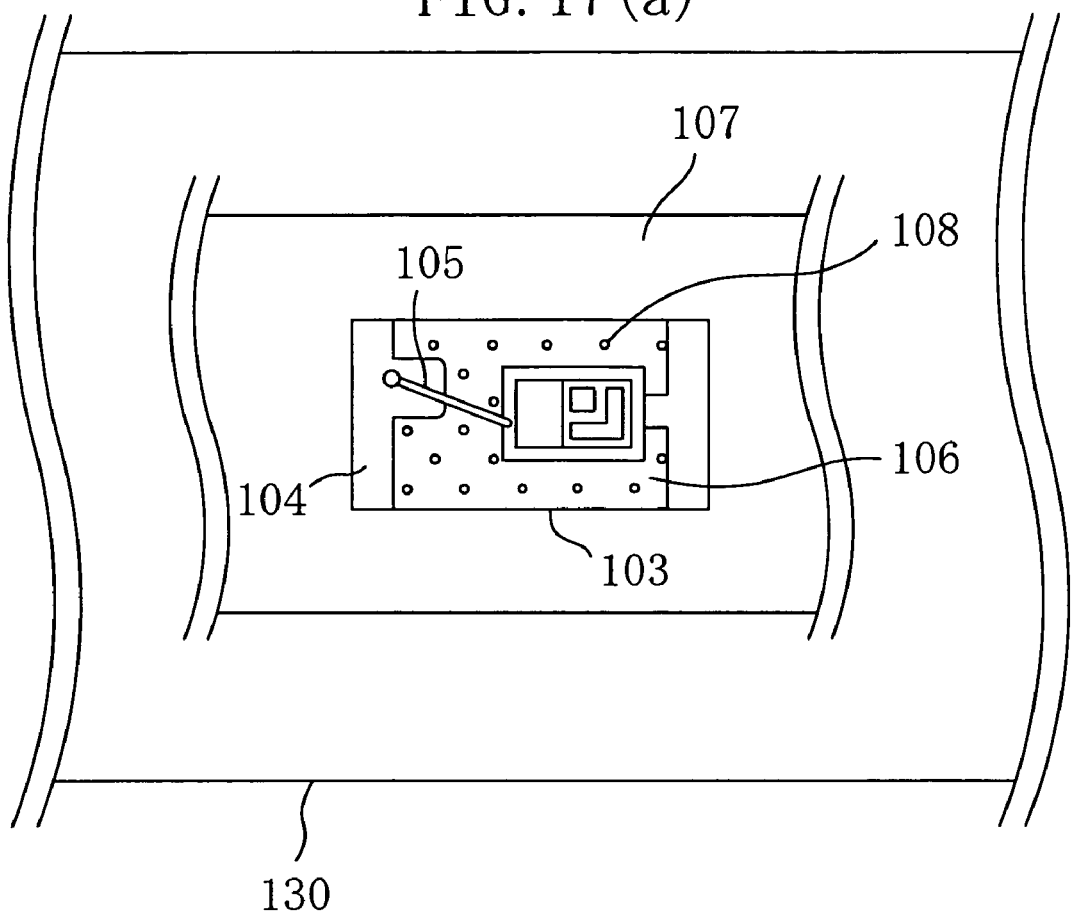
FIGS. 17(a) and 17(b) are plan views respectively showing two methods for applying ultrasonic vibration in a first concrete example of a method for fabricating a light-emitting semiconductor device.
Figure 17B:
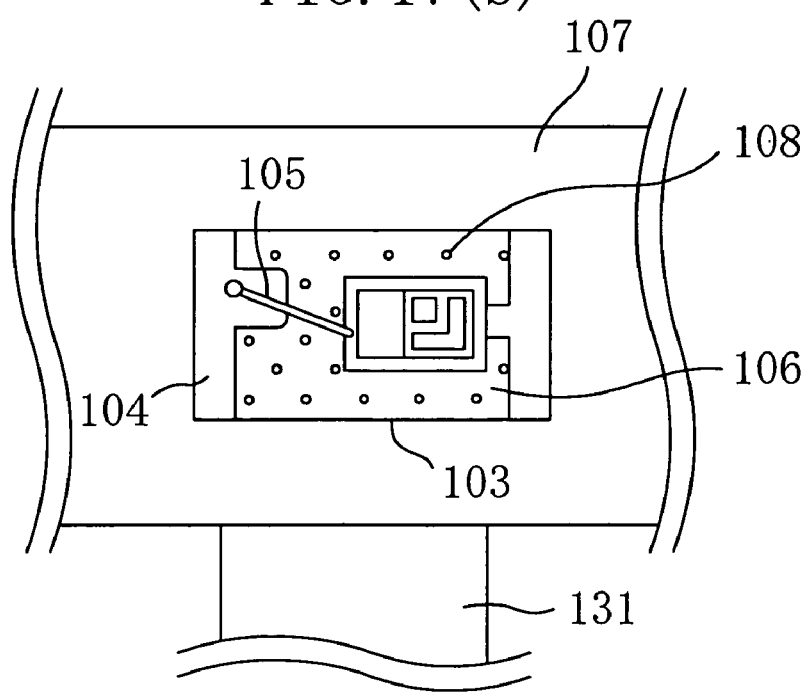
Figure 21A:
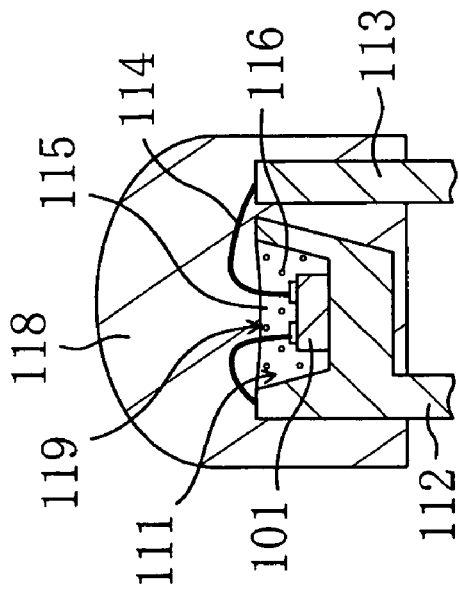
FIGS. 21(a) through 21(d) are cross-sectional views for use in comparison between a known white-light-emitting device in which phosphor particles sediment and a white-light-emitting device in which phosphor particles are evenly dispersed in a resin.
Figure 21B:
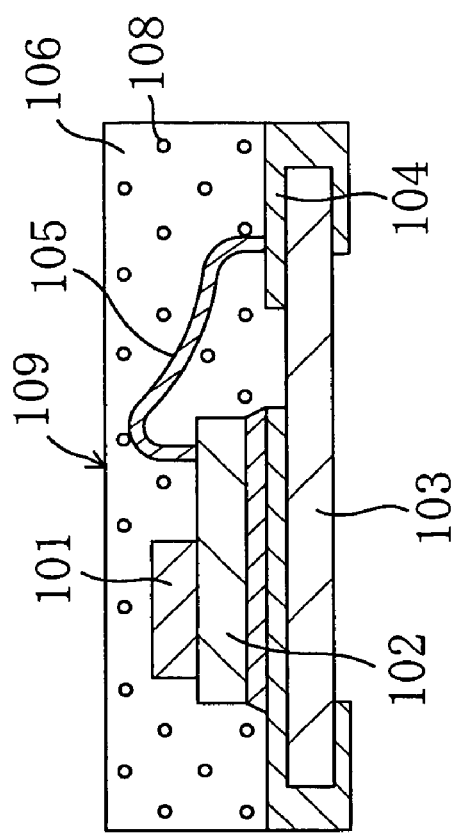
Figure 21C:
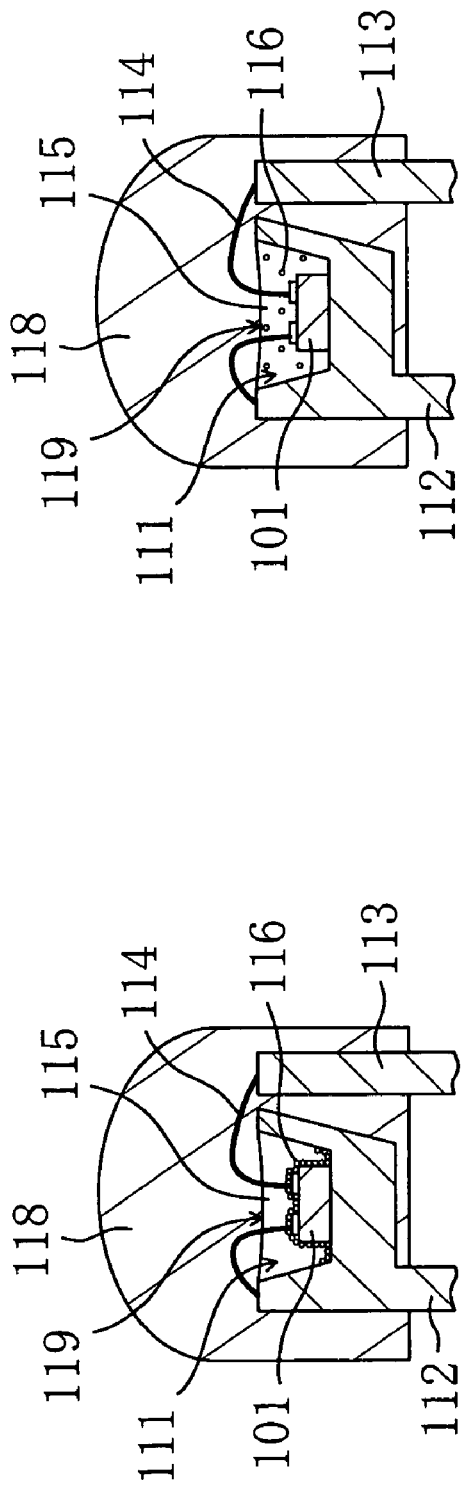
Figure 21D:
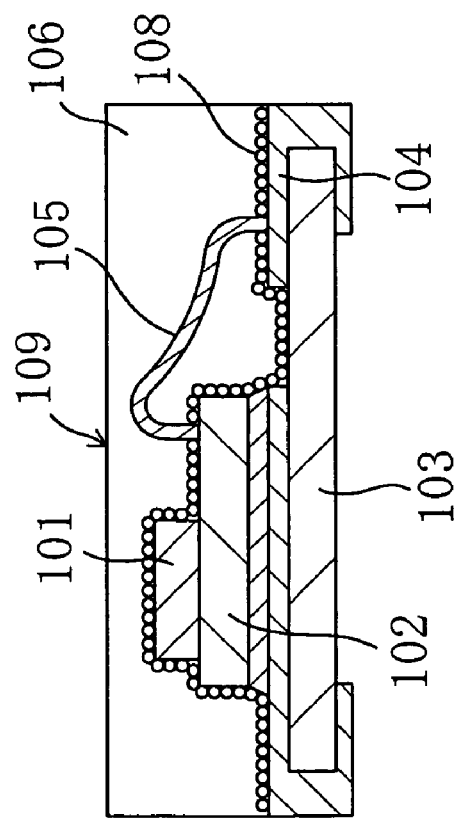

As a first concrete example, a method for applying vibration during curing of a resin and an apparatus therefor are described. FIGS. 17(a) and 17(b) are plan views respectively showing two methods for applying ultrasonic vibration in a process for fabricating a light-emitting semiconductor device. Specifically, as shown in FIG. 17(a), the mold 107 is placed in an ultrasonic vibration layer 130 (produced by KAIJODENNKI Co.). While a resin 106 is curing, vibration is applied to the entire mold 107, so that the phosphor particles 108 are evenly dispersed in the resin 106. Alternatively, vibration may be directly applied to the mold 107 by a vibration applying means 131 (such as an ultrasonic horn) as shown in FIG. 17(b). For example, even if the phosphor particles 108 sediment in the bottom of the resin 106 in the luminescent layer 109 because of a large difference in specific gravity between the resin 106 and the phosphor particles 108, the phosphor particles 108 and the resin 106 are caused to vibrate by applying vibration to the mold 107 as shown in FIGS. 17(a) and 17(b), thereby allowing the phosphor particles 108 to disperse evenly in the resin 106 as shown in FIG. 21(d).

Figure 18A:
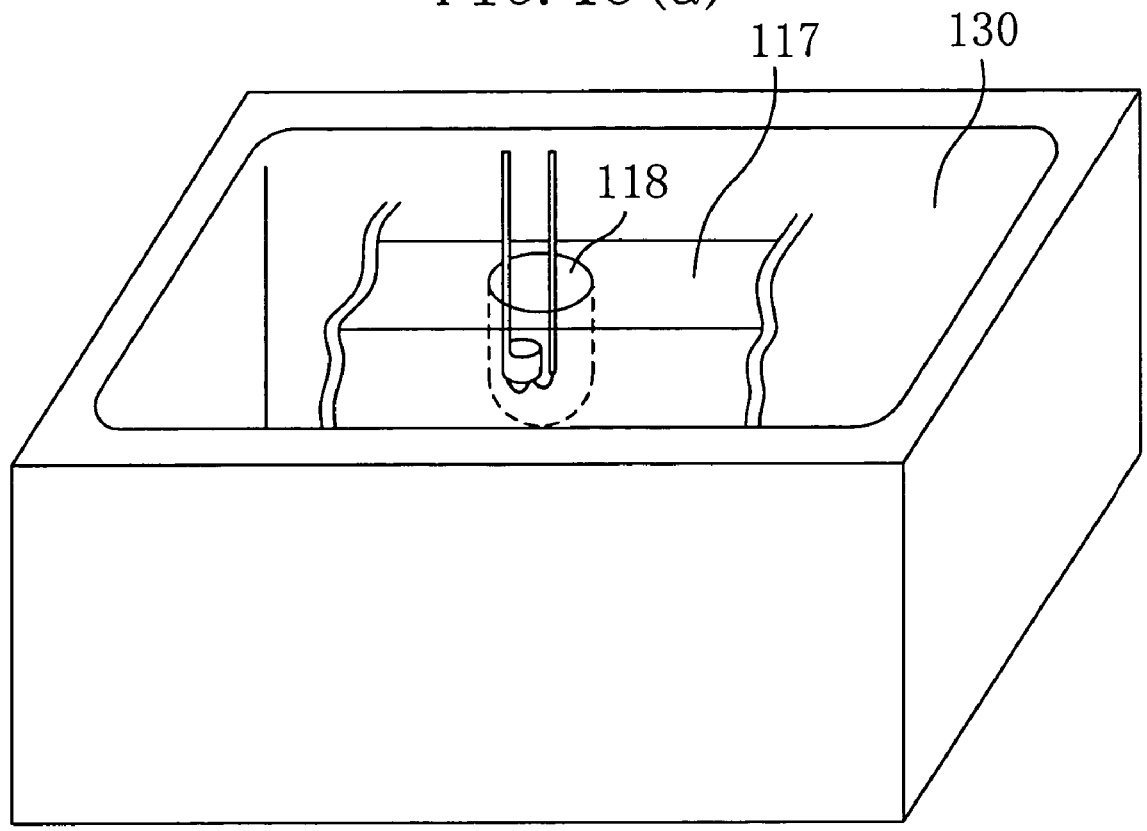
FIGS. 18(a) and 18(b) are plan views respectively showing two methods for applying ultrasonic vibration in the first concrete example of the method for fabricating a light-emitting semiconductor device.
Figure 18B:
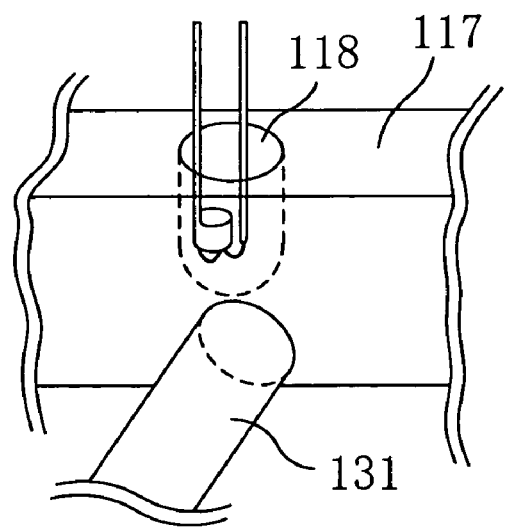

FIGS. 18(a) and 18(b) are plan views respectively showing two methods for applying ultrasonic vibration in the first concrete example of the method for fabricating the light-emitting semiconductor device (the method for fabricating the bulletlike light-emitting semiconductor device) and also showing the states in the application of ultrasonic vibration in the process step shown in FIG. 15(b). Specifically, as shown in FIG. 18(a), the mold 117 is placed in the ultrasonic vibration layer 130 (produced by KAIJODENNKI Co.) and vibration is applied to the entire mold 117 while the resin 115 is curing, thereby allowing the phosphor particles 116 to disperse evenly in the resin 115. Alternatively, vibration may be directly applied to the mold 117 by the vibration applying means 131 (such as an ultrasonic horn) as shown in FIG. 18(b). For example, even if the phosphor particles 116 sediment in the bottom of the resin 115 in the luminescent layer 119 as shown in FIG. 21(a) because of a large difference in specific gravity between the resin 115 and the phosphor particles 116, the phosphor particles 116 and the resin 115 are caused to vibrate by applying vibration to the mold 117 as shown in FIGS. 18(a) and 18(b), thereby allowing the phosphor particles 116 to disperse evenly in the resin 115 as shown in FIG. 21(c).

In the same manner, in the step shown in FIG. 16(c) in the third concrete example of the method for fabricating the light-emitting semiconductor device (the method for fabricating the side-view type light-emitting semiconductor device), the ultrasonic vibration device 130 or the vibration applying means 131 may be used. In such a case, even if the phosphor particles 126 sediment in the bottom of the resin 125 in the luminescent layer 129 because of a large difference in specific gravity between the resin 125 and the phosphor particles 126, for example, the phosphor particles 126 are also evenly dispersed in the resin 125 by applying vibration to the phosphor particles 126 and the resin 125.

—Second Concrete Example for Dispersing Phosphor Particles Evenly—

Figure 19A:
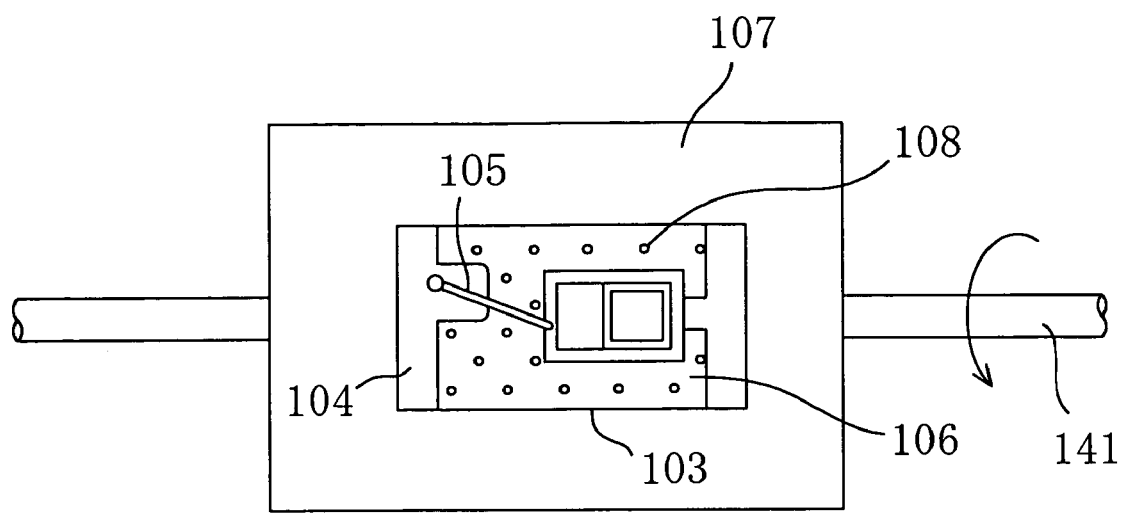
FIGS. 19(a) and 19(b) are cross-sectional views showing a method for turning over a mold in the first concrete example (transfer technique) of the method for fabricating a light-emitting semiconductor device.
Figure 19B:
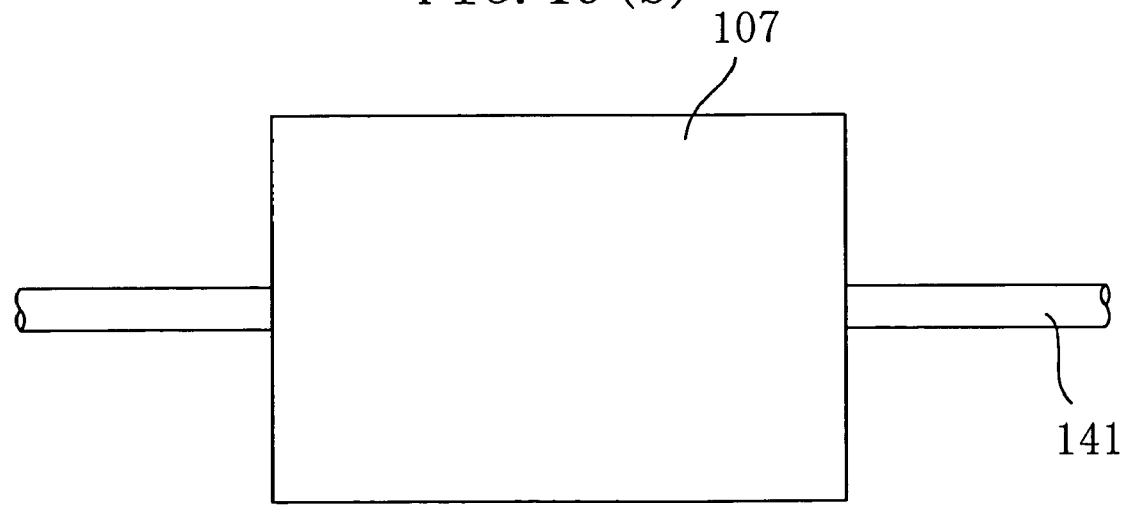

As a second concrete example, a method and apparatus for turning over a mold while a resin is curing are described. FIGS. 19(a) and 19(b) are cross-sectional views showing a method for turning over a mold in a process for fabricating a light-emitting semiconductor device and also showing the respective states when the mold is turned over. That is to say, as shown in FIG. 19(a), an inverting means including a rotation shaft 141 and a driving motor (not shown) for rotating the rotation shaft 141 is used and the rotation shaft 141 is installed in the mold 107 so that the entire mold 107 is repeatedly turned over between a normal orientation shown in FIG. 19(a) and an inverted orientation shown in FIG. 19(b) while the resin 106 is curing, thereby allowing the phosphor particles 108 to disperse evenly in the resin 106. For example, even if the phosphor particles 108 sediment in the bottom of the resin 106 in the luminescent layer 109 as shown in FIG. 21(b) because of a large difference in specific gravity between the resin 106 and the phosphor particles 108, turning over the mold 107 as shown in FIGS. 19(a) and 19(b) causes the phosphor particles 108 and the resin 106 to move so that the phosphor particles 108 disperse evenly in the resin 106 as shown in FIG. 21(d).

In this case, as the number of rotating the mold 107 increases, the phosphor particles 108 disperse more evenly in the resin 106. In addition, since about 90% of the whole of the resin cures for the first one hour, the mold 107, i.e., the resin 106, is preferably turned over within this first one hour.

Figure 20A:
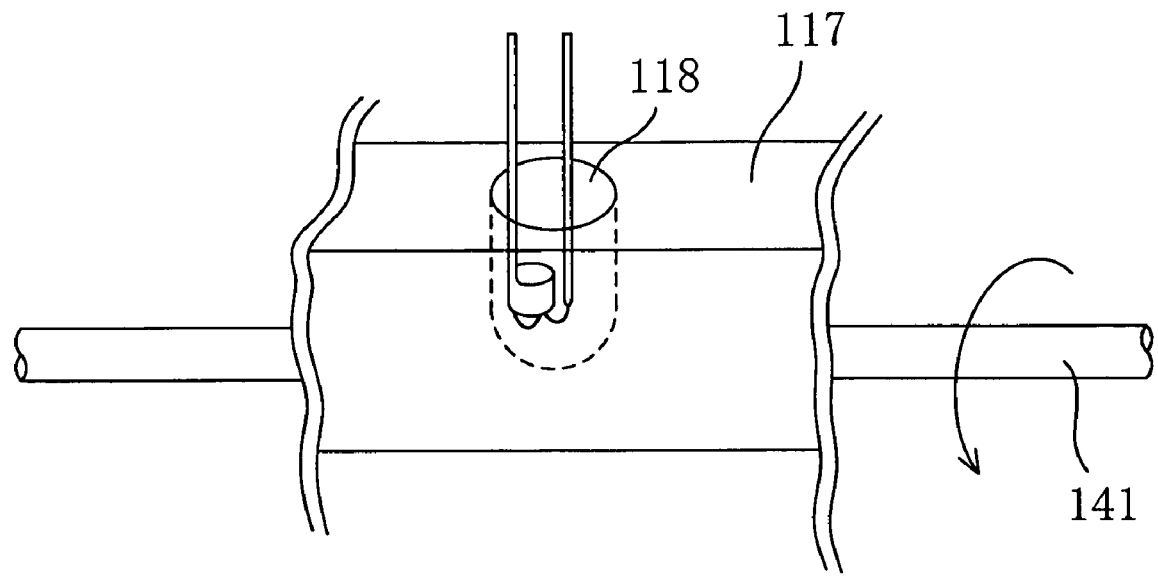
FIGS. 20(a) and 20(b) show the respective states in turning over the mold in the step shown in FIG. 15(a) in the second concrete example of the process for fabricating the light-emitting semiconductor device.
Figure 20B:
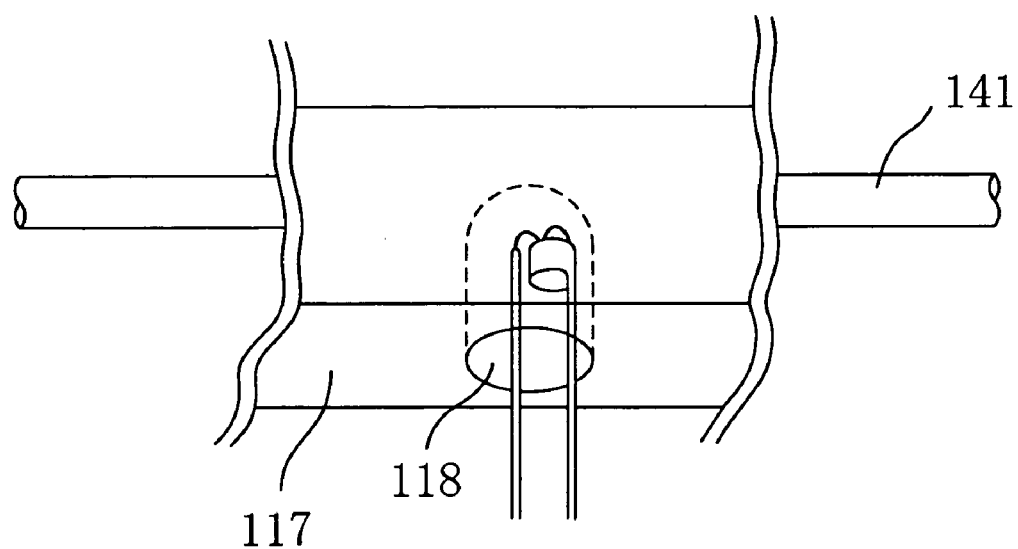

FIGS. 20(a) and 20(b) show the respective states in turning over the mold in step shown in FIG. 15(a) in the second concrete example of the process for fabricating the light-emitting semiconductor device. Specifically, as shown in FIG. 20(a), the inverting means including the rotation shaft 141 and a driving motor (not shown) for rotating the rotation shaft 141 is used and the rotation shaft 141 is installed in the mold 117 so that the entire mold 117 is repeatedly turned over between a normal orientation shown in FIG. 20(a) and an inverted orientation shown in FIG. 20(b) while the resin 115 is curing, thereby allowing the phosphor particles 116 to disperse evenly in the resin 115. For example, even if the phosphor particles 116 sediment in the bottom of the resin 115 in the luminescent layer 119 as shown in FIG. 21(a) because of a large difference in specific gravity between the resin 115 and the phosphor particles 116, turning over the mold 117 as shown in FIGS. 20(a) and 20(b) causes the phosphor particles 116 and the resin 115 to move so that the phosphor particles 116 disperse evenly in the resin 115 as shown in FIG. 21(c).

In this case, as the number of rotating the mold 117 increases, the phosphor particles 116 disperse more evenly in the resin 115. In addition, since about 90% of the whole of the resin cures for the first one hour, the mold 117, i.e., the resin 115, is preferably turned over within this first one hour.

In the same manner, in the step shown in FIG. 16(c) in the third concrete example of the method for fabricating the light-emitting semiconductor device (the method for fabricating the side-view type light-emitting semiconductor device), an inverting means may be used. In such a case, even if the phosphor particles 126 sediment in the bottom of the resin 125 in the luminescent layer 129 because of a large difference in specific gravity between the resin 125 and the phosphor particles 126, for example, turning over the phosphor particles 126 and the resin 125 allows the phosphor particles 126 to disperse evenly in the resin 125.

—Third Concrete Example for Dispersing Phosphor Particles Evenly—

As a third concrete example, a method for performing, a plurality of times, a process of filling a recess or a mold with a resin and then curing the resin is described.

Figure 12D:
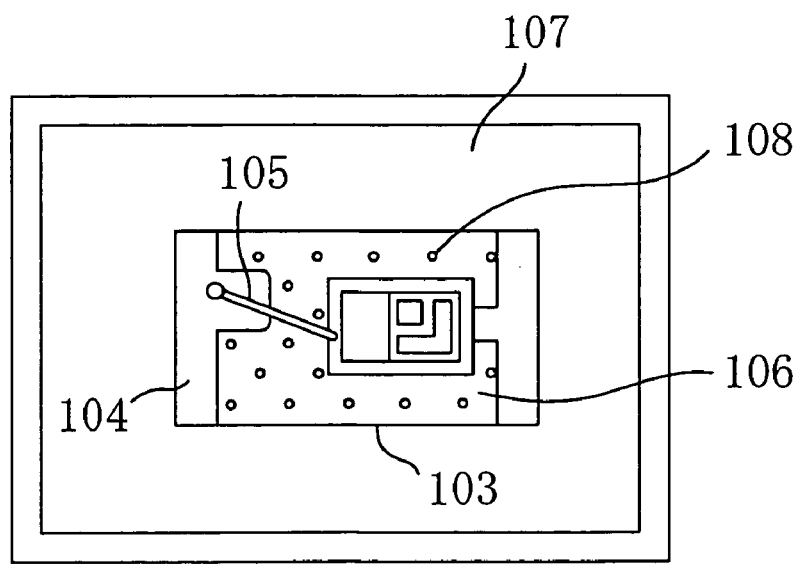

In this concrete example, in the step shown in FIG. 12(d) in the first concrete example of the method for fabricating the light-emitting semiconductor device (the transfer technique), for example, one-third of the whole resin 106 including the phosphor particles 108 is poured into the mold 107 and then cures by heating the resin 106 at 120° C. for five hours. This process is repeated three times, thereby forming a luminescent layer 109 in the mold 107.

By thus pouring and curing the resin through the process repeated a plurality of times, the phosphor particles 108 disperse relatively evenly in the resin 106 without sedimenting in the bottom of the resin 106 in the luminescent layer 109 as shown in FIG. 21(b).

Figure 14C:
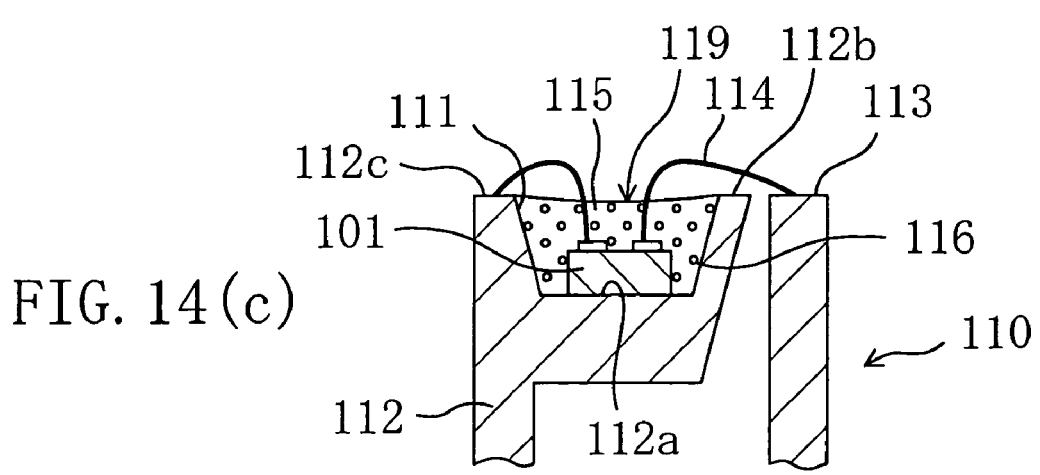

In the same manner, in the step shown in FIG. 14(c) in the second concrete example of the method for fabricating the light-emitting semiconductor device (the method for fabricating the bulletlike light-emitting semiconductor device), or in the step shown in FIG. 16(c) in the third concrete example of the method for fabricating the light-emitting semiconductor device (the method for fabricating the side-view type light-emitting semiconductor device), if the step of pouring a resin into a mold or a recess and curing the resin is performed a plurality of times, phosphor particles are relatively evenly dispersed in the resin.

In this case, as the number of steps of pouring and curing the resin in the mold or recess increases, the phosphor particles disperse more evenly in the resin. However, since a larger number of the steps require a longer fabrication time, the number of the steps is preferably five or less, and most preferably about three.

—Fourth Concrete Example for Dispersing Phosphor Particles Evenly—

As a fourth concrete example, a method using a high-viscosity resin in forming a luminescent layer will be described.

In this concrete example, in a process for fabricating a light-emitting semiconductor device (e.g., the step shown in FIG. 17(c)), for example, if the resin 106 including the phosphor particles 108 has a high viscosity, it is possible to prevent sedimentation of the phosphor particles 108 while the resin 106 is curing. In this concrete example, it is assumed that the resin 106 has a viscosity at which the phosphor particles 108 do not sediment. The viscosity is preferably in the range from 1 Pa·S to 100 Pa·S, both inclusive.

By thus using the high-viscosity resin, the phosphor particles 108 disperse relatively evenly in the resin 106 without sedimenting in the bottom of the resin 106 in the luminescent layer 109 as shown in FIG. 21(b).

In the same manner, in the step shown in FIG. 14(c) in the second concrete example of the method for fabricating the light-emitting semiconductor device (the method for fabricating the bulletlike light-emitting semiconductor device), or the step shown in FIG. 16(c) in the third concrete example of the method for fabricating the light-emitting semiconductor device (the method for fabricating the side-view type light-emitting semiconductor device), if a high-viscosity resin is used, the phosphor particles disperse relatively evenly in the resin.

—Fifth Concrete Example for Dispersing Phosphor Particles Evenly—

As a fifth concrete example, a method using a resin which does not need heat for curing in forming a luminescent layer will be described.

In this concrete example, in a process for fabricating a light-emitting semiconductor device (e.g., the step shown in FIG. 12(d)), for example, a resin which cures with ultraviolet radiation (YL6663 produced by Yuka Shell Co. Ltd.) (which will be hereinafter referred to as an ultraviolet-curing resin) is used as the resin 106 including the phosphor particles 108. Alternatively, a resin which cures with a curing agent (hereinafter, referred to as a two-liquid-curing resin) may be used as the resin 106.

As a result, it was found that the use of a resin which cures with heat causes the phosphor particles 108 to sediment to some extent because such a resin has its viscosity decreased in a certain period before curing, whereas the use of the ultraviolet-curing resin or two-liquid-curing resin which does not cure with heat allows the phosphor particles 108 to disperse relatively evenly in the resin 106.

In the same manner, in the step shown in FIG. 14(c) in the second concrete example of the method for fabricating the light-emitting semiconductor device (the method for fabricating the bulletlike light-emitting semiconductor device), or the step shown in FIG. 16(c) in the third concrete example of the method for fabricating the light-emitting semiconductor device (the method for fabricating the side-view type light-emitting semiconductor device), if an ultraviolet-curing resin or a two-liquid-curing resin which does not cure with heat is used, the phosphor particles disperse relatively evenly in the resin.

If the steps or means for dispersing the phosphor particles more evenly in the resin are provided as in the first through fifth concrete examples, the following effects are achieved. That is to say, as compared to the case where phosphor particles are unevenly distributed, if the phosphor particles are evenly dispersed, especially in a vertical direction, in the resin, it is possible to outwardly extract blue light (light whose emission spectrum has a peak between 450 nm and 560 nm) emitted by a blue LED, which is otherwise excessively confined in the unevenly distributed phosphor particles. As a result, appropriate white light can be obtained.

In addition, a problem that the fluorescence itself emitted by the phosphor particles is confined excessively in the unevenly distributed phosphor particles is eliminated. Therefore, it is possible to extract the fluorescence to the outside.

Moreover, as compared to the case where phosphor particles are unevenly dispersed in a resin, especially in the case where the phosphor sediments on the substrate 103 as shown in FIGS. 21(a) and 21(c), even though the amount of the phosphor is reduced by 10% using the same blue LED, a white-light-emitting semiconductor device with the same color temperature is achieved, and in addition, the luminance and the intensity can be increased with the same color temperature.

The effects are obtained by using only one of the steps or means in the first through fifth concrete examples. However, further synergistic effects are created by using two or more of the steps or means.

—Concrete Example Relating to Agitation for Luminescent Layer—

Figure 22:
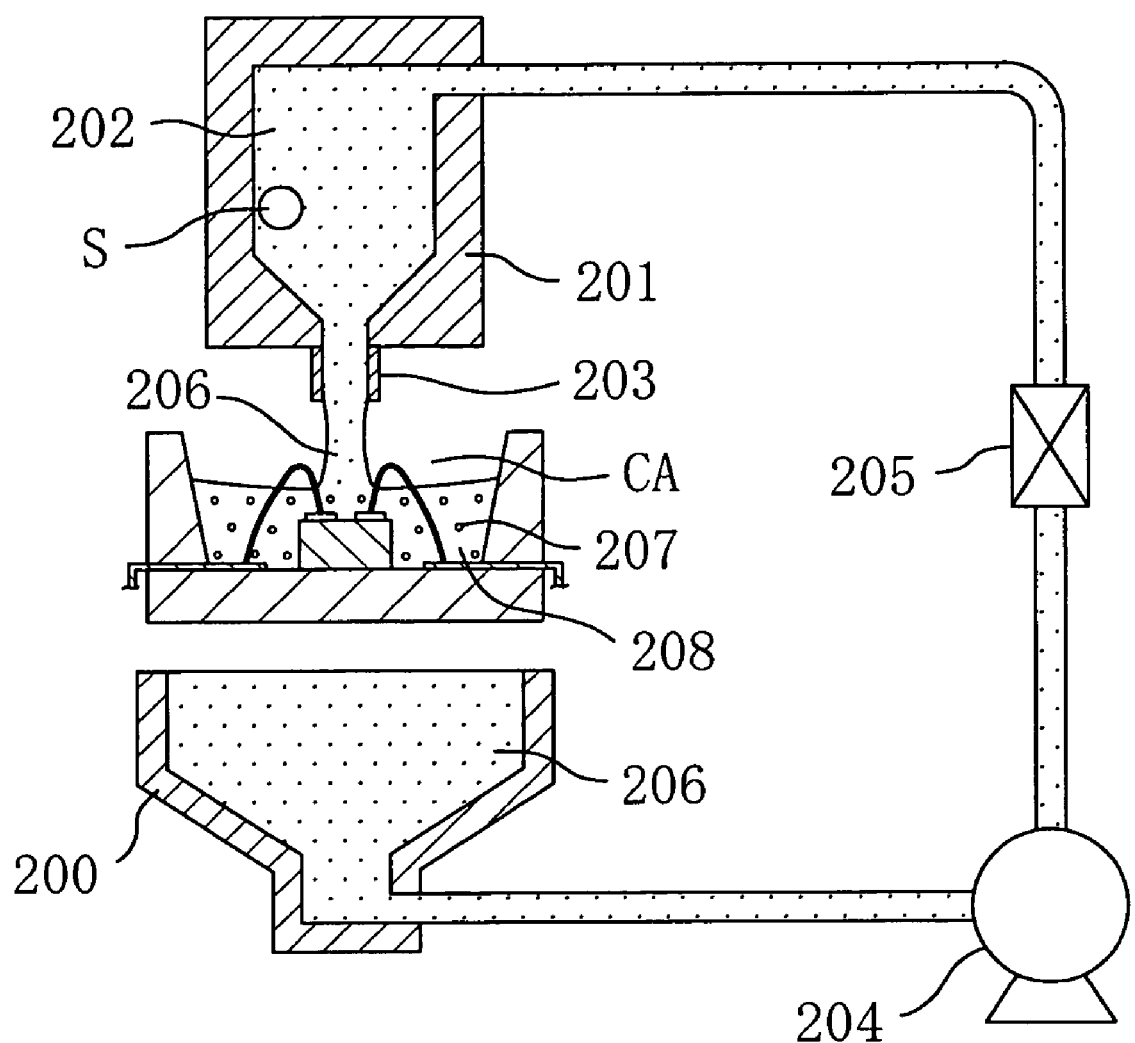
FIG. 22 is a cross-sectional view showing a preferred concrete example of a phosphor paste discharging apparatus.

FIG. 22 is a cross-sectional view showing a preferred concrete example of a phosphor paste discharging apparatus for use in pouring a phosphor paste containing a silicate phosphor into a cavity in a light-emitting semiconductor device. In FIG. 22, reference numeral 200 denotes a material tank, reference numeral 201 denotes a head, reference sign CA denotes a cavity in a light-emitting semiconductor device, reference numeral 204 denotes a pump, reference numeral 205 denotes a dispersion nozzle, reference numeral 206 denotes a phosphor paste, reference numeral 207 denotes phosphor particles contained in the phosphor paste 206, and reference numeral 208 denotes a resin included in the phosphor paste 206. The head 201 includes: a tank compartment 202 for storing the phosphor paste 206 moved from the material tank 200; a nozzle 203 for ejecting the phosphor paste 206 into the cavity CA; and a metal ball S placed in the tank compartment 202, for example. The phosphor paste stored in the material tank 200 is supplied to the tank compartment 202 through the pressurization by the circulating pump 204, and then is continuously ejected into the cavity CA through the nozzle 203.

In the phosphor paste 206 stored in the material tank 200 or the tank compartment 202, the phosphor particles 207 aggregate together with time and are likely to form a cluster of the phosphor particles 207. The formation of the cluster of the phosphor particles 207 causes the nozzle 203 to clog or the concentration of the phosphor particles 207 in the phosphor paste 206 to be ejected to vary, so that it is difficult to disperse the phosphor particles 207 evenly in the cavity CA in some cases. To avoid the difficulty, in the phosphor paste discharging apparatus of this example, the phosphor paste 207 stored in the material tank 200 or the tank compartment 202 is agitated, thereby suppressing the formation of the cluster of the phosphor particles 207. In the example shown in FIG. 22, the metal ball S is contained in the material tank 200 or the tank compartment 202 and the metal ball S is moved within the tank by magnetic force, thereby allowing agitation of the phosphor paste 207. In this manner, agglomeration of the phosphor is suppressed in the material tank 200 or the tank compartment 202.

A method for agitating the phosphor paste 207 in the material tank 200 or the tank compartment 202 is not limited to the method using the metal ball S as shown in FIG. 22, and a lot of other methods may be adopted so long as the variation in concentration distribution in the phosphor paste 207 within, for example, the tank compartment is suppressed as much as possible. For example, vibration may be applied to the tank compartment 202 or an agitating member may be merely installed on the tank compartment 202. Alternatively, a filter may be placed in the material tank 200 so that the phosphor paste 206 is supplied into the material tank 200 through the filter, thereby dissolving the cluster.

In addition, the phosphor paste discharging apparatus of this concrete example is provided with the dispersion nozzle 205 for controlling the flow rate of the phosphor paste 206. Accordingly, when the phosphor paste 206 passes through the dispersion nozzle 205, the cluster of the phosphor particles 207 in the phosphor paste 206 is separated into small pieces by a jet stream, thereby disassembling the cluster. If the neck diameter of the dispersion nozzle 205 is previously set to fit the nozzle diameter of the head 202, the cluster in the phosphor paste 206 created in the material tank 200 or in a supply path on the way to the material tank 200 is appropriately disassembled, thereby stabilizing the ejection from the nozzle 203. By suppressing the agglomeration of the phosphor in the head 202 via the dispersion nozzle 205, the nozzle 203 is prevented from clogging and, moreover, the phosphor particles 207 are easily dispersed evenly in the cavity CA. The dispersion nozzle 205 is not necessarily provided and may be adaptively provided according to, for example, the viscosity of the silicate phosphor.

—Electrification of Luminescent Layer—

As described above, a large difference in specific gravity between a YAG-based phosphor and a base material is considered to be one cause of sedimentation of the phosphor. In addition, the fact that the YAG-based phosphor is always positively charged is considered another cause. That is to say, if a resin as the base material is positively charged, as is the YAG-based phosphor, the resin and the YAG-based phosphor repel each other in general, resulting in that the YAG-based phosphor sediments.

On the other hand, considering the fact that a silicate phosphor containing a component expressed by the chemical formula $(Sr_{1-a1-b1-x}Ba_{a1}Ca_{b1}Eu_x)_2SiO_4$ as a main component does not sediment with respect to the same resin, and the above-described relationship between electrification and sedimentation, the silicate phosphor particles are negatively charged, i.e., oppositely charged to the resin, so that the phosphor and the resin attract each other. As a result, it is concluded that the silicate phosphor particles disperse throughout the resin. Examples of such resins to be positively charged include an epoxy resin and a silicone resin.

In view of this, means for facilitating the dispersion of the YAG-based phosphor particles may be a method for coating the phosphor particles with an oxide to be negatively charged.

As a method for coating the surfaces of the phosphor particles with an oxide or a fluoride, a suspension of a phosphor paste and a suspension containing coating particles of a needed oxide or fluoride are mixed and agitated, and then subjected to suction filtration. Thereafter, the resultant substance is dried at 125° C. or higher and then is fired at 350° C. In order to enhance the adherability between the phosphor and the oxide or fluoride, a small amount of a resin, an organic silane or a liquid glass may be added.

As a method for applying a coating to the surfaces of the phosphor particles, a method utilizing the hydrolysis of an organic metal compound may be used. Then, a coating of $SiO_2$, which is an oxide readily to be negatively charged, is applied to the surfaces of the phosphor particles. In forming an $Al_2O_3$ film, $Al(OC_2H_5)_3$ which is aluminum alkoxide, is used for a phosphor so as to be mixed and agitated in an alcohol solution, thereby applying $Al_2O_3$ to the surface of the phosphor.

The present inventors found that by thus attaching or applying, as a coating, a member made of a material which is opposite to the resin in electrification polarity to the surfaces of the phosphor particles, resin particles surround the phosphor particles to which the member positively charged, i.e., oppositely charged to the resin, is attached or applied as a coating, resulting in suppressing agglomeration of the phosphor particles as well as preventing sedimentation of the phosphor particles. That is to say, the present inventors found that in either case of the YAG-based phosphor particles or the silicate phosphor particles, if members are selected such that at least the resin, in which the phosphor particles are dispersed, and the phosphor particles are charged oppositely to each other, such pronounced sedimentation of phosphor particles as observed in the known devices does not occur.

In this case, if the amount of an oxide of fluoride coating which is applied to the surfaces of the phosphor particles and is to be negatively charged is too small, only a small effect is achieved, whereas if the amount thereof is too large, the coating absorbs emission of light so that the luminance might decrease. Therefore, the present inventors have conducted various experiments to find that the amount of an oxide or fluoride coating which is applied to the surfaces of the phosphor particles and is to be negatively charged is preferably in the range from 0.05% to 2.0% of the phosphor particles in weight.

In this manner, as a further aspect of the present invention, provided is a structure in which an epoxy resin includes a YAG-based phosphor to which $SiO_2$ is applied as a coating or attached. That is to say, the present invention provides a structure in which an epoxy resin includes a YAG-based phosphor to which an oxide or a fluoride to be negatively charged is attached or applied as a coating, and also provides a method for forming such a structure. More specifically, the present invention provides a structure in which a YAG-based phosphor to which an oxide or a fluoride to be negatively charged is attached or applied as a coating is included in an epoxy resin which is a resin causing the YAG-based phosphor to be negatively charged, and also provides a method for forming such a structure. Still more specifically, the present invention provides a structure in which light emitted by a blue LED passes through the epoxy resin and a method for forming such a structure, thereby making it possible to provide a white/whitish-light-emitting semiconductor device in which phosphor particles disperse evenly, as shown in FIGS. 21(c) and 21(d).

—Example of Silicate Phosphor for Light-Emitting Semiconductor Device—

Hereinafter, an implementation example of an inventive light-emitting semiconductor device will be described.

(Example of Procedure for Forming Silicate Phosphor)

First, silicate phosphor particles having a composition enough to emit yellow/yellowish light was formed. Powders of barium carbonate ($BaCO_3$), strontium carbonate ($SrCO_3$), europium oxide ($Eu_2O_3$) or silicon dioxide ($SiO_2$) were used as materials for the phosphor. Calcium chloride ($CaCl_2$) was used as a flux. Each of the materials has a purity of 99.9% or more and a particle size in the range from 10 nm to 5 µm, both inclusive. To eliminate errors in weighing caused by an adsorption gas, variation in weight of each of the materials before and after heating performed at about 900° C. in the air was previously examined and grasped.

After 9.9 g, 138.0 g, 2.6 g, 30.7 g and 1.7 g of powdery barium carbonate, strontium carbonate, europium oxide, silicon dioxide and calcium chloride, respectively, had been weighed with an electric balance, these powders were fully mixed with an automatic mortar, thereby obtaining a mixed phosphor material powder. Thereafter, an alumina boat was charged with the mixed phosphor material powder and then was placed in a given position within a tubular atmospheric furnace using an alumina as a core tube, and then firing was performed. The firing was performed at a heating temperature of 1400° C. in an ambient containing 5% hydrogen and 95% nitrogen for two hours.

After it was confirmed that the interior of the core tube was cooled to room temperature, the fired substance (silicate phosphor) was taken out and subjected to subsequent processes such as pulverizing, cleaning, classification and drying. In this manner, a silicate phosphor having an orthorhombic structure and emitting yellow/yellowish light was obtained.

Hereinafter, results of pre-evaluation performed on characteristics of the obtained silicate phosphor will be described. In this evaluation, the composition of the silicate phosphor, the excitation spectrum and emission spectrum of the silicate phosphor, the reflecting spectrum of blue excitation light, and the emission spectrum of a phosphor excited by blue light, were evaluated using a crystal component of the silicate phosphor particles obtained by an X-ray diffraction, a particle distribution and particle size of the silicate phosphor particles measured with a laser diffraction particle size analyzer, and an ICP spectroscopy.

Figure 23:
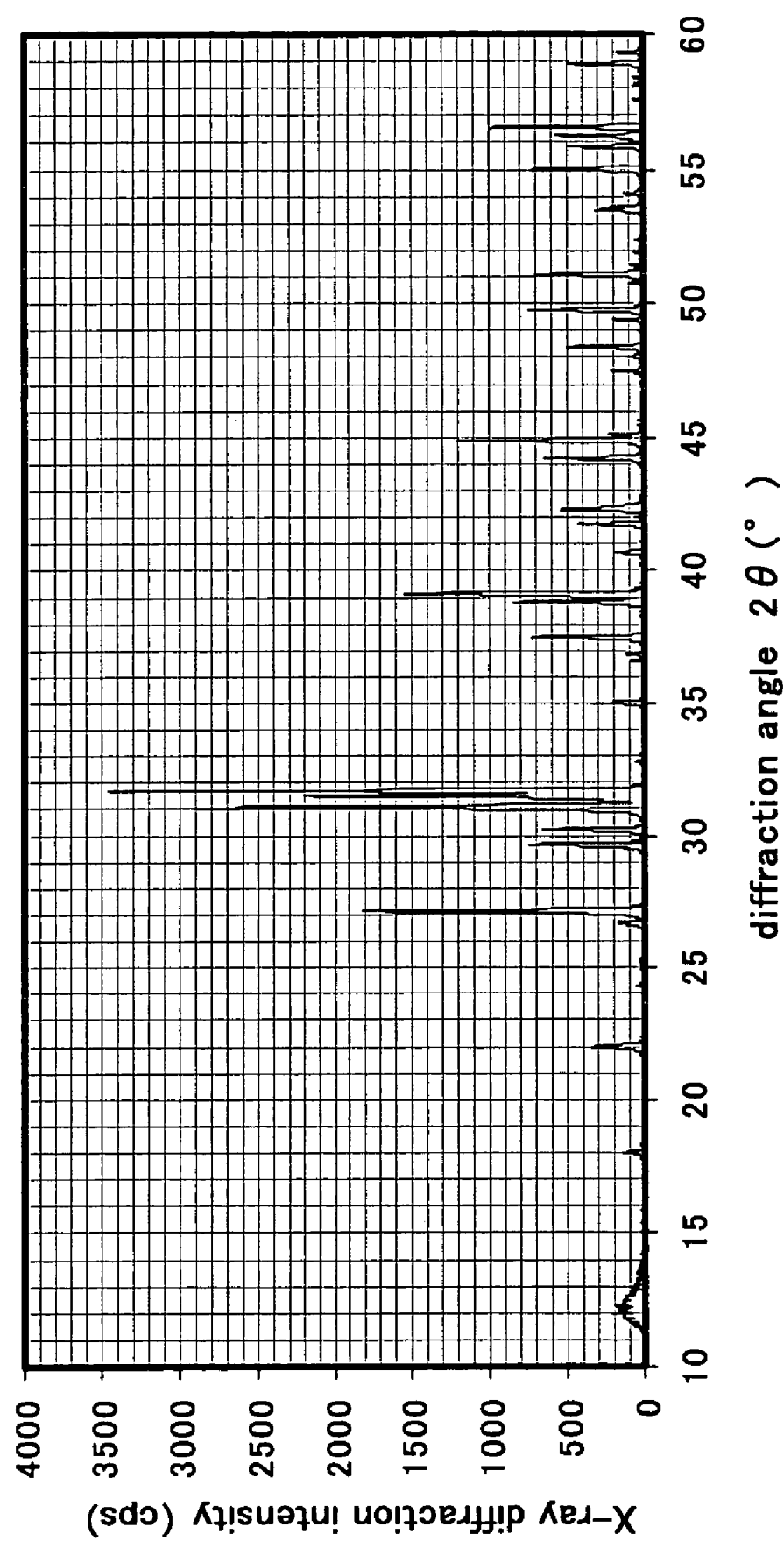
FIG. 23 is an X-ray diffraction pattern showing a result of an X-ray diffraction analysis performed on a silicate phosphor and also showing the relationship between the diffraction angle and the X-ray diffraction intensity.

FIG. 23 is an X-ray diffraction pattern showing a result of an X-ray diffraction analysis performed on a silicate phosphor and also showing a relationship between diffraction angle and X-ray diffraction intensity. The X-ray diffraction pattern shown in FIG. 23 is the same as an X-ray diffraction pattern of an orthorhombic $Sr_2SiO_2$ compound, which will be described later (see FIG. 27(b)). This shows that the silicate phosphor of the implementation example is a (Si, Ba, Eu)$_2SiO_4$ phosphor with one kind of crystal structure having an orthorhombic structure.

Figure 24:
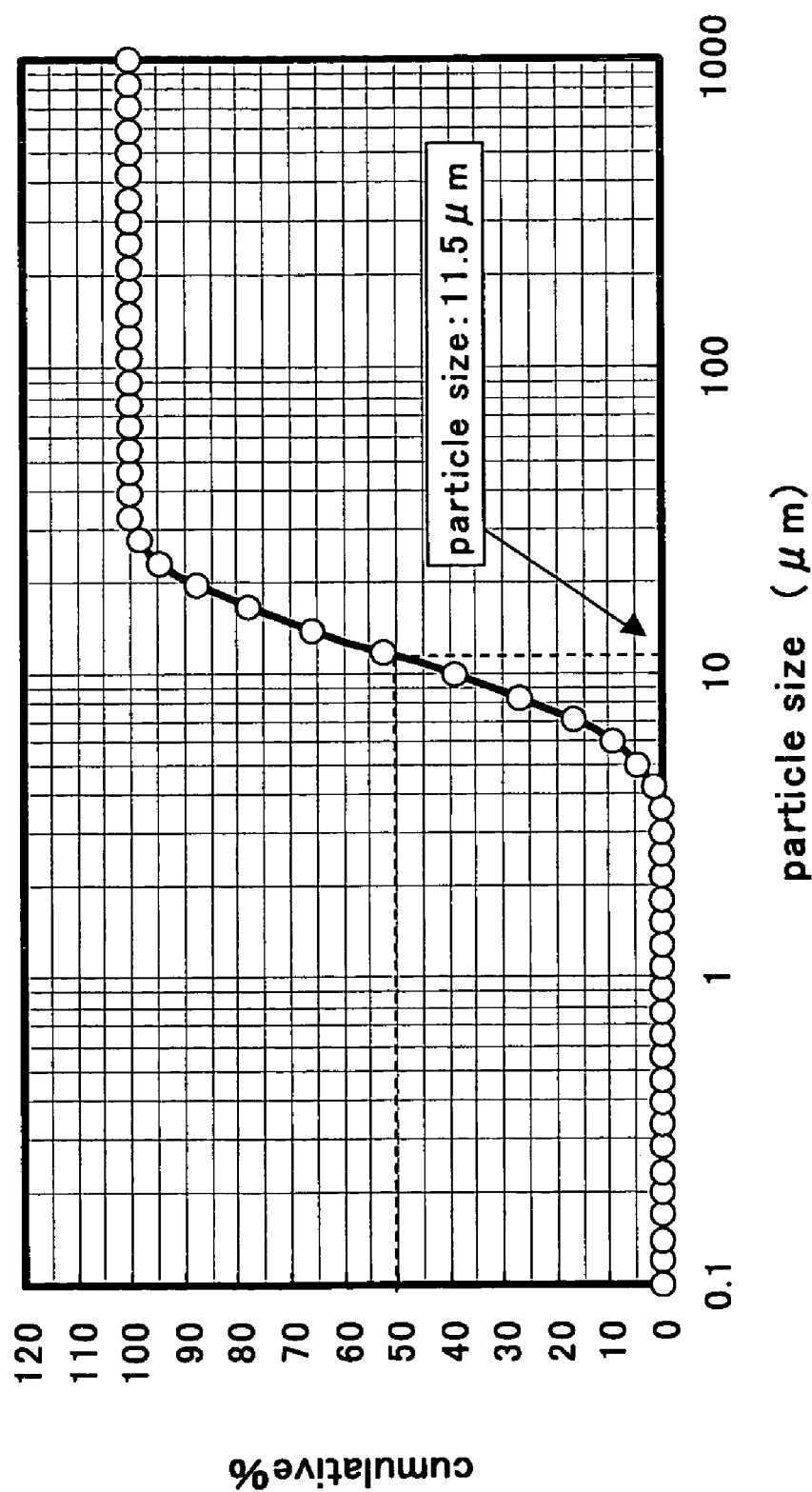
FIG. 24 is a graph showing a particle-size distribution in the silicate phosphor observed with a particle size analyzer.

FIG. 24 is a graph showing a particle-size distribution in the silicate phosphor observed by an X-ray diffraction. As shown in FIG. 24, particle sizes of the silicate phosphor particles of the implementation example are distributed within the range from about 3 μm to 30 μm, both inclusive, and the phosphor is made of a group of phosphor particles having a particle size of 11.5 μm. As a result of an electron microscope observation, it is shown that one particle of the silicate phosphor is a cluster made of several round primary particles. Although slight surface roughness is observed, the surfaces of the primary particles are relatively smooth.

Next, the composition of the silicate phosphor was evaluated using an ICP spectroscopy. As a result, it was found that the composition of the silicate phosphor is $(Ca_{0.015}Sr_{0.92}Ba_{0.05}Eu_{0.015})Si_{0.99}O_x$, which substantially coincides with the composition of an as-charged silicate phosphor.

Then, an excitation spectrum and an emission spectrum of the silicate phosphor were evaluated. A result of this evaluation is already shown with reference to FIG. 8. For comparison, an excitation spectrum and an emission spectrum of a YAG-based phosphor are also shown in FIG. 8. FIG. 8 shows that the silicate phosphor of this example is a yellow/yellowish phosphor having an excitation-light peak around 250 to 300 nm and absorbing light in the wide wavelength range from 100 to 500 nm to produce an emission at a peak wavelength of 569 nm. The yellow/yellowish light emitted by the silicate phosphor has a chromatically point (x, y) of (0.484, 0.506) in a CIE chromaticity diagram.

Figure 25:
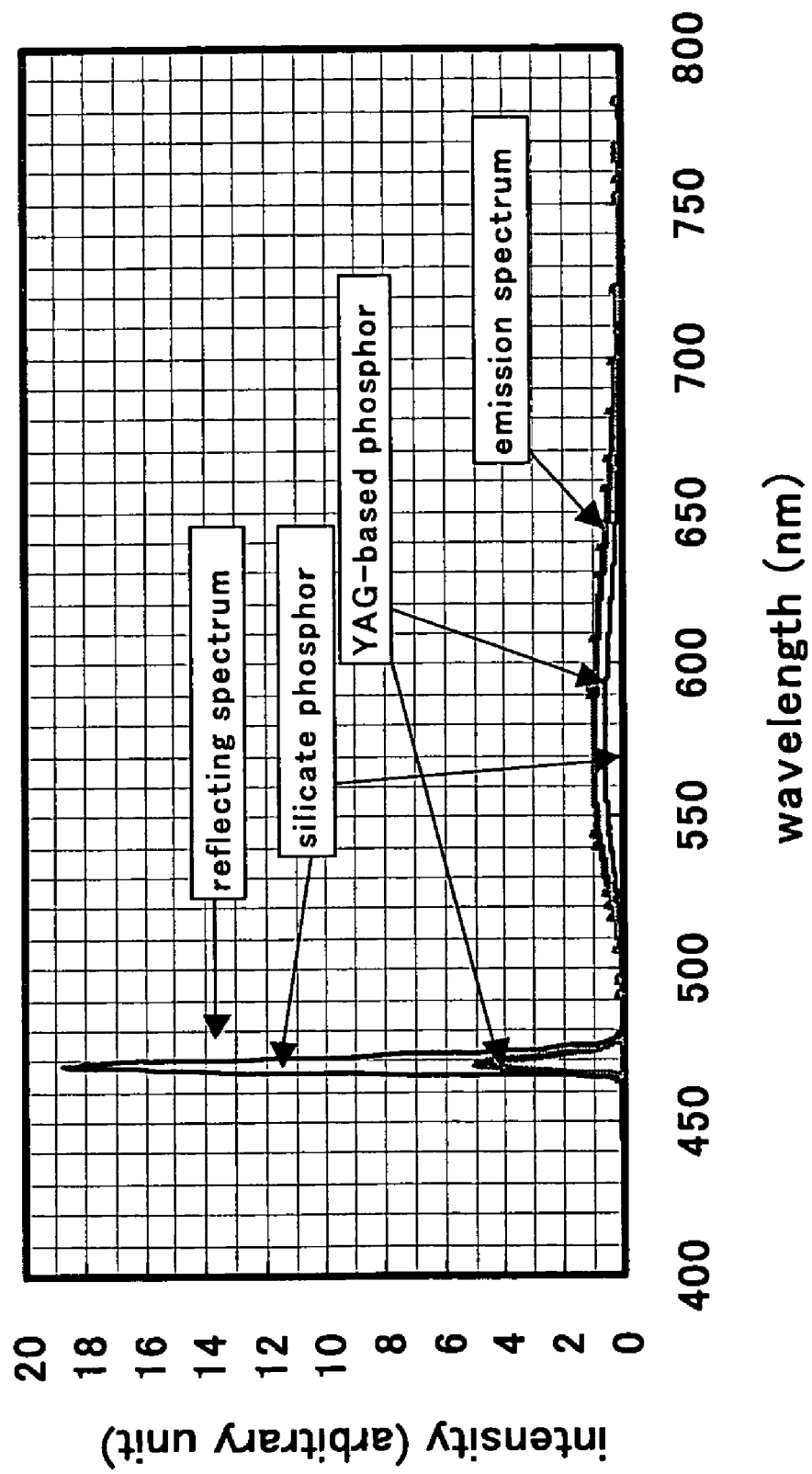
FIG. 25 is a graph showing a result of evaluation performed on emission of the silicate phosphor through integration using an integrating sphere.

FIG. 25 is a graph showing a result of evaluation performed on emission of the silicate phosphor through integration using an integrating sphere. In this case, the silicate phosphor obtained by the above-described process is irradiated with blue light for excitation with a wavelength of 470 nm so that the reflecting spectrum of the blue excitation light and the emission spectrum of a phosphor excited by the blue light were evaluated. The blue light with a wavelength of 470 nm was obtained by sending light from a Xe lamp through a monochromator. For comparison, FIG. 25 also shows the reflecting spectrum and emission spectrum of a YAG-based phosphor. In FIG. 25, the emission peak at 470 nm is caused by the excitation light (blue light). FIG. 25 shows that the silicate phosphor has a tendency to reflect at least three times as much blue light, as the YAG-based phosphor, and that as compared to the YAG-based phosphor, the silicate phosphor exhibits a low luminous intensity, which is about half of the luminous intensity of the YAG-based phosphor, when excited by the blue light.

—Various Characteristics of Silicate Phosphor—

Hereinafter, the characteristics of the silicate phosphor formed by the above-described procedure will be described in detail. FIG. 53 is a table showing typical compositions and characteristics of silicate phosphors for reference. FIG. 53 indicates compositions quantitatively evaluated by an ICP spectroscopy basically or compositions which can be estimated from the results of the quantitative evaluation.

Firstly, a relationship between the composition and the crystal structure of a silicate phosphor is described. The following descriptions are about a silicate phosphor obtained by setting the Eu concentration (which is defined as Eu/(Sr+Ba+Ca+Eu)) at a typical value of 2 at. % (i.e., Eu concentration=0.02) and by being fired at 1400° C. in a reducing atmosphere for two hours.

As has been described above, the silicate phosphor can be in at least three kinds of crystal structures such as an orthorhombic system, a monoclinic system and a hexagonal system depending on its composition. These kinds of crystal structures are described with reference to FIGS. 26(a) through 30(b).

Figure 26A:
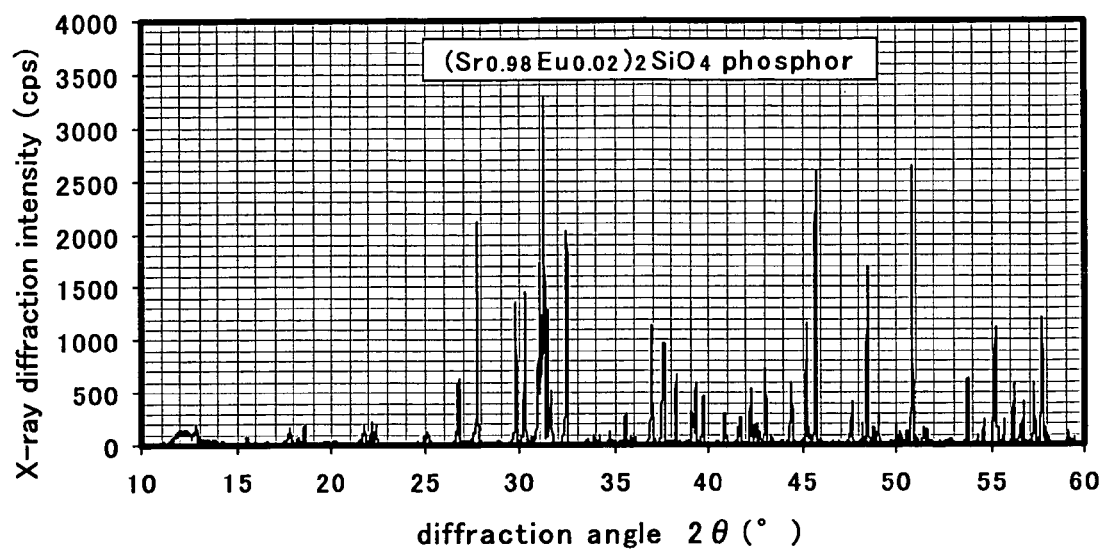
FIGS. 26(a) and 26(b) are X-ray diffraction patterns respectively showing a $(Sr_{0.98}Eu_{0.02})_2SiO_4$ phosphor containing neither Ca nor Ba and a publicly known monoclinic $Sr_2SiO_4$ compound.
Figure 26B:
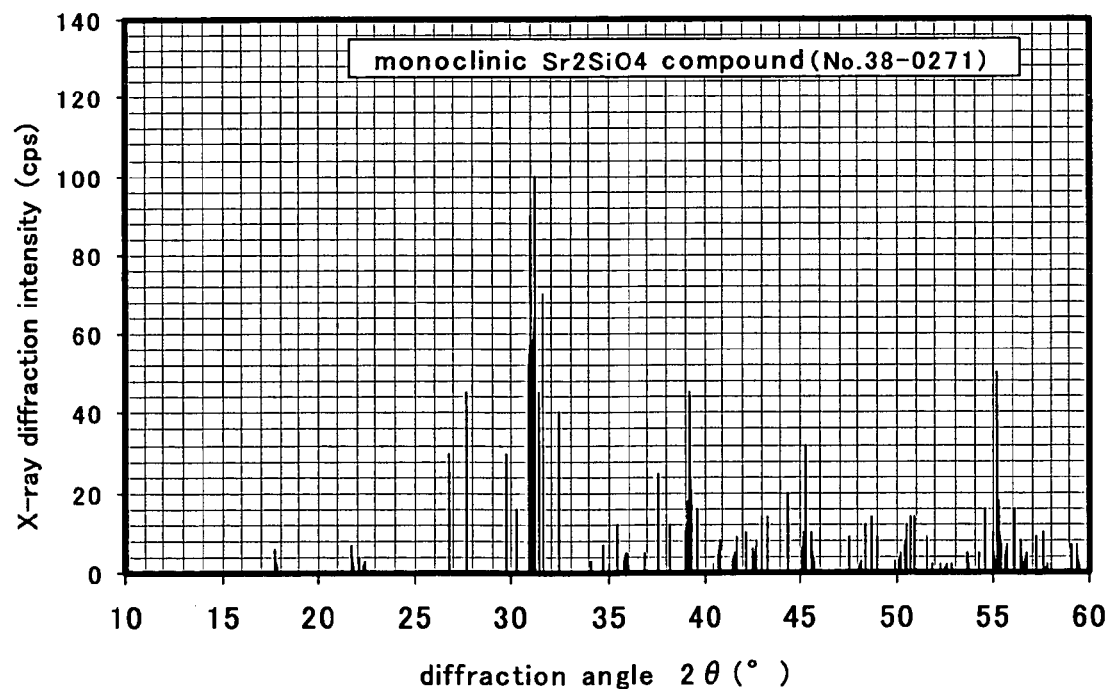
Figure 27A:
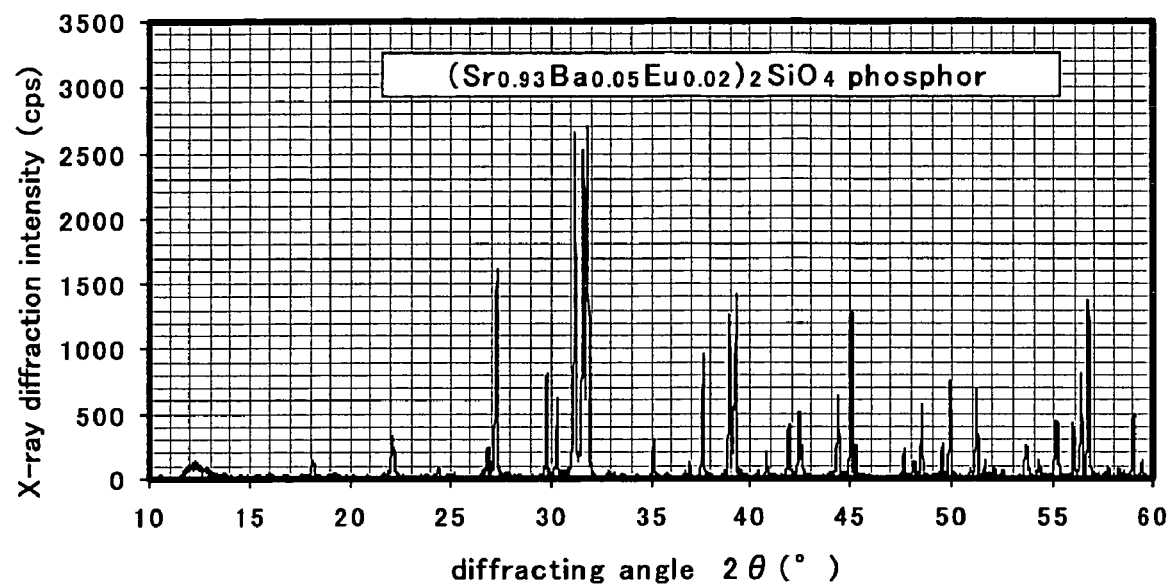
FIGS. 27(a) and 27(b) are X-ray diffraction patterns respectively showing a $(Sr_{0.93}Ba_{0.5}Eu_{0.02})_2SiO_4$ phosphor containing no Ca and containing 5 at. % Ba in terms of substitution amount and a publicly known orthorhombic $Sr_2SiO_4$ compound.
Figure 27B:
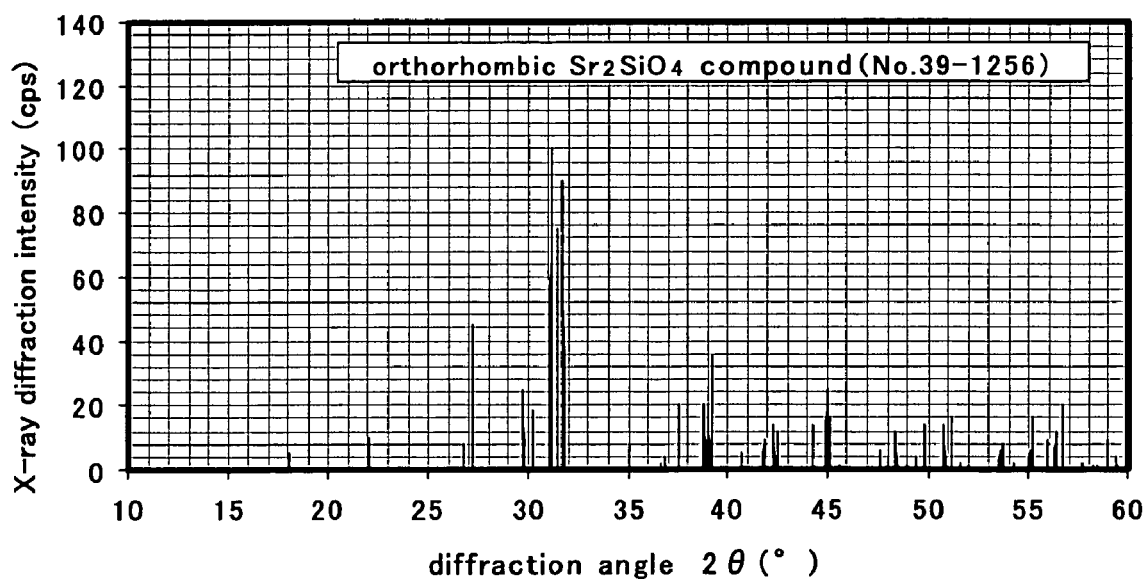
Figure 28A:
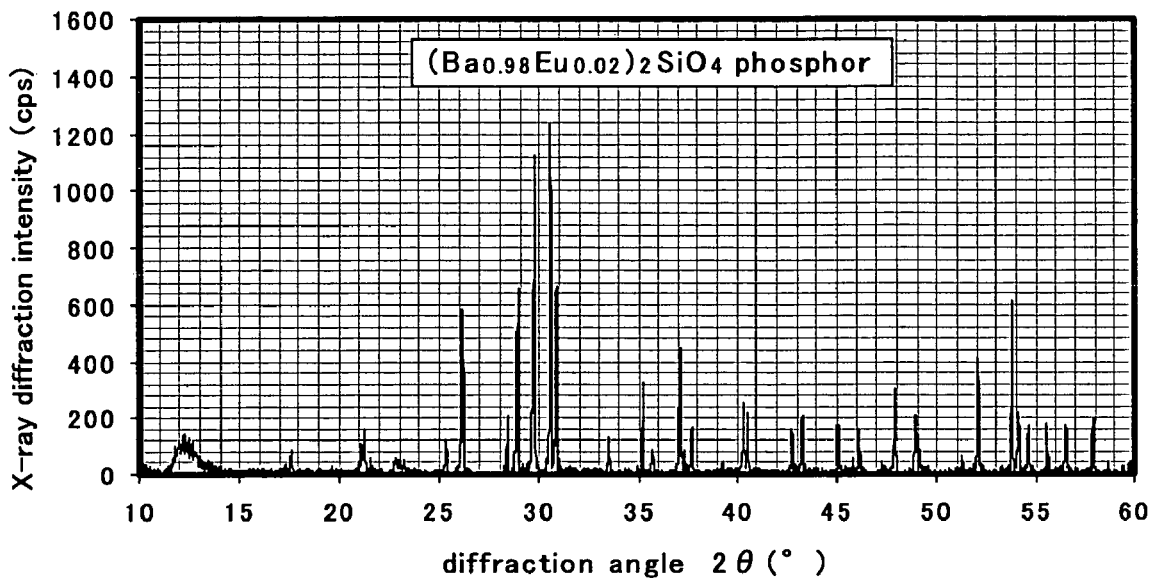
FIGS. 28(a) and 28(b) are X-ray diffraction patterns respectively showing a $(Ba_{0.98}Eu_{0.02})_2SiO_4$ phosphor containing neither Ca nor Sr and a known orthorhombic $Ba_2SiO_4$ compound.
Figure 28B:
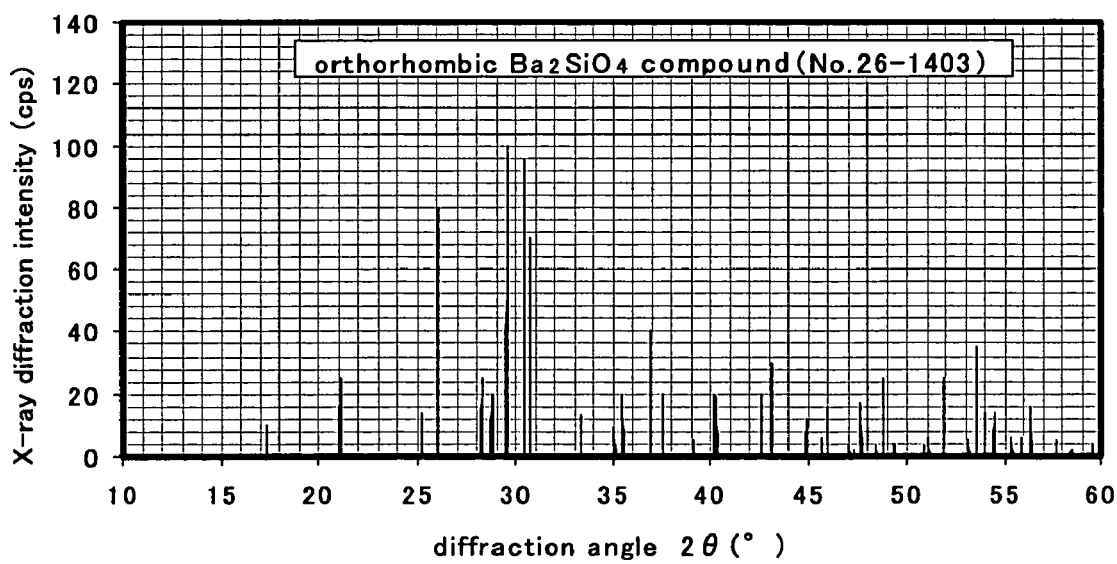
Figure 29A:
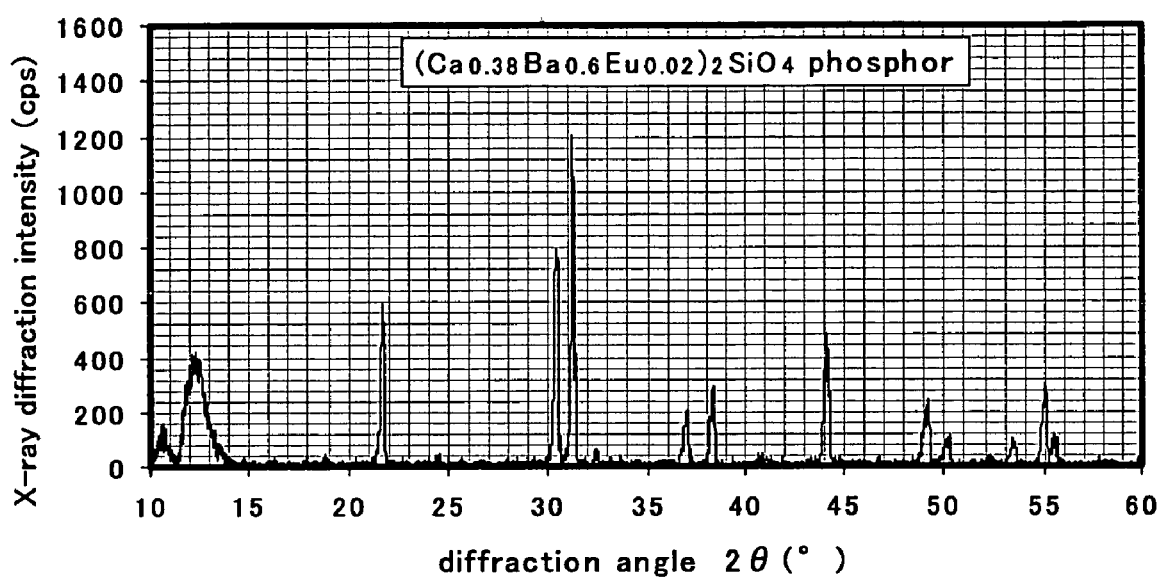
FIGS. 29(a) and 29(b) are X-ray diffraction patterns respectively showing a $(Ca_{0.38}Ba_{0.60}Eu_{0.02})_2SiO_4$ phosphor containing 38 at. % Ca and 60 at. % Ba and a known hexagonal $Ba_{0.3}Ca_{0.7}SiO_4$ compound.
Figure 29B:
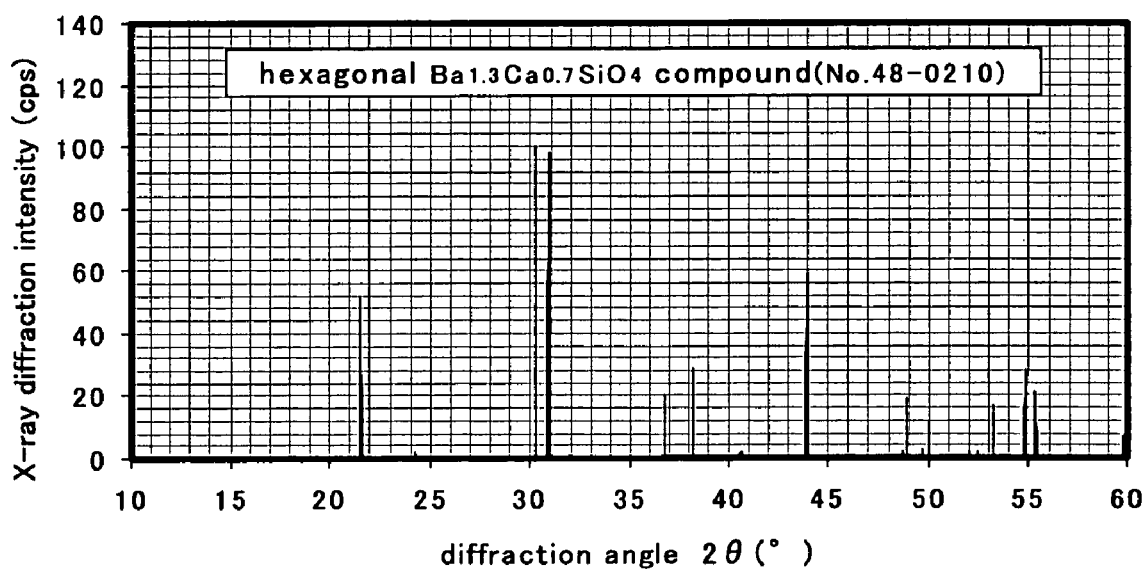
Figure 30A:
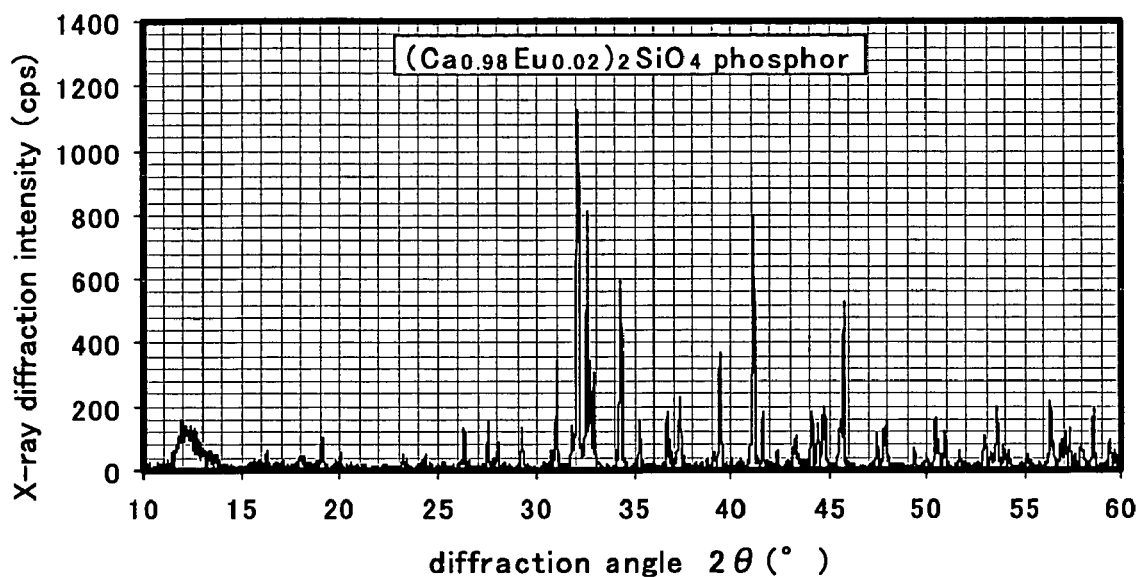
FIGS. 30(a) and 30(b) are X-ray diffraction patterns respectively showing a $(Ca_{0.98}Eu_{0.02})_2SiO_4$ phosphor containing neither Sr nor Ba and a publicly known monoclinic $Ca_2SiO_4$ compound.
Figure 30B:
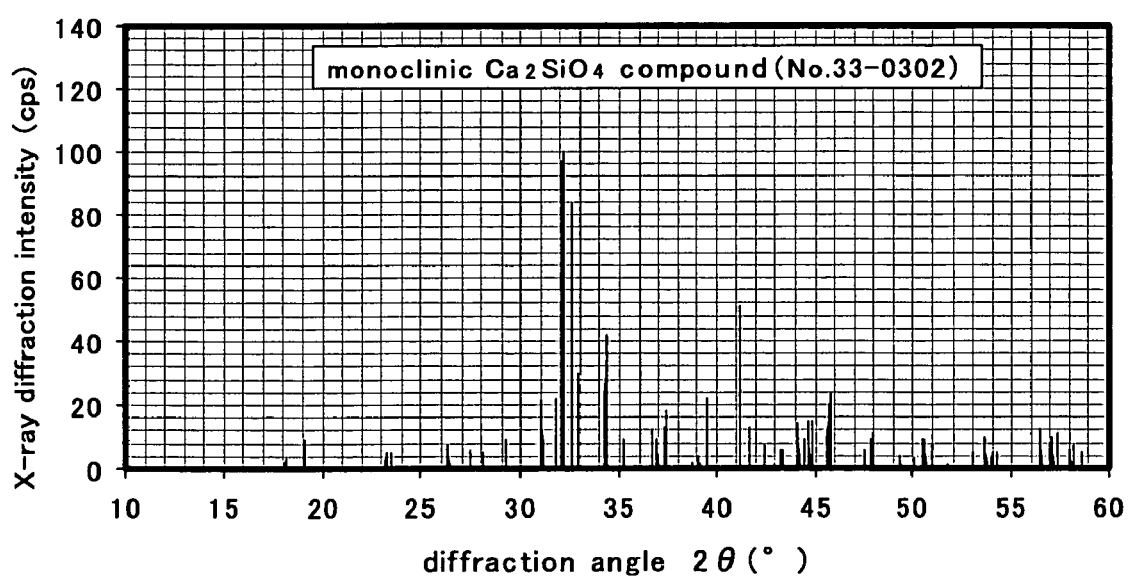

FIGS. 26(a) and 26(b) are X-ray diffraction patterns respectively showing a $(Sr_{0.98}Eu_{0.02})_2SiO_4$ phosphor containing neither Ca nor Ba and a publicly known monoclinic $Sr_2SiO_4$ compound. FIGS. 27(a) and 27(b) are X-ray diffraction patterns respectively showing a $(Sr_{0.93}Ba_{0.05}Eu_{0.02})_2SiO_4$ phosphor containing no Ca and containing 5 at. % Ba in terms of substitution amount and a publicly known orthorhombic $Sr_2SiO_4$ compound. FIGS. 28(a) and 28(b) are X-ray diffraction patterns respectively showing a $(Ba_{0.98}Eu_{0.02})_2SiO_4$ phosphor containing neither Ca nor Sr and a publicly known orthorhombic $Ba_2SiO_4$ compound. FIGS. 29(a) and 29(b) are X-ray diffraction patterns respectively showing a $(Ca_{0.38}Ba_{0.60}Eu_{0.02})_2SiO_4$ phosphor containing 38 at. % Ca and 60 at. % Ba and a publicly known hexagonal $Ba_{0.3}Ca_{0.7}SiO_4$ compound. FIGS. 30(a) and 30(b) are X-ray diffraction patterns respectively showing a $(Ca_{0.98}Eu_{0.02})_2SiO_4$ phosphor containing neither Sr nor Ba and a publicly known monoclinic $Ca_2SiO_4$ compound.

These X-ray diffraction patterns show data measured at room temperature and atmospheric pressure. FIGS. 26(b), 27(b), 28(b), 29(b) and 30(b) show data on compounds publicly known by JCPDS (Joint Committee on Powder Diffraction Standards) card and indicate respective numbers of the compounds. Comparisons of the X-ray diffraction patterns in FIGS. 26(a) through 30(a) with the corresponding X-ray diffraction patterns in FIGS. 26(b) through 30(b) show that the crystal structures of the phosphors formed in this example are a monoclinic system, an orthorhombic system, an orthorhombic system, a hexagonal system and a monoclinic system, respectively.

The relationship between the compositions and the main crystal structures of silicate phosphors are shown in FIG. 53. The (Si, Ba)$_2$SiO$_4$:Eu$^{2+}$ phosphors and the (Ca, Sr)$_2$SiO$_4$:Eu$^{2+}$ phosphors can be in the crystal structures of a monoclinic system and an orthorhombic system. The (Ca, Ba)$_2$SiO$_4$:Eu$^{2+}$ phosphors can be in the crystal structure of an orthorhombic system, a hexagonal system and a monoclinic system. The $(Sr, Ba, Ca)_2SiO_4:Eu^{2+}$ phosphors in which the substitution amount of Sr (=Sr/(Sr+Ba+Ca+Eu)) is 50 at. % or more have an orthorhombic structure.

With respect to the crystal structure, $(Sr_{1-a1-x}Ba_{a1}Eu_x)_2SiO_4$ phosphors are worthy of special remark. A pure $(Sr_{1-x}Eu_x)_2SiO_4$ phosphor containing no Ba has a monoclinic structure at least in the Eu concentration range $0 \leq x \leq 0.1$. However, if the $(Sr_{1-a1-x}Ba_{a1}Eu_x)_2SiO_4$ phosphor contains about 1 at. % or more Ba in terms of substitution amount (=Ba/(Sr+Ba+Ca+Eu)), the phosphor has an orthorhombic structure at least in the Eu concentration range $0 \leq x \leq 0.3$ (see FIG. 53).

Figure 31A:
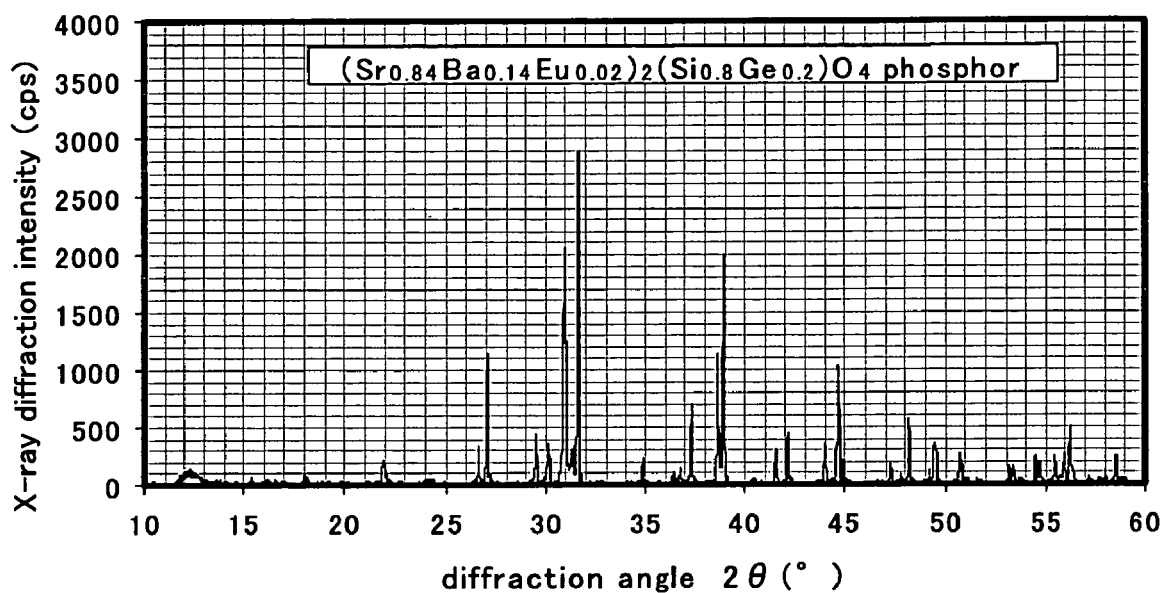
FIGS. 31(a) and 31(b) are X-ray diffraction patterns respectively showing a $(Sr_{0.84}Ba_{0.14}Eu_{0.2})_2(Si_{0.8}Ge_{0.2})O_4$ phosphor in which part of Si is substituted with Ge and a publicly known orthorhombic $Sr_2SiO_4$ compound.
Figure 31B:
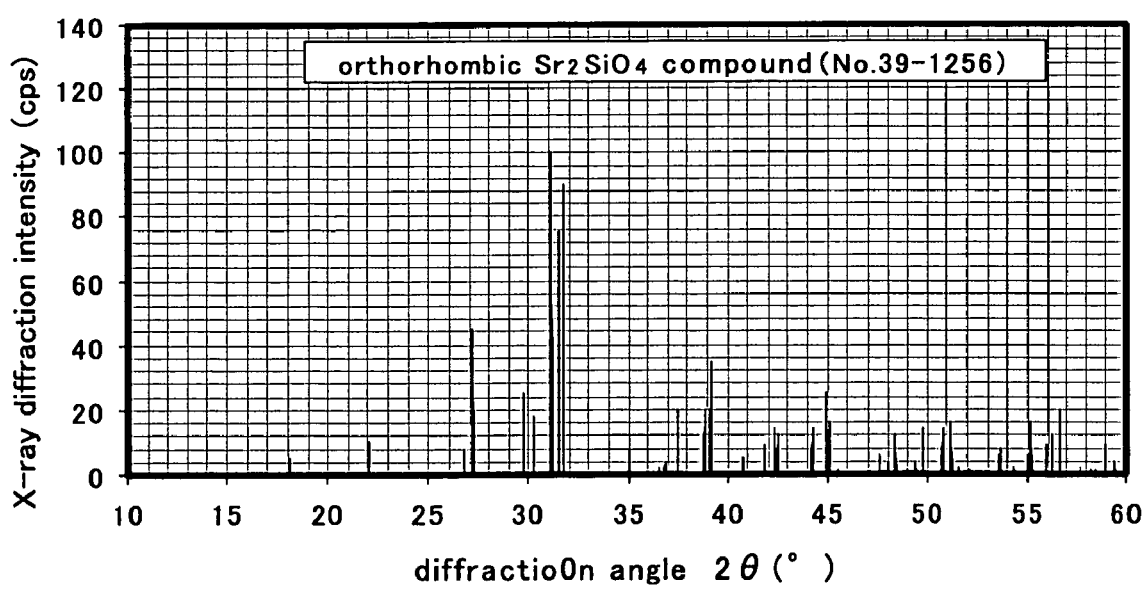

FIGS. 31(*a*) and 31(*b*) are X-ray diffraction patterns respectively showing a $(Sr_{0.84}Ba_{0.14}Eu_{0.02})_2(Si_{0.8}Ge_{0.2})O_4$ phosphor in which part of Si is substituted with Ge and a publicly known orthorhombic $Sr_2SiO_4$ compound. FIGS. 31(*a*) and 31(*b*) are used for reference and show patterns that coincide with each other. Accordingly, it is shown that the $(Sr_{0.84}Ba_{0.14}Eu_{0.02})_2(Si_{0.8}Ge_{0.2})O_4$ phosphor in which part of Si is substituted with Ge has an orthorhombic structure. Although experimental data is omitted, the $(Sr_{0.84}Ba_{0.14}Eu_{0.02})_2(Si_{0.8}Ge_{0.2})O_4$ phosphor in which part of Si is substituted with Ge has an orthorhombic structure in the entire range in which the Ge substitution amount (=Ge/(Si+Ge)) is 0 to 100 at. %.

Next, a relationship between the composition and the emission characteristics of each silicate phosphor in this example is described. The following descriptions are also about silicate phosphors each obtained by setting the Eu concentration (which is defined as Eu/(Sr+Ba+Ca+Eu)) at a typical value of 2 at. % and by being fired at 1400° C. in a reducing atmosphere for two hours.

Figure 32:
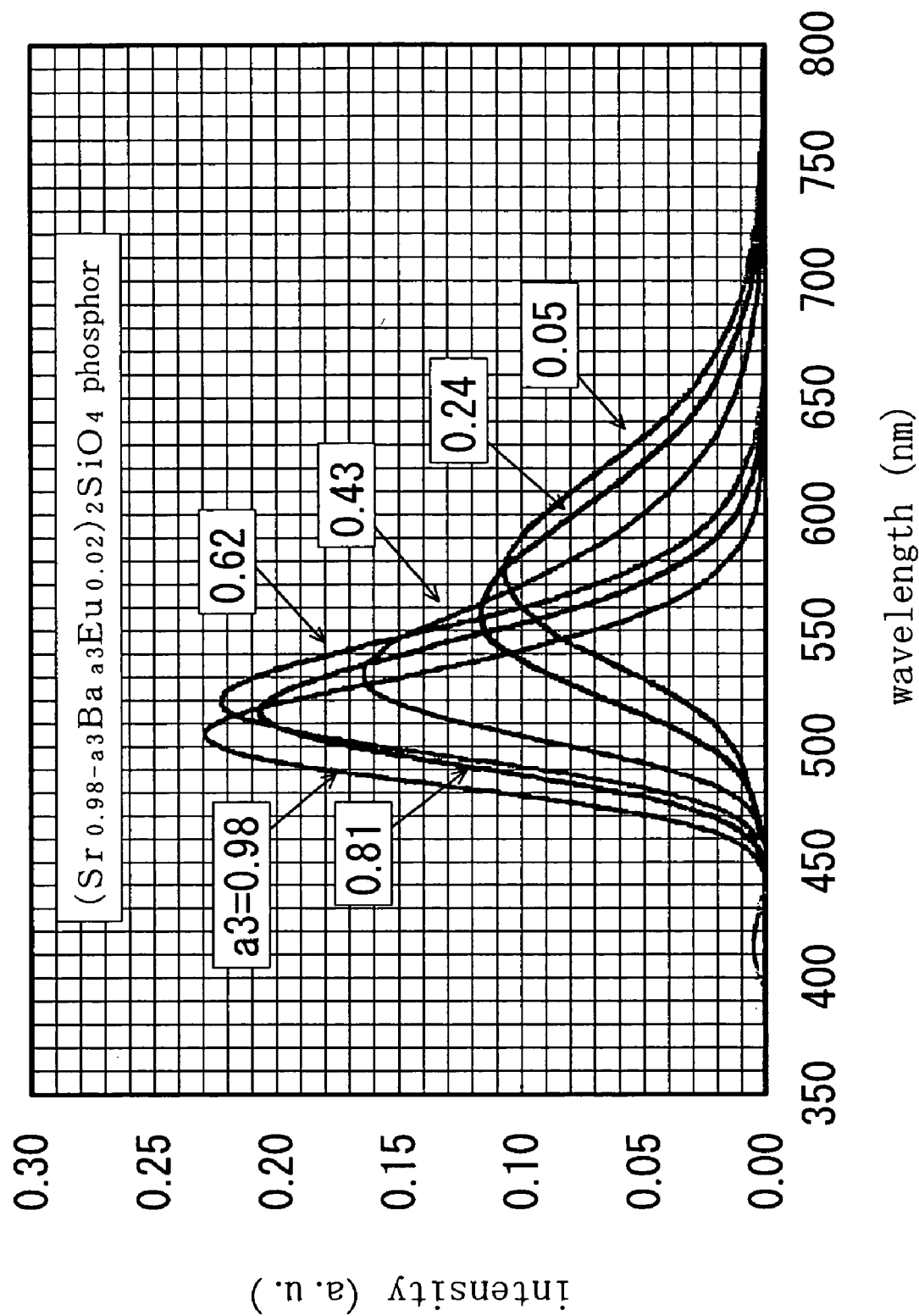
FIG. 32 is a graph showing emission spectra of $(Sr_{0.98-a3}Ba_{a3}Eu_{0.02})_2SiO_4$ phosphors having different Ba substitution amounts (a3).
Figure 33:
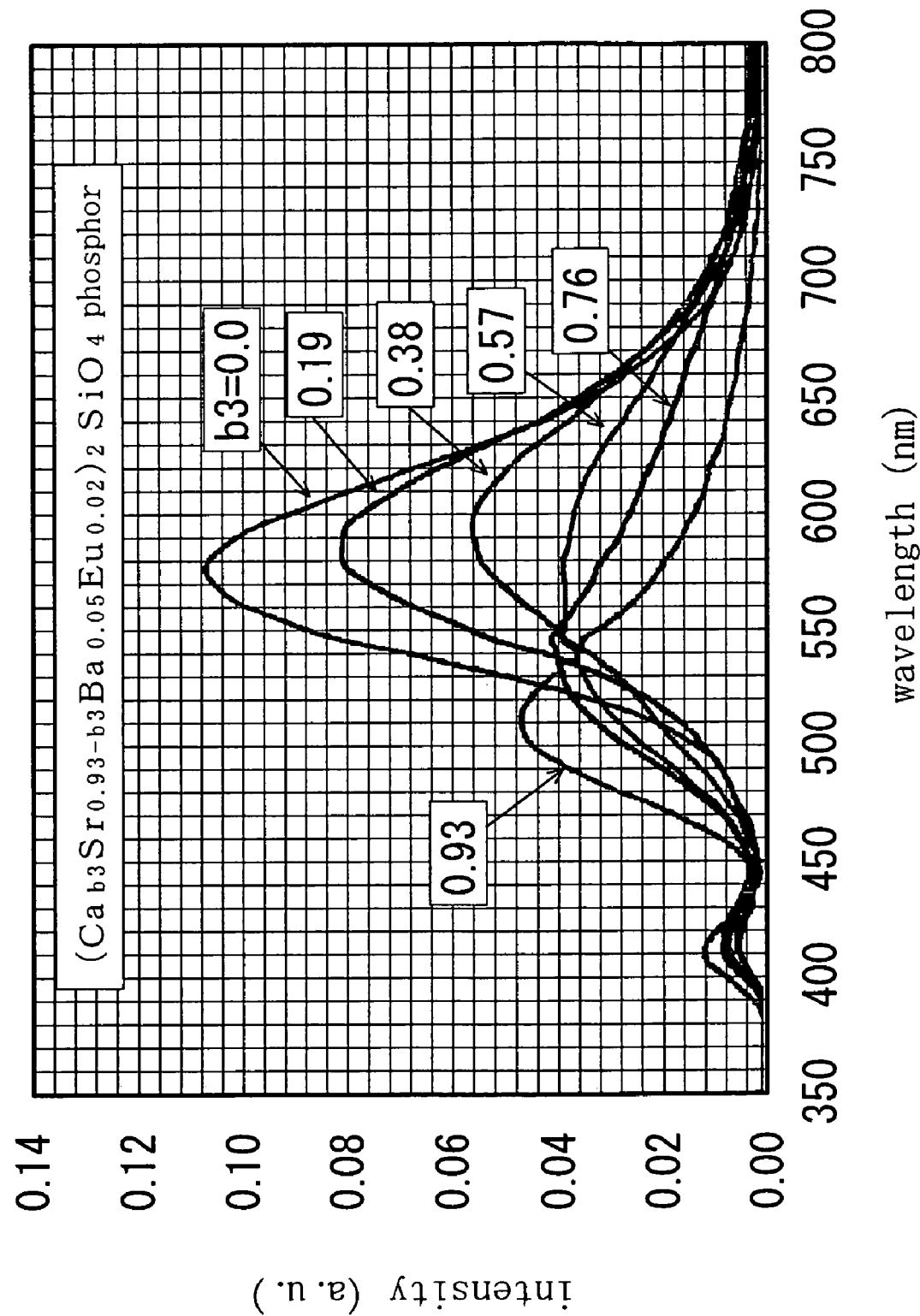
FIG. 33 is a graph showing emission spectra of $(Ca_{b3}Sr_{0.93-b3}Ba_{0.05}Eu_{0.02})_2SiO_4$ phosphors containing 5 at. % Ba in terms of substitution amount and having different Ca substitution amounts (b3).
Figure 34:
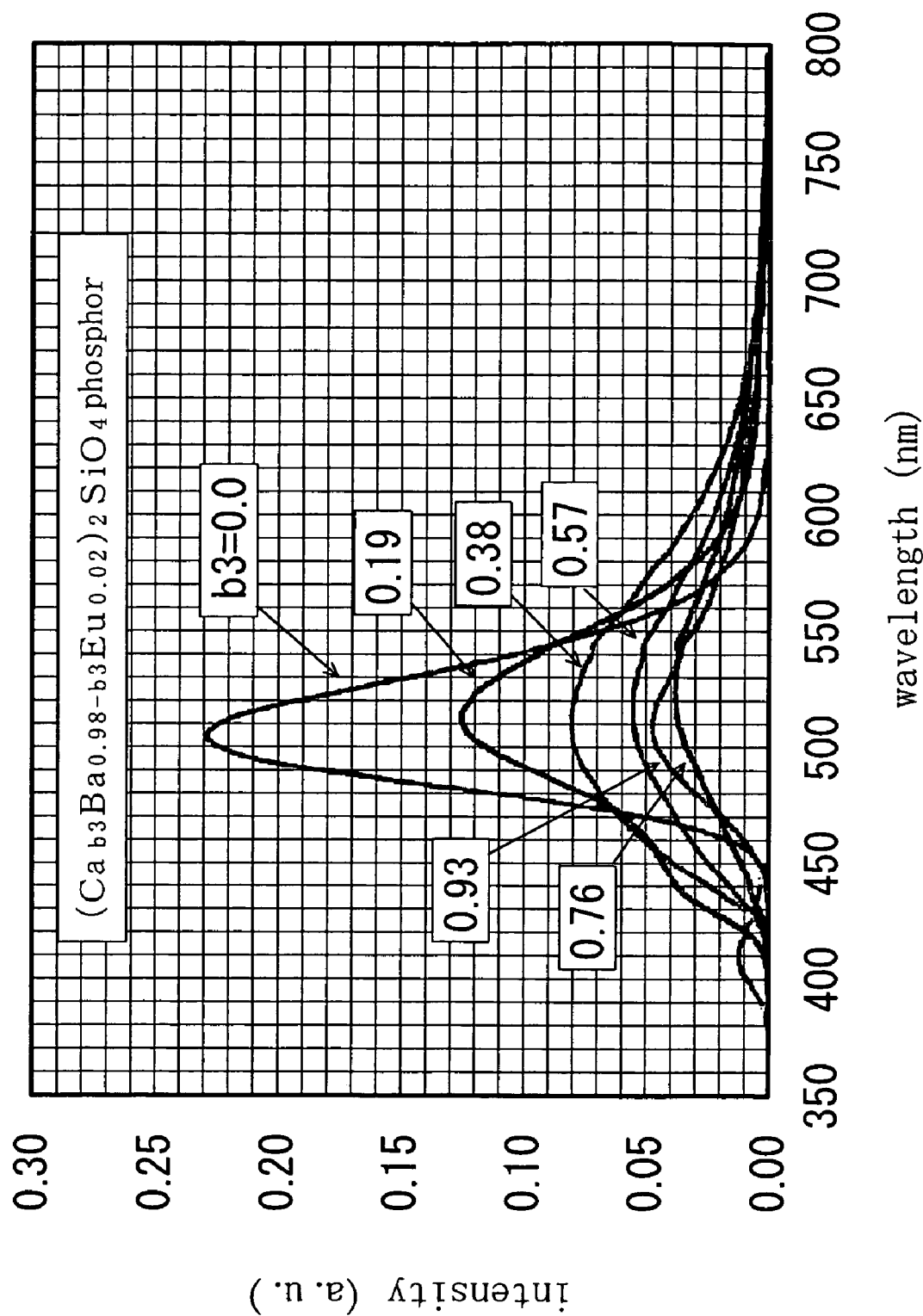
FIG. 34 is a graph showing emission spectra of $(Ca_{b3}Ba_{0.98-b3}Eu_{0.02})_2SiO_4$ phosphors having different Ca substitution amounts (b3).

FIG. 32 is a graph showing emission spectra of $(Sr_{0.98-a3}Ba_{a3}Eu_{0.02})_2SiO_4$ phosphors having different Ba substitution amounts (a3). FIG. 33 is a graph showing emission spectra of $(Ca_{b3}Sr_{0.98-b3}Ba_{0.05}Eu_{0.02})_2SiO_4$ phosphors containing 5 at. % Ba in terms of substitution amount and having different Ca substitution amounts (b3). FIG. 34 is a graph showing emission spectra of $(Ca_{b3}Ba_{0.98-b3}Eu_{0.02})_2SiO_4$ phosphors having different Ca substitution amounts (b3). FIGS. 32 through 34 are graphs for use in reference.

Figure 35:
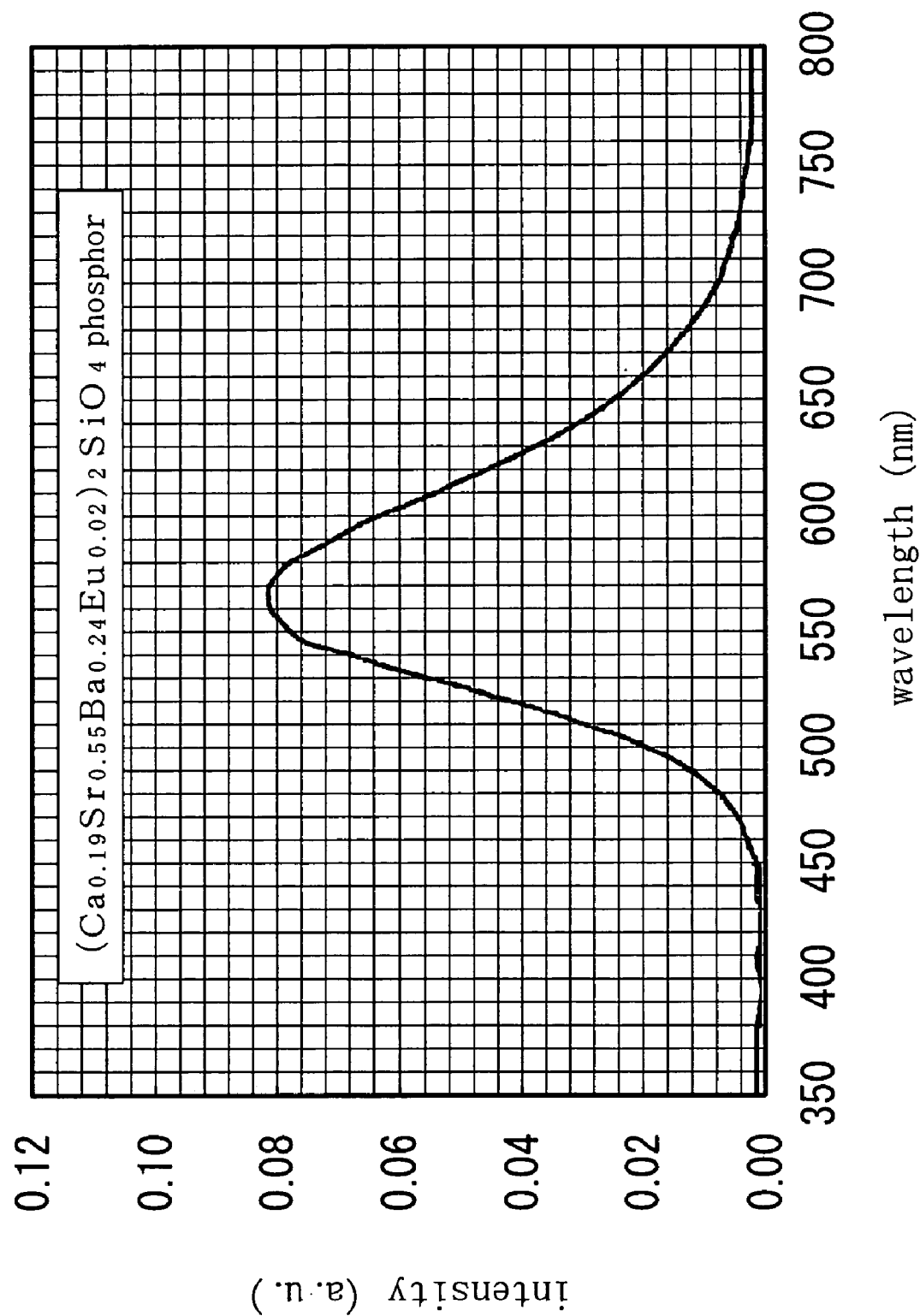
FIG. 35 is a graph showing emission spectra of $(Ca_{0.19}Sr_{0.55}Ba_{0.24}Eu_{0.02})_2SiO_4$ phosphor in which the Ca substitution amount (b3) is 19 at. % and the Ba substitution amount (a3) is 24 at. %.

FIG. 35 is a graph showing emission spectra of $(Ca_{0.19}Sr_{0.55}Ba_{0.24}Eu_{0.02})_2SiO_4$ phosphor in which the Ca substitution amount (b3) is 19 at. % and the Ba substitution amount (a3) is 24 at. %. Data shown in FIG. 35 is obtained by combining the results measured under the excitation with ultraviolet radiation having a wavelength of 254 nm together, for convenience in experiments.

Comparison of the emission spectra under excitation by blue light, and excitation by ultraviolet radiation with a wavelength of 254 nm shows that the emission spectra are similar to each other, though the comparison was made for only part of the samples.

Although the excitation-light spectra of the respective silicate phosphors are not shown, it is confirmed through visual observations that the inventive $(Sr_{1-a3-b3-x}Ba_{a3}Ca_{b3}Eu_x)_2SiO_4$ silicate phosphor is a phosphor which can emit blue-green, green, yellow to orange light when excited by at least blue light with a main emission peak wavelength of 470 nm in the entire composition range in varying degrees and which has a main emission peak wavelength in the range from 505 nm to 598 nm.

Among the $(Sr_{1-a3-b3-x}Ba_{a3}Ca_{b3}Eu_x)_2SiO_4$ silicate phosphors, a relatively high luminous efficacy is observed especially in those which contain a large proportion of Si.

Figure 36:
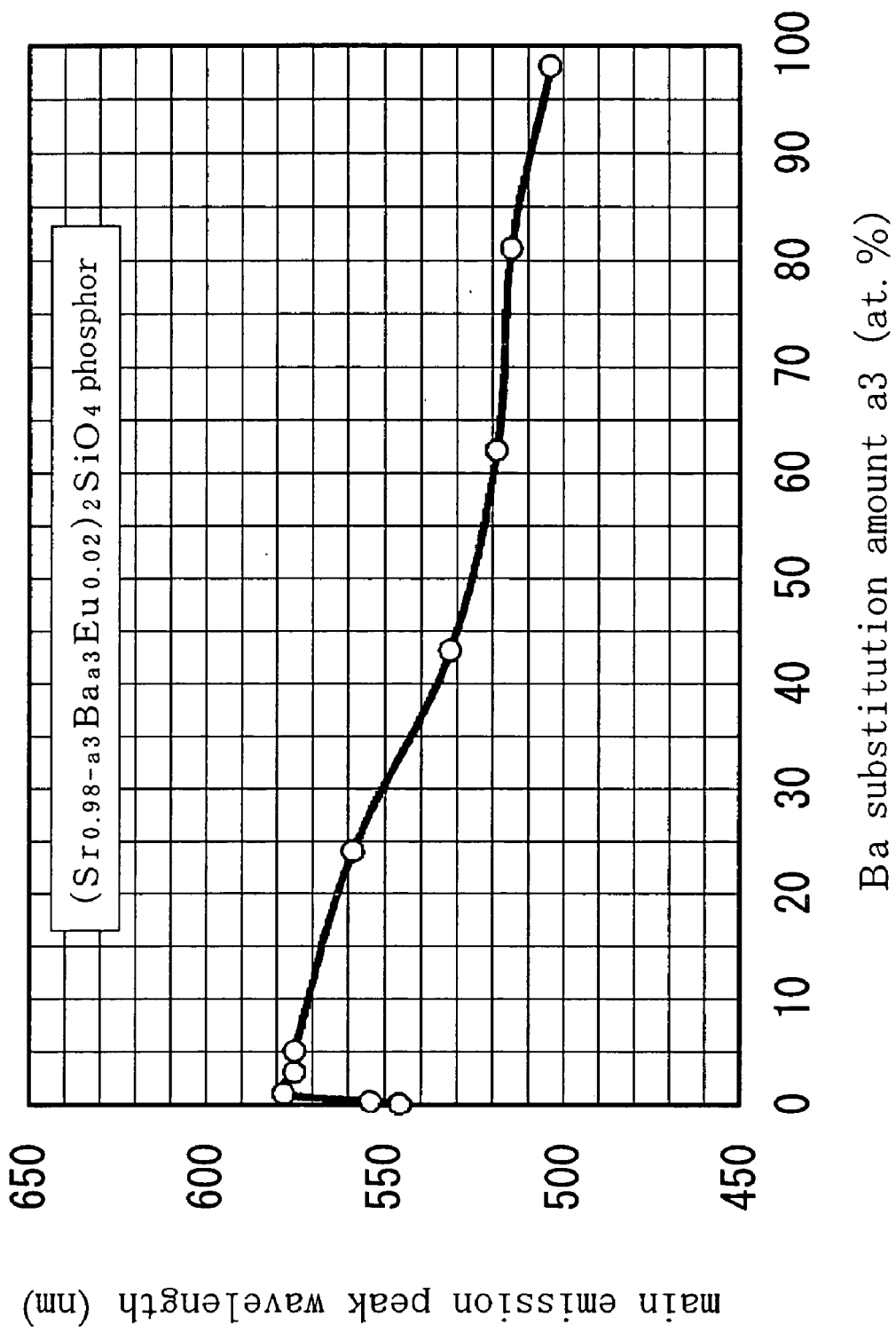
FIG. 36 is a graph showing a dependence of the main emission peak wavelength on the Ba substitution amount (a3) in a $(Sr_{0.98-a3}Ba_{a3}Eu_{0.02})_2SiO_4$ phosphor (a silicate phosphor).

FIG. 36 is a graph showing a dependence of the main emission peak wavelength on the Ba substitution amount (a3) in a $(Sr_{0.98-a3}Ba_{a3}Eu_{0.02})_2SiO_4$ phosphor (silicate phosphor). FIG. 53 also shows a relationship between the Ba substitution amount (a3) and the main emission peak wavelength in the $(Sr_{0.98-a3}Ba_{a3}Eu_{0.02})_2SiO_4$ phosphor. As can be seen from these drawings, in the range of the Ba substitution amount in the silicate phosphor greater than or equal to 0 at. % and less than 0.3 at. %, the silicate phosphor has a main emission peak wavelength around 535 to 545 nm and emits green light. On the other hand, in the Ba substitution amount range from 0.3 at. % to 24 at. %, both inclusive, the silicate phosphor has a main emission peak wavelength in the yellow range from 550 nm to 600 nm, both inclusive, and emits yellow/yellowish light. Considering experimental errors, effects of an impurity and the characteristics under special conditions such as high-temperature environment, for example, it is conjectured that the silicate phosphor in which the Ba substitution amount is in the range from 0 at. % to about 30 at. %, both inclusive, can emit yellow/yellowish light.

Figure 37:
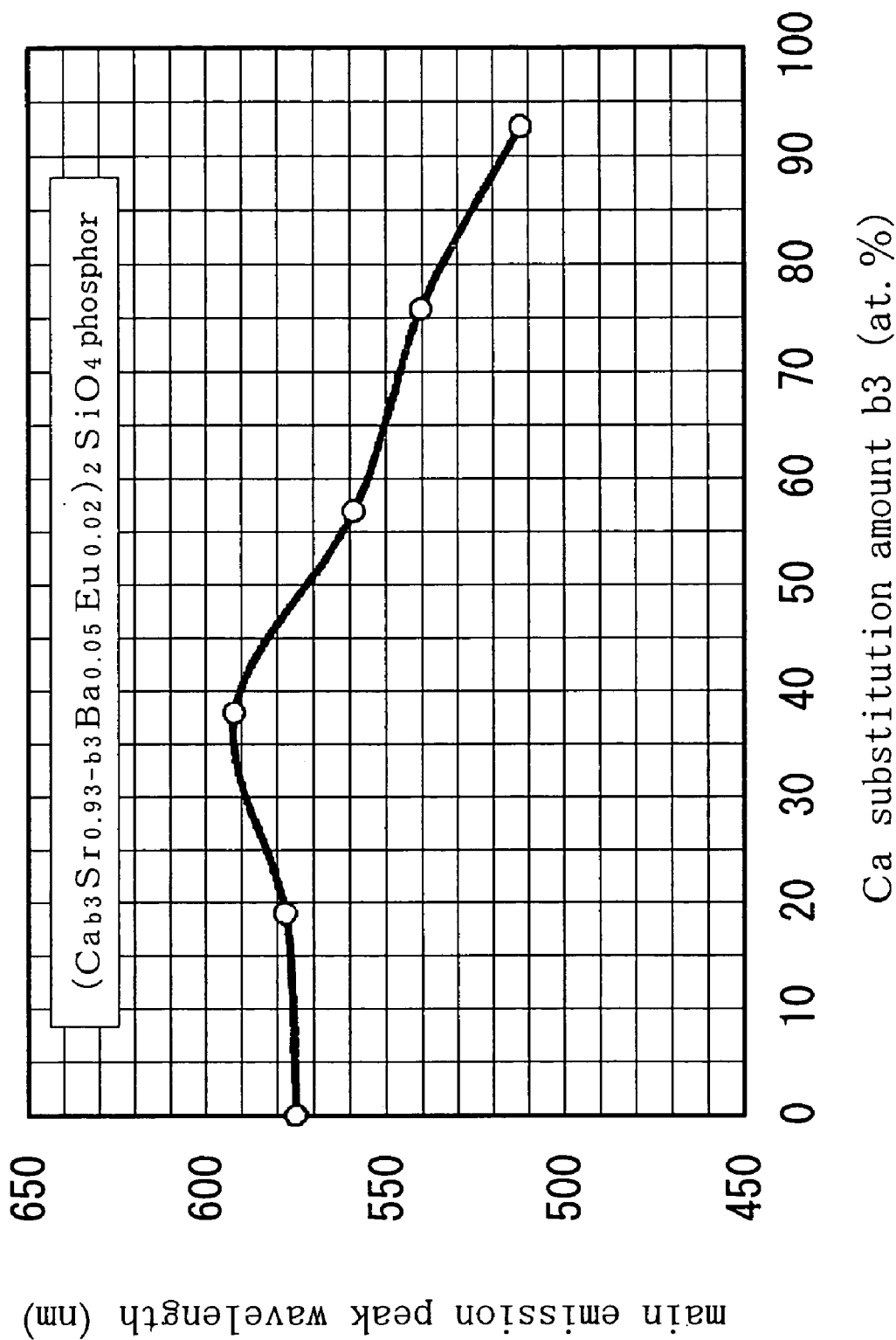
FIG. 37 is a graph showing a dependence of the main emission peak wavelength on the Ca substitution amount (b3) in a $(Ca_{b3}Sr_{0.93-b3}Ba_{0.05}Eu_{0.02})_2SiO_4$ phosphor (a silicate phosphor).

FIG. 37 is a graph showing a dependence of the main emission peak wavelength of on the Ca substitution amount (b3) in a $(Ca_{b3}Sr_{0.98-b3}Ba_{0.05}Eu_{0.02})_2SiO_4$ phosphor (a silicate phosphor). As shown in FIG. 37, in the range of the Ca substitution amount between 0 at. % and 57 at. %, both inclusive, the silicate phosphor has a main emission peak wavelength in the yellow range from 550 nm to 600 nm, both inclusive. The silicate phosphor in which the Ca substitution amount is in the range equal to or less than about 70 at. % emits yellow/yellowish light. Considering, for example, experimental errors, it is conjectured that the silicate phosphor $((Ca_{b3}Sr_{0.93-b3}Ba_{0.05}Eu_{0.02})_2SiO_4$ phosphor) in which the Ca substitution amount is in the range from 0 at. % to about 80 at. %, both inclusive, can emit yellow/yellowish light.

Figure 38:
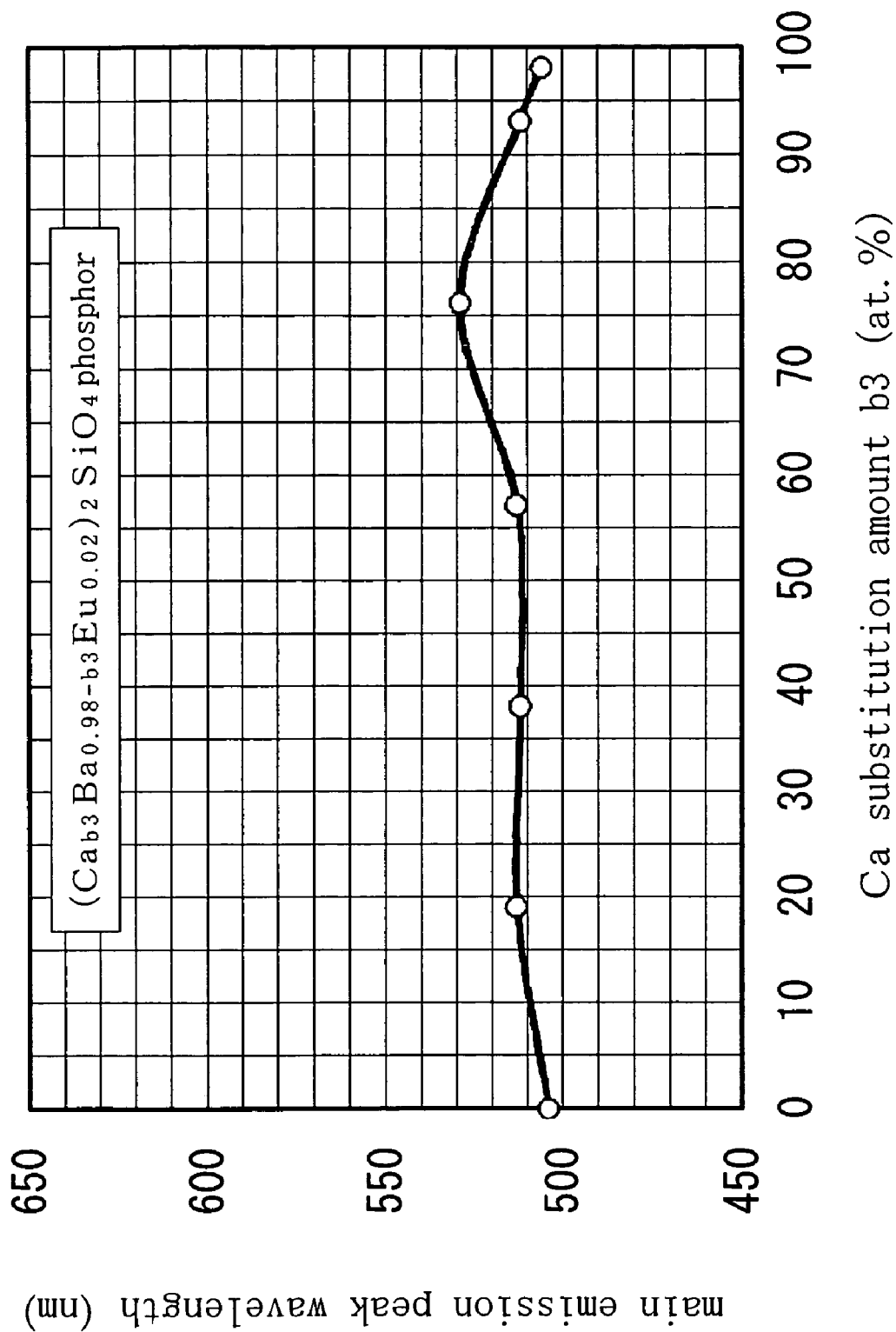
FIG. 38 is a graph showing a dependence of the main emission peak wavelength on the Ca substitution amount (b3) in a $(Ca_{b3}Ba_{0.98-b3}Eu_{0.02})_2SiO_4$ phosphor (a silicate phosphor).

FIG. 38 is a graph showing a dependence of the main emission peak wavelength on the Ca substitution amount (b3) in a $(Ca_{b3}Ba_{0.98-b3}Eu_{0.02})_2SiO_4$ phosphor (a silicate phosphor). As shown in FIG. 38, in the entire composition range of the $(Ca_{b3}Ba_{0.98-b3}Eu_{0.02})_2SiO_4$ phosphor, the $(Ca_{b3}Ba_{0.98-b3}Eu_{0.02})_2SiO_4$ phosphor has a main emission peak wavelength in the green range greater than or equal to 500 nm and less than 550 nm and emits not yellow/yellowish light but green/greenish light.

As can be seen from the emission spectrum shown in FIG. 35, a $(Ca_{0.19}Sr_{0.55}Ba_{0.24}Eu_{0.02})_2SiO_4$ phosphor has a main emission peak wavelength in the yellow range from 50 nm to 600 nm, both inclusive, and emits yellow/yellowish light.

In summary, yellow/yellowish light is obtained from a silicate phosphor which is limited in composition range, i.e., the Ba substitution amount (a3) is in the range $0 \leq a3 \leq 0.3$ and the Ca substitution amount (b3) is in the range $0 \leq b3 \leq 0.8$. It is preferable that the Ba substitution amount (a3) is in the range $0 < a3 \leq 0.2$ and the Ca substitution amount (b3) is in the range $0 < b3 \leq 0.7$. As can be seen from FIG. 53, every silicate phosphor whose composition is in these ranges has an orthorhombic structure.

Figure 39:
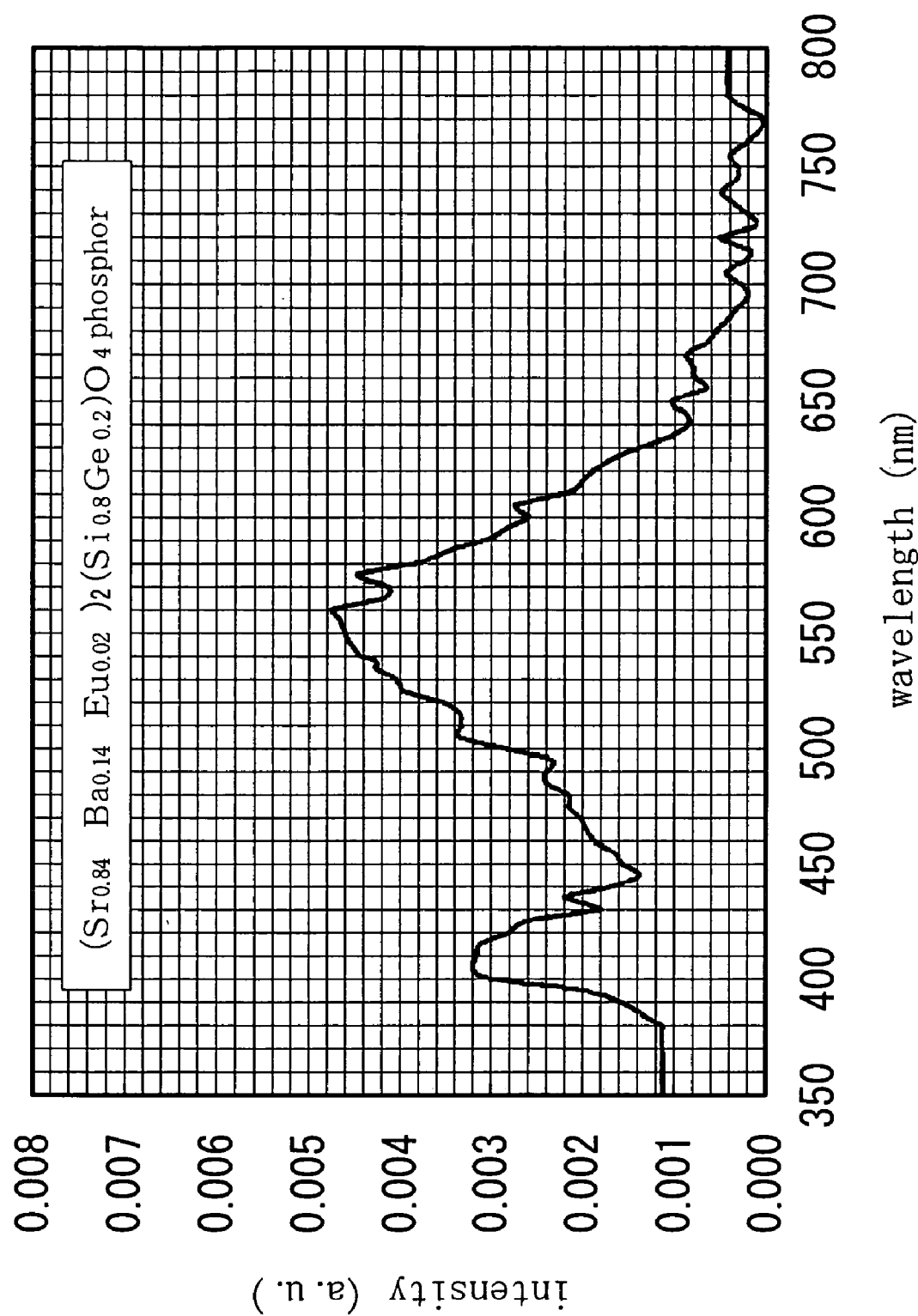
FIG. 39 is a graph showing an emission spectrum of a $(Sr_{0.84}Ba_{0.14}Eu_{0.02})_2(Si_{0.8}Ge_{0.2})O_4$ phosphor in which part of Si is substituted with Ge, for reference.

FIG. 39 is a graph showing an emission spectrum of a $(Sr_{0.84}Ba_{0.14}Eu_{0.02})_2(Si_{0.8}Ge_{0.2})O_4$ phosphor in which part of Si is substituted with Ge, for reference. As shown in FIG. 39, this phosphor can also emit light when excited by blue light and the luminous intensity thereof decreases largely as the Ge substitution amount (=Ge/(Si+Ge)) increases. However, at least in the Ge substitution amount range from 20 at. % to 100 at. %, the light emitted by the phosphor is yellow-green (main emission peak wavelength: about 550 nm).

Next, a relationship among the $Eu^{2+}$-luminescent-center concentration (=Eu/(Sr+Ba+Ca+Eu): equal to Eu concentration), the crystal structure and the emission characteristics of each silicate phosphor is described. The following descriptions are about silicate phosphors each having the composition of $(Sr_{1-x}Eu_x)_2SiO_4$ or $(Sr_{0.95-x}Ba_{0.05}Eu_x)_2SiO_4$ and obtained by being fired at 1400° C. in a reducing atmosphere for two hours.

Figure 40:
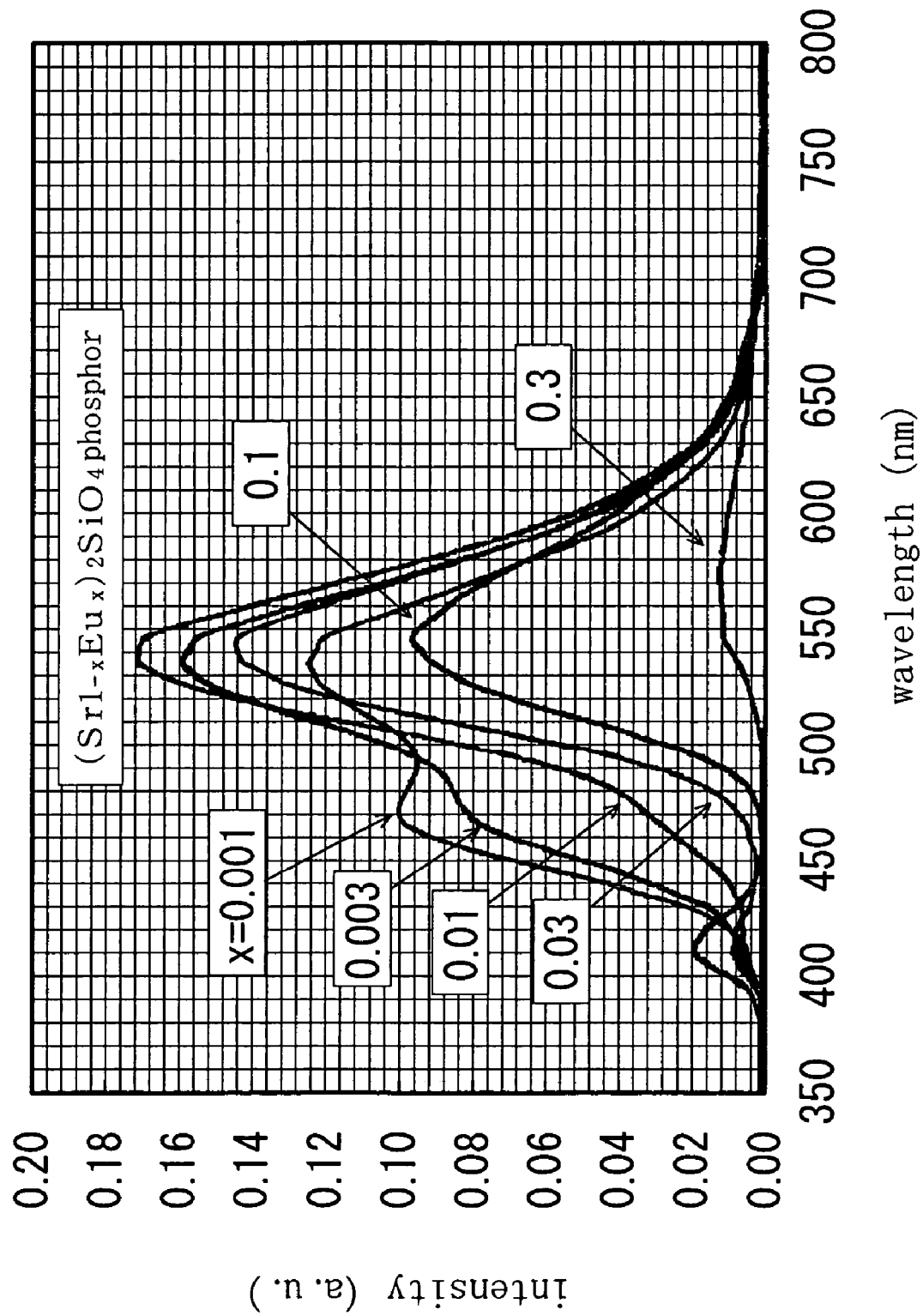
FIG. 40 is a graph showing emission spectra of $(Sr_{1-x}Eu_x)_2SiO_4$ phosphors having mutually different Eu concentrations (x) for reference.
Figure 41:
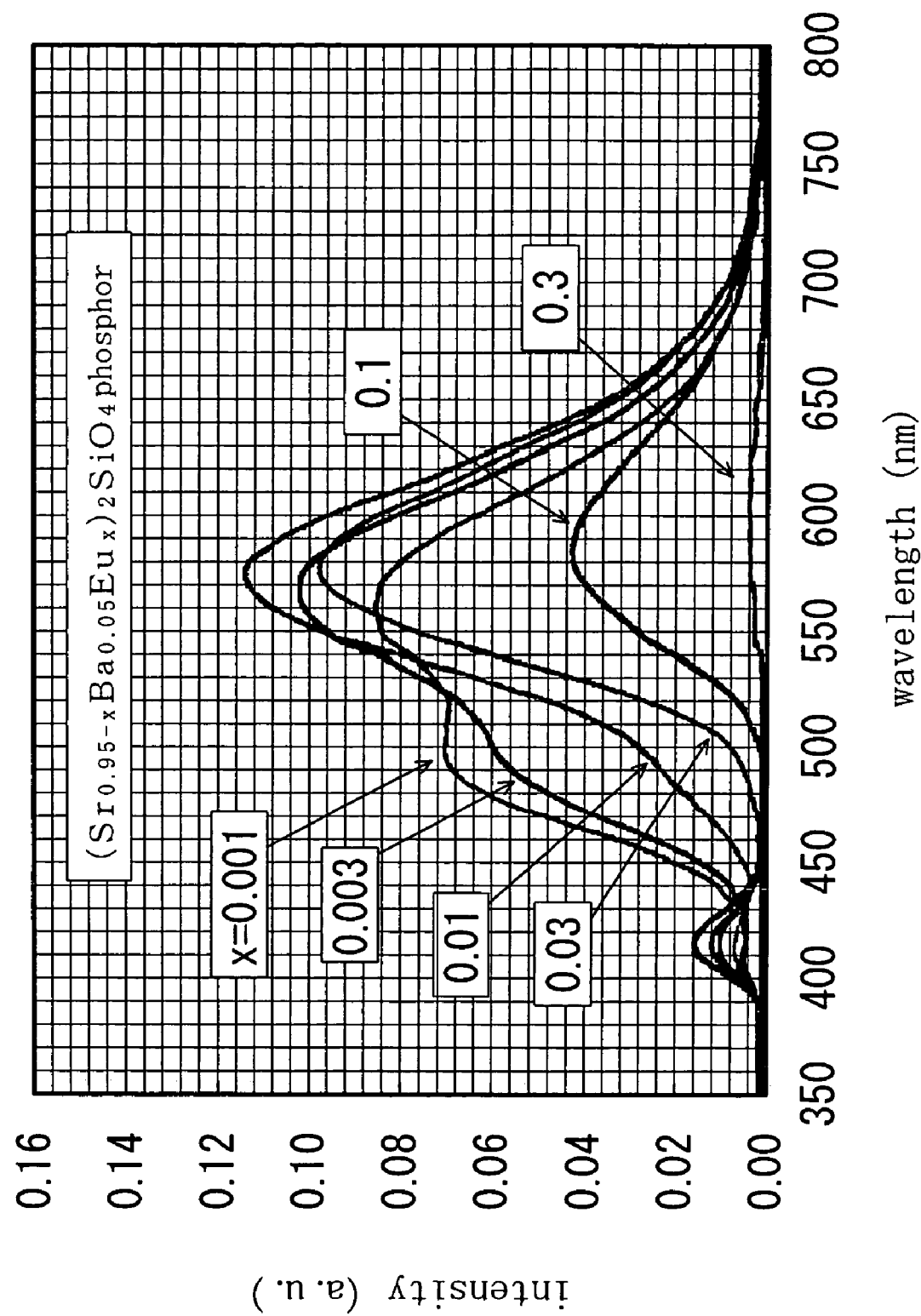
FIG. 41 is a graph showing emission spectra of $(Sr_{0.95-x}Ba_{0.05}Eu_x)_2SiO_4$ phosphors for reference.

FIG. 40 is a graph showing emission spectra of $(Sr_{1-x}Eu_x)_2SiO_4$ phosphors having mutually different Eu concentrations (x) for reference. FIG. 41 is a graph showing emission spectra of $(Sr_{0.95-x}Ba_{0.05}Eu_x)_2SiO_4$ phosphors for reference. Data shown in FIGS. 40 and 41 are each obtained as a result of a measurement under the excitation by ultraviolet radiation with a wavelength of 254 nm. Crystal structures of these phosphors are briefly described as follows. As a result of evaluation on a X-ray diffraction pattern, a $(Sr_{1-x}Eu_x)_2SiO_4$ phosphor in which at least the Eu concentration (x) is in the range $0 \leq x \leq 0.1$ has a monoclinic structure. A $(Sr_{0.95-x}Ba_{0.05}Eu_x)_2SiO_4$ phosphor in which at least the Eu concentration (x) is in the range $0 \leq x \leq 0.3$ and a $(Sr_{1-x}Eu_x)_2SiO_4$ phosphor in which at least the Eu concentration (x) is 0.3 have orthorhombic structures.

Figure 42:
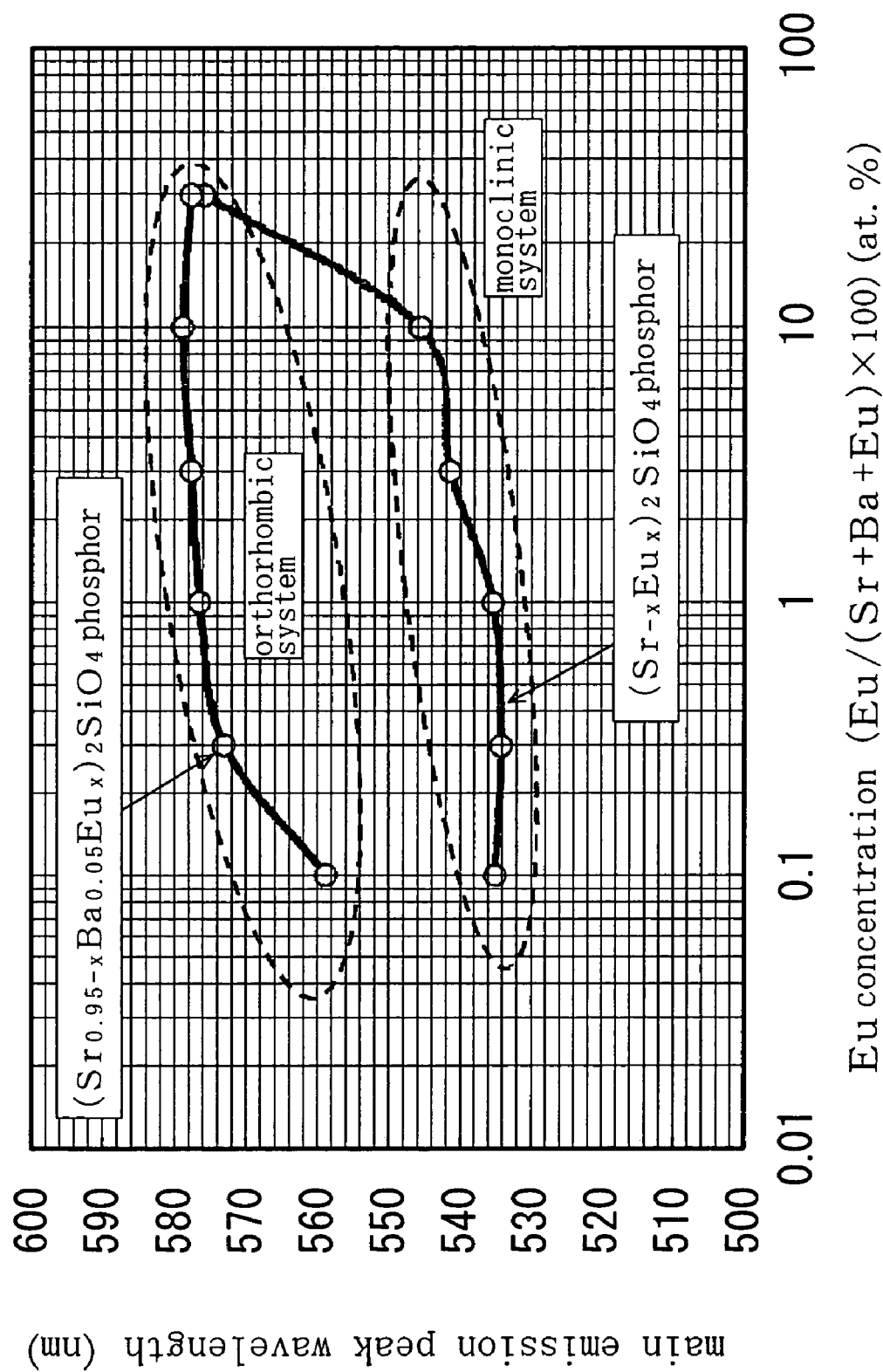
FIG. 42 is a graph showing respective dependences of the main emission peak wavelengths on the Eu concentrations of a $(Sr_{1-x}Eu_x)_2SiO_4$ phosphor and a $(Sr_{0.95-x}Ba_{0.05}Eu_x)_2SiO_4$ phosphor.

FIG. 42 is a graph showing respective dependences of the main emission peak wavelengths on the Eu concentrations in a $(Sr_{1-x}Eu_x)_2SiO_4$ phosphor and a $(Sr_{0.95-x}Ba_{0.05}Eu_x)_2SiO_4$ phosphor. As shown in FIG. 42, the crystal structures of the silicate phosphors descried above are correlated with colors of lights emitted therefrom. Specifically, a $(Sr_{1-x}Eu_x)_2SiO_4$ phosphor which has a monoclinic structure and in which at least the Eu concentration (x) is in the range $0.001 \leq x \leq 0.1$ has a main emission peak wavelength in the green range greater than or equal to 500 nm and less than 550 nm. On the other hand, a $(Sr_{0.95-x}Ba_{0.05}Eu_x)_2SiO_4$ phosphor which has an orthorhombic structure and in which at least the Eu concentration (x) is in the range $0.001 \leq x \leq 0.3$ and a $(Sr_{1-x}Eu_x)_2SiO_4$ phosphor which has an orthorhombic structure and in which at least the Eu concentration (x) is 0.3 have main emission peak wavelengths in the yellow range from 550 nm to 600 nm, both inclusive.

As can be seen from the experimental data, only orthorhombic silicate phosphors which are limited in composition as described above emit yellow/yellowish light observed when excited by ultraviolet radiation with a wavelength of 254 nm or the blue light.

From the foregoing experimental results, proper ranges of the respective elements of a silicate phosphor for achieving effects of the present invention are as follows.

Ba

Yellow light ranges between 550 nm and 600 nm, both inclusive, in wavelength. Therefore, from FIG. 32, it is understood that yellow wavelengths are obtained from the compound on condition that the Ba substitution amount has a mole fraction between 0.0 and 0.3. From the experimental results on a compound in which the Ba substitution amount has a mole fraction b of 0.24 and a compound in which the mole fraction b is 0.43, it is easily conjectured that yellow wavelengths are also obtained using a compound in which the mole fraction b is 0.3, though the experimental result thereof is not shown in FIG. 32.

FIG. 36 shows that yellow wavelengths are obtained from the compound on condition that the Ba substitution amount is between 0 and 30 at. %. From the experimental results of a compound in which the Ba substitution amount is 24 at. % and a compound in which the Ba substitution amount is 43 at. %, it is readily conjectured that yellow wavelengths are also obtained from a compound in which the Ba substitution amount is 30 at. %, though the experimental result thereof is not shown in FIG. 36.

Ca

FIG. 33 shows that an optimum condition for obtaining yellow wavelengths from the compound is that the Ca substitution amount has a mole fraction between 0.0 and 0.6. From the experimental results of a compound in which the Ca substitution amount has a mole fraction of 0.57 and a compound in which the mole fraction is 0.76, it is conjectured that yellow wavelengths are also obtained from a compound in which the Ca substitution amount has a mole fraction of 0.7, though the experimental result thereof is not shown. In addition, from the experimental results, it is conjectured that the emission peak wavelength of a compound in which the Ca substitution amount has a mole fraction of 0.8 deviates from the yellow wavelength range. However, considering experimental errors included, the condition for obtaining yellow wavelengths from a compound is considered that the Ca substitution amount has a mole fraction between 0.0 and 0.8, including 0.7 and 0.8, in addition to the condition that the Ca substitution amount has a mole fraction between 0.0 and 0.6.

FIG. 37 shows that yellow wavelengths are obtained from the compound on condition that the Ca substitution amount is between 0 and 80 at. %. From the experimental results in the cases where the Ca substitution amount is 57 at. % and where the Ca substitution amount is 76 at. %, it is conjectured that yellow wavelengths are also obtained in the case where the Ca substitution amount is 70 at. %, though the experimental result thereof is not shown. The experimental result shows that the main emission peak wavelength of a compound in which the Ca substitution amount is 80 at. % deviates from the yellow wavelength range, but the Ca substitution amount of 80 at. % is also included in the optimum conditions, considering experimental errors.

Sr

FIGS. 34 and 38 show that compounds containing no Sr do not emit yellow light.

Crystal Structure

FIG. 42 shows that a compound having a monoclinic structure does not achieve a yellow wavelength, irrespective of the Eu substitution amount, whereas a compound having an orthorhombic structure achieves a yellow wavelength, irrespective of the Eu substitution amount.

Eu

Figure 43:
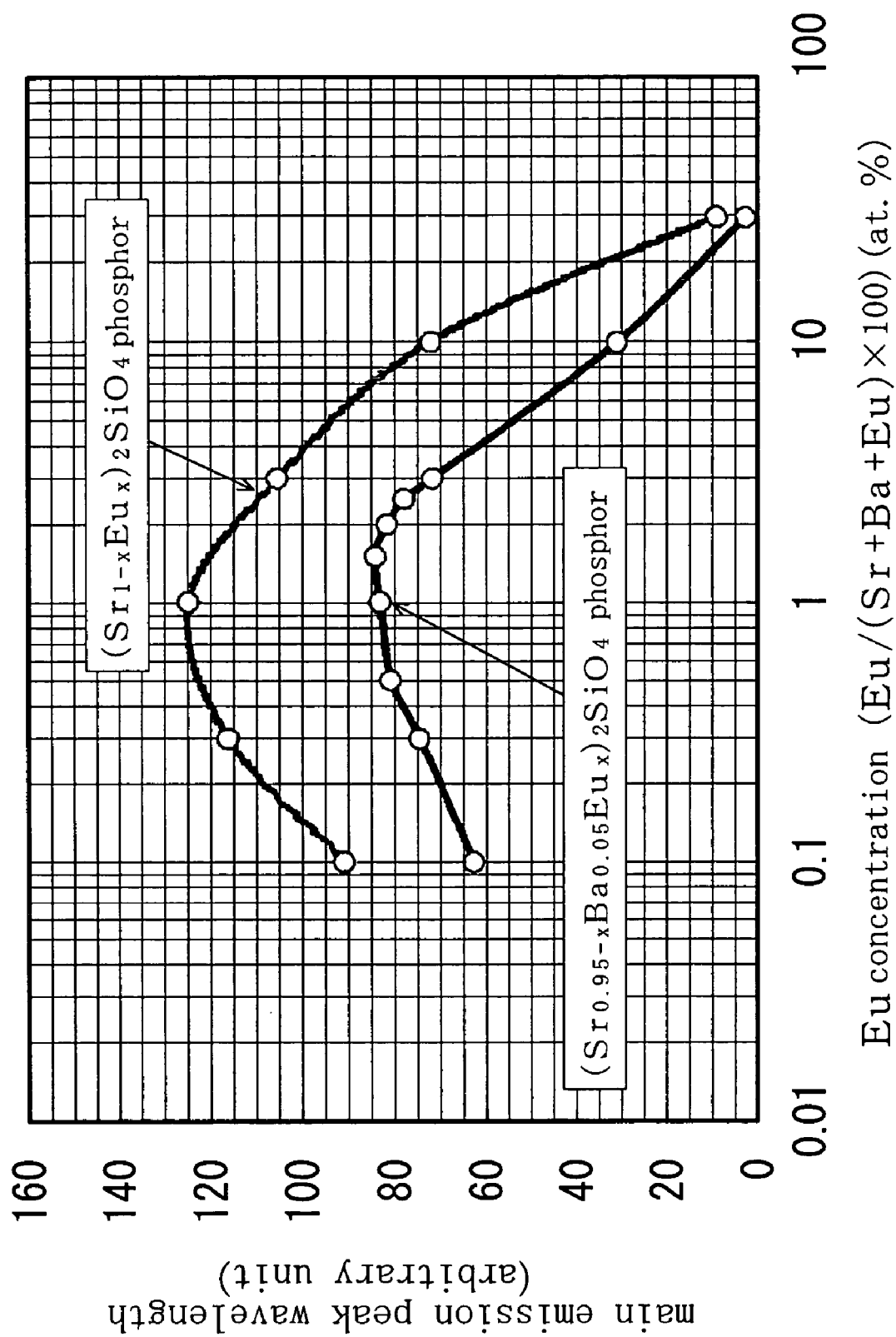
FIG. 43 is a graph showing an example of a relationship between luminescence characteristic of a phosphor and luminescent-center concentration.

FIG. 43 shows that a composition having an orthorhombic structure achieves a yellow wavelength, irrespective of the Eu substitution amount, and that the Eu substitution amount is preferably 10% or less in consideration of the emission peak height.

FIG. 43 shows a relationship between the Eu concentration and a luminous intensity (main emission peak intensity (height)). The luminous intensities of the $(Sr_{1-x}Eu_x)_2SiO_4$ and $(Sr_{0.95-x}Ba_{0.05}Eu_x)_2SiO_4$ phosphors exhibit the same tendency to increase as the Eu concentration increases, and to gradually decrease after the luminous intensity has reached the maximum value around the Eu concentration of 1 to 1.5 at. %. For such aspects as the luminous intensity, the shape of an emission spectrum and the chromaticity, the Eu concentration (mole fraction x) is preferably in the range $0.005 < x \leq 0.1$, more preferably in the range $0.01 < x \leq 0.05$ and most preferably in the range $0.01 < x \leq 0.02$, as shown in FIGS. 43, 41 and 53.

Now, a $Sr_2SiO_4:Eu^{2+}$, silicate phosphor and a $(BaSr)_2SiO_4:Eu^{2+}$ phosphor recited as green phosphors in Japanese Laid-Open Publication No. 2001-143869 and herein mentioned as prior art are described As has been described using the experimental data, so far as experiments done by the present inventors are concerned, the $Sr_2SiO_4$:$Eu^{2+}$ silicate phosphor is a phosphor which can be in two crystal structures of an orthorhombic system and a monoclinic system, depending on an impurity such as Ba contained in trace amounts. At least as far as the amount of addition of $Eu^{2+}$ luminescent centers practically used (=the number of Eu atoms/(the number of Sr atoms+the number of Eu atoms: x) is in the range 0.01<x<0.05 at room temperature and atmospheric pressure, an orthorhombic $Sr_2SiO_4$:$Eu^{2+}$ ($\alpha'$-$Sr_2SiO_4$:$Eu^{2+}$) is a yellow/yellowish phosphor emitting yellow/yellowish light at a main emission peak around the wavelength between 560 and 575 nm, and a monoclinic $Sr_2SiO_4$:$Eu^{2+}$ ($\beta'$-$Sr_2SiO_4$:$Eu^{2+}$) is a green phosphor emitting green light at a main emission peak around the wavelength between 535 and 545 nm (see FIGS. 42 and 53).

Experiments done by the present inventors also show that the main emission peak wavelength hardly varies if the Eu mole fraction (=Eu/(Sr+Eu) atomic percent) is in the practical range from 0.001 to 0.3, both inclusive (i.e., the range from 0.1 at. % to 30 at. %, both inclusive), especially in the range from 0.003 to 0.03, both inclusive. Therefore, the $Sr_2SiO_4$:$Eu^{2+}$ green phosphor recited in Japanese Laid-Open Publication No. 2001-143869 can be considered a monoclinic $Sr_2SiO_4$:$Eu^{2+}$ phosphor.

It is already publicly known that the crystal structure of a $Sr_2SiO_4$ compound can be in an orthorhombic system or a monoclinic system depending on a small amount of Ba contained (e.g., in G. PIEPER et al., Journal of the American Ceramic Society, Vol. 55, No. 12 (1972) pp. 619–622). It is also known that the crystal structure of a monoclinic $Sr_2SiO_4$ compound undergoes a reversible change into an orthorhombic system at about 383 K (see, for example, M. Catti et al., Acta Cryst., B39 (1983) pp. 674–679).

A compound in which the content percentage of Ba impurity atoms with respect to Sr atoms (Ba/(Sr+Ba) atomic percent, hereinafter referred to as Ba content) is about 1% or more, i.e., a compound having a Ba content higher than that of a $(Sr_{0.99}Ba_{0.01})_2SiO_4$:$Eu^{2+}$, has an orthorhombic structure and has a main emission peak wavelength varying from around 575 nm to around 505 nm as the Ba content increases (see FIGS. 32, 36 and 53). As can be seen from FIGS. 32, 36 and 53, among the silicate phosphors containing a component expressed by the chemical formula $(Sr_{0.98-a3}Ba_{a3}Eu_{0.02})_2SiO_4$ a as a main component (where the value a3 is in the range $0 \leq a3 \leq 0.98$), a $(Sr_{0.98-a3}Ba_{a3}Eu_{0.02})_2SiO_4$ silicate phosphor having the composition range $0.01 \leq a3 \leq 0.3$ is a yellow/yellowish phosphor having a main emission peak in the wavelength range from 550 nm to 600 nm, both inclusive, and a silicate phosphor having the composition range $0.3 < a3 \leq 0.98$ is a green/greenish phosphor having a main emission peak in the wavelength range greater than or equal to 505 nm and less than 550 nm, considering measurement errors in the experiments, for example.

Another experiment done by the present inventors shows that the main emission peak wavelength hardly varies so long as the Eu concentration has a practical mole fraction in terms of luminous intensity, i.e., is in the range from 0.001 to 0.3, both inclusive, especially in the range from 0.003 to 0.03, both inclusive. Therefore, the $(BaSr)_2SiO_4$:$Eu^{2+}$ green phosphor recited in Japanese Laid-Open Publication No. 2001-143869 can be considered a $(Sr_{1-a3-x}Ba_{a3}Eu_x)_2SiO_4$ silicate phosphor (where the value x is in the range $0.001 \leq x \leq 0.3$) having at least the composition range $0.3 < a3 \leq 0.98$.

Lastly, comparison results in emission characteristics between a silicate phosphor $((Ca_{0.015}Sr_{0.92}Ba_{0.05}Eu_{0.015})_2SiO_4$ phosphor which has an orthorhombic structure and emits yellow/yellowish light and in which the Eu concentration is optimized, and a YAG-based phosphor $((Y_{0.7}Gd_{0.28}Ce_{0.02})_3Al_5O_{12})$, are described.

—Luminance Characteristic Comparison Between YAG-Based Phosphor and Silicate Phosphor—

First, the difference in luminance characteristic between a light-emitting semiconductor device using a YAG-based phosphor and a light-emitting semiconductor device using a silicate phosphor is described.

FIG. 54 is a table showing experimental data on luminance characteristics for a light-emitting semiconductor device using a YAG-based phosphor and a light-emitting semiconductor device using a silicate phosphor. FIG. 54 refers to the type, weight percentage, luminance, total luminous flux, total radiant flux and chromaticity for each main phosphor material.

FIG. 54 shows that weight percentages enough to obtain yellow/yellowish light are slighter in the YAG-based phosphors (samples D and E) than in the silicate phosphors (the other samples). Specifically, in obtaining light around the chromaticity (0.35, 0.35), the YAG-based phosphors have phosphor weight percentages of 7.4% (sample D) and 9.8% (sample E), whereas samples A, B and C using silicate phosphors have phosphor weight percentage of about 50% and exhibit no decreased luminous flux. These facts show that in the YAG-based phosphors, the conversion efficiency for converting blue light between 410 nm and 530 nm, both inclusive, emitted by a blue LED into yellow/yellowish light between 550 nm and 600 nm, both inclusive, is lower than that in the silicate phosphors. That is to say, the conversion efficiency is high in the YAG-based phosphors, and only a small amount of phosphor is used in a luminescent layer to obtain yellow light with an appropriate intensity. As a result, it is considered that phosphor particles are liable to disperse unevenly in a base material. On the other hand, in the case of the silicate phosphors, a larger amount of phosphor is used in a light-emitting semiconductor device, and a substantially thick luminescent layer is formed in the light-emitting semiconductor device. As a result, it is considered that the thixotropy of the phosphor paste improves (i.e., the thixotropy index falls within a proper range), so that phosphor particles are less liable to disperse unevenly in a base material for the luminescent layer as well as the phosphor particles are kept to be dispersed and scattered evenly, resulting in that the occurrence of color unevenness is suppressed.

Then, weight percentages of the silicate phosphors are varied using samples F, G, H, I, J and K so as to measure effects on variations in luminance, chromaticity, total luminous flux and total radiant flux.

Figure 44:
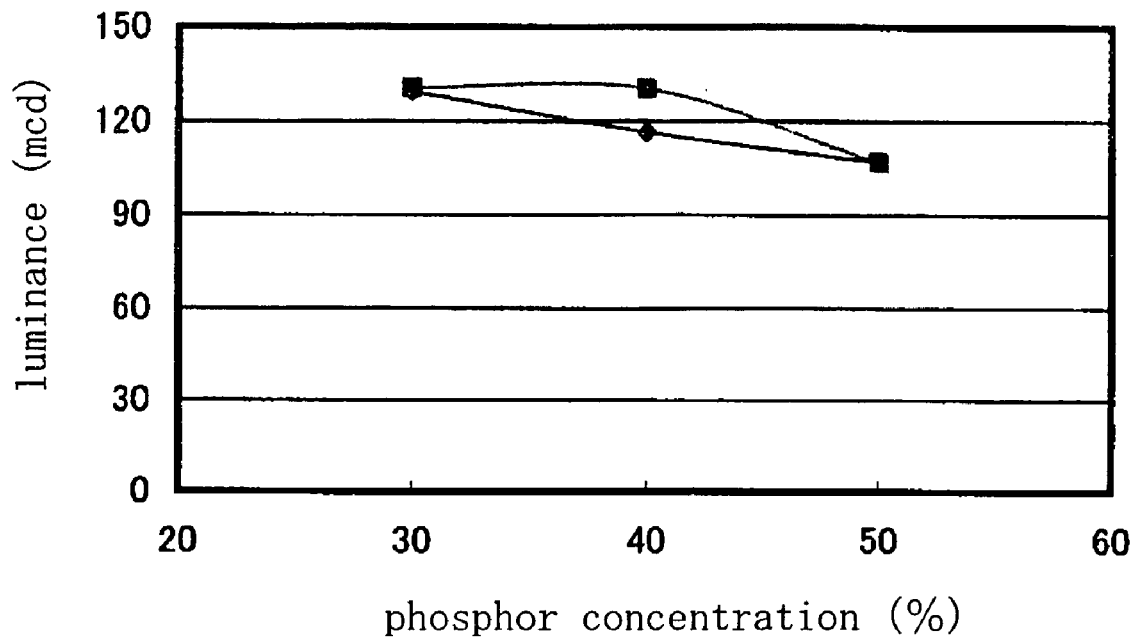
FIG. 44 is a graph showing a relationship between phosphor weight percent and luminance.
Figure 45:
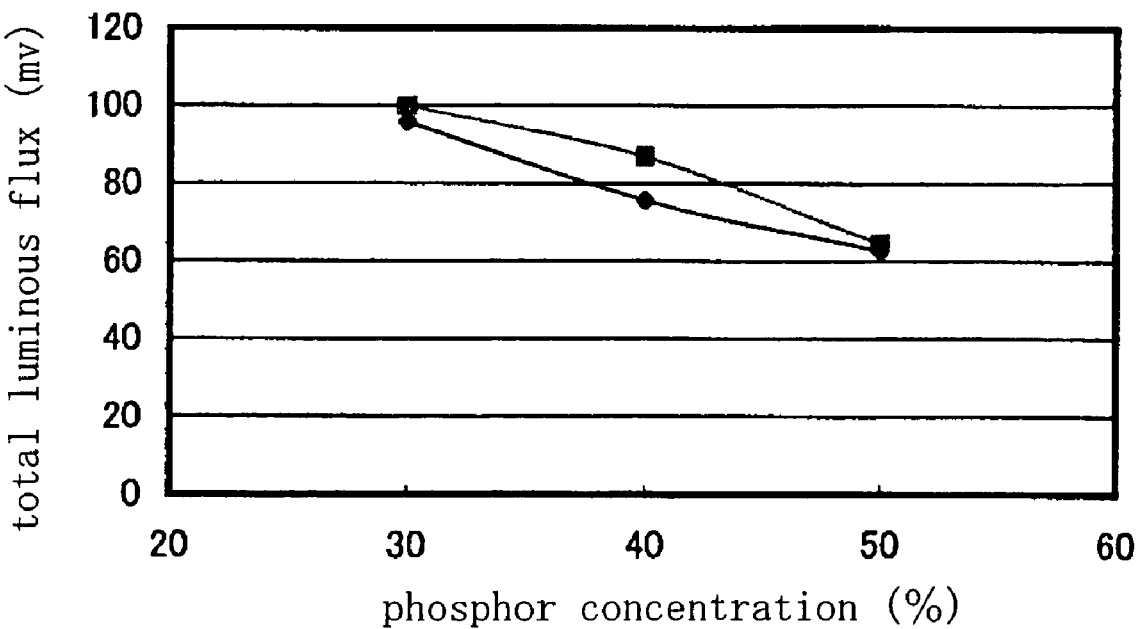
FIG. 45 is a graph showing a relationship between phosphor concentration and total luminous flux.
Figure 46:
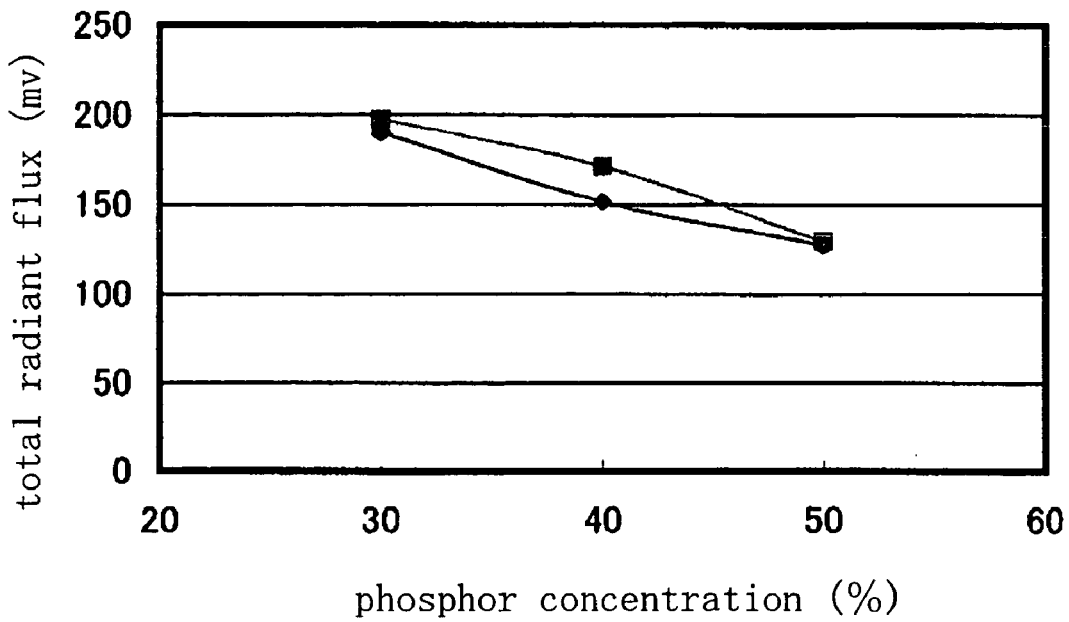
FIG. 46 is a graph showing a relationship between phosphor concentration and total radiant flux.
Figure 47:
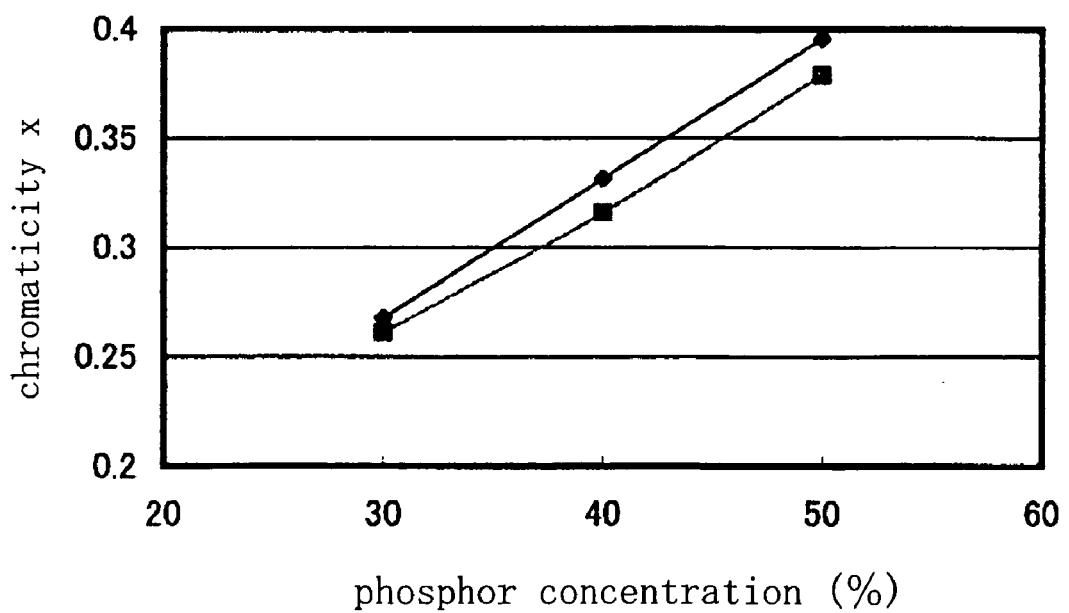
FIG. 47 is a graph showing a relationship between phosphor concentration and chromaticity (value x).

FIG. 44 is a graph showing a relationship between the phosphor concentration and the luminance. FIG. 45 is a graph showing a relationship between the phosphor concentration and the total luminous flux. FIG. 46 is a graph showing a relationship between the phosphor concentration and the total radiant flux. FIG. 47 is a graph showing a relationship between the phosphor concentration and the chromaticity (value x). FIGS. 44 through 47 are graphs showing respective results based on data shown in FIG. 54. FIGS. 44 through 47 show measurement values in the cases where the phosphor is 30 wt. %, 40 wt. % and 50 wt. %, respectively. As the weight percentage of the phosphor increases, the luminance, total luminous flux and total radiant flux tend to decrease. On the other hand, as the weight percentage of the phosphor increases, the chromaticity (value x) increases so that the luminescent tends to be yellower. Therefore, it can be said that the weight percentage of the phosphor is preferably 30% or higher. In addition, the weight percentage of the phosphor is more preferably in the range from 30% to 50%, both inclusive.

—Addition of Thixotropy Improver—

Now, described are effects obtained in the case where an ultra-fine-powdery silicon dioxide such as an ultra-fine-powdery silica (product name: "Aerosil" produced by Degussa Co., Ltd. (Germany)) is introduced, as a thixotropy improver (which is herein an agent having a function of improving a thixotropy index), in a silicate phosphor for a light-emitting semiconductor device.

FIG. 55 is a table showing respective characteristics of samples in which ultra-fine-powdery silicon dioxide such as ultra-fine-powdery silica is introduced, as a thixotropy improver, in a silicate phosphor for a light-emitting semiconductor device.

Data shown in FIG. 55 is obtained as results of experiments using three samples of: sample 1 containing only a 30 wt. % silicate phosphor; sample 2 containing an about 30 wt. % silicate phosphor and having an Aerosil concentration of 0.57%; and sample 3 containing an about 30 wt. % silicate phosphor and having an Aerosil concentration of 1.11%. FIG. 55 shows results on the luminance, total luminous flux and total radiant flux for the respective samples in the case where the chromaticity (x, y) is around (0.3, 0.3). From the comparison between sample 2 and sample 3, it is shown that as the Aerosil concentration increases, the luminance improves as well as the luminous flux and the radiant flux increase.

The respective standard deviations of the luminance, chromaticity (value x), total luminous flux, total radiant flux for each of the samples are shown. The standard deviations of all the items for sample 3 are the smallest among the three samples, and therefore sample 3 is the most reliable. Although the values of the chromaticities differ to some degree among the samples and therefore the data therefor is used only as a reference, the luminance, luminous flux and radiant flux for sample 1 are high but the standard deviation of the chromaticity for sample 1 is the highest among the three samples, and thus it can be understood that the reliability of sample 1 is low.

From the foregoing, it is conjectured that as the amount of Aerosil to be added increases, the luminance, luminous flux and radiant flux increase as well as the reliability improves. This is because the thixotropy of the silicate phosphor paste is enhanced with Aerosil and therefore the viscosity of the phosphor paste is appropriately set. Specifically, while the silicate phosphor paste is introduced in the light-emitting semiconductor device, potting is smoothly performed with the viscosity kept appropriate, so that the silicate phosphor particles disperse relatively evenly in the phosphor paste. After the paste is placed in a cavity in the light-emitting device, the viscosity thereof shifts to higher levels than during the potting, thus keeping the state in which the silicate phosphor particles do not sediment but disperse relatively evenly in a base material. In this manner, the color unevenness as observed in YAG-based phosphors is suppressed, resulting in improvement in the luminance, luminous flux and reliability.

Embodiment 3

In this embodiment, a method for forming a thin luminescent layer is described. According to this embodiment, yellow/yellowish phosphor particles which are expressed by the chemical formula $(Sr_{1-a1-b1-x}Ba_{a1}Ca_{b1}Eu_x)_2SiO_4$ where the values a1, b1 and x are in the ranges $0 \leq a1 \leq 0.3$, $0 \leq b1 \leq 0.8$ (more preferably $0 \leq b1 \leq 0.6$) and $0<x<1$, respectively, and which emit light having an emission peak in the wavelength range from 550 nm to 600 nm, both inclusive, are densely distributed near a light-emitting diode, so that a luminescent layer is made thin, i.e., the thickness through which light passes is reduced, thereby reducing attenuation of light. For example, this embodiment is for a method for fabricating a light-emitting semiconductor device in which a luminescent layer has a substantial thickness in the range from 50 µm to 1000 µm, both inclusive, where a light extraction surface of a blue-light-emitting device is located.

Hereinafter, examples of the fabrication method will be described.

—First Exemplary Fabrication Method—

Figure 50A:
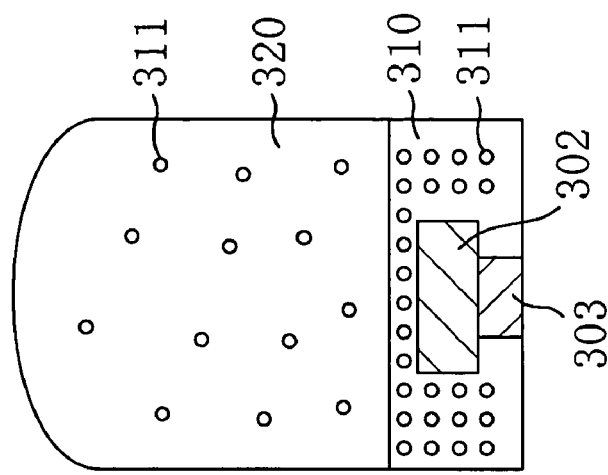
FIGS. 50(a) through 50(c) are cross-sectional views showing respective process steps in a first example of a fabrication method according to a third embodiment.
Figure 50B:
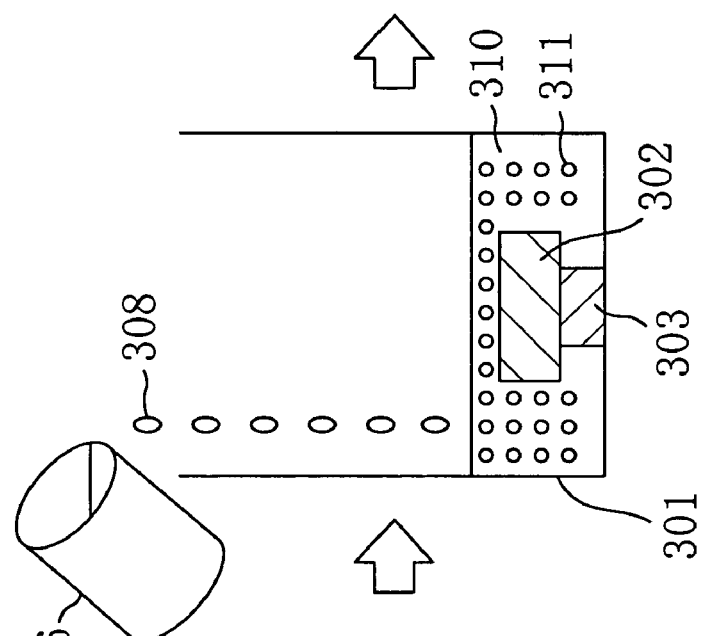
Figure 50C:
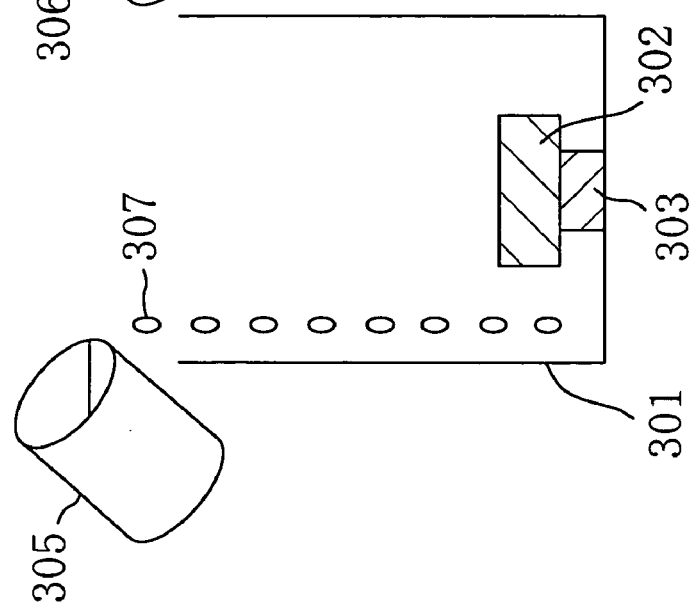

FIGS. 50(a) through 50(c) are cross-sectional views showing respective process steps in a first exemplary fabrication method according to this embodiment.

First, in a process step shown in FIG. 50(a), a substrate 303 and a light-emitting diode 302 (e.g., a blue LED) mounted on the substrate 303 are placed within a cavity of a mold 301. Then, a first phosphor paste 307 including, as main components, a base material 310 of a translucent resin and phosphor particles 311 containing a yellow/yellowish phosphor is poured into the mold 301 from a vessel 305. In this case, the phosphor paste 307 is poured to a level higher than the upper surface of the light-emitting diode 302. The light-emitting diode 302 has a main light extracting surface, which is a surface facing upward in FIG. 50(a).

Next, in a process step shown in FIG. 50(b), a second phosphor paste 308 containing phosphor particles 311 at a lower concentration than that in the first phosphor paste 307 is poured into the mold 301 from a vessel 306.

Then, in a process step shown in FIG. 50(c), the resin is cured so that the phosphor particles 311 are densely distributed in a portion of the base material 310 near the light-emitting diode 302, especially in a portion located over the main light extracting surface, whereas the phosphor particles 311 are sparsely dispersed in the base material 320 located apart from the light-emitting diode 302. Thereafter, the resultant light-emitting semiconductor device is taken out from the mold 301.

In this manner, it is possible to fabricate a white-light-emitting semiconductor device in which the phosphor particles 311 are densely distributed in a portion of the base material 310 located at least over the main light extracting surface of the light-emitting diode 302 and which exhibits small color unevenness. If such a light-emitting semiconductor device is installed in any of the light-emitting systems shown in FIGS. 4 through 6, a white-light-emitting system in which color unevenness is suppressed can be fabricated.

—Second Exemplary Fabrication Method—

FIGS. 51(a) through 51(c) are cross-sectional views showing respective process steps in a second exemplary fabrication method according to this embodiment.

First, in a process step shown in FIG. 51(a), a substrate 403 and a light-emitting diode 402 (e.g., a blue LED) mounted on the substrate 403 are placed within a cavity of a mold 401. Then, phosphor particles 411 containing a yellow/yellowish phosphor are sprinkled on the vicinity of the light-emitting diode 402 in the mold 401, especially on a main light extracting surface of the diode 402. The main light extracting surface of the light-emitting diode 402 is a surface facing upward as shown in FIG. 51(*a*).

Next, in a process step shown in FIG. 51(*b*), a phosphor paste 408 including, as main components, a base material 410 of a translucent resin and a small amount of phosphor particles 411 containing a yellow/yellowish phosphor is poured into the mold 401 from a vessel 405.

Then, in a process step shown in FIG. 51(*c*), the resin is cured so that the phosphor particles 411 are densely distributed in a portion of the base material 410 near the light-emitting diode 402, especially in a portion located over the main light extracting surface, whereas the phosphor particles 411 are sparsely dispersed in a portion of the base material 410 apart from the light-emitting diode 402. Thereafter, the resultant light-emitting semiconductor device is taken out from the mold 401.

In this manner, it is possible to fabricate a light-emitting semiconductor device in which the phosphor particles 411 are densely distributed in a portion of the base material 410 located at least over the main light extracting surface of the light-emitting diode 402 and which exhibits small color unevenness. If such a light-emitting semiconductor device is installed in any of the light-emitting systems shown in FIGS. 4 through 6, a light-emitting system with small color unevenness can be fabricated.

—Third Exemplary Fabrication Method—

FIGS. 52(*a*) through 52(*d*) are cross-sectional views showing respective process steps in a third exemplary fabrication method according to this embodiment.

First, in a process step shown in FIG. 52(*a*), a substrate 503 and a light-emitting diode 502 (e.g., a blue LED) mounted on the substrate 503 are placed within a cavity of a mold 501. Then, a suspension 507 containing, as main components, a volatile solvent 510 and phosphor particles 511 including a yellow/yellowish phosphor is poured into the mold 501 from a vessel 505. In this case, the suspension 507 is poured to a level higher than the upper surface of the light-emitting diode 502. The light-emitting diode 502 has a main light extracting surface, which is a surface facing upward as shown in FIG. 52(*a*).

Next, in a process step shown in FIG. 52(*b*), the volatile solvent 510 in the suspension 507 is evaporated by heating or pressure reduction.

Then, in a process step shown in FIG. 52(*c*), a phosphor paste 508 including, as main components, a base material 512 of a translucent resin and a small amount of phosphor particles 511 containing a yellow/yellowish phosphor is poured into the mold 501 from a vessel 506.

Then, in a process step shown in FIG. 50(*d*), the resin is cured so that the phosphor particles 511 are densely distributed in a portion of the base material 512 near the light-emitting diode 502, especially in a portion located over the main light extracting surface, whereas the phosphor particles 511 are sparsely dispersed in a portion of the base material 512 located apart from the light-emitting diode 502. Thereafter, the resultant light-emitting semiconductor device is taken out from the mold 501.

In this manner, it is possible to fabricate a white-light-emitting semiconductor device in which the phosphor particles 511 are densely distributed in a portion of the base material 512 located at least over the main light extracting surface of the light-emitting diode 502 and which exhibits small color unevenness. If such a light-emitting semiconductor device is installed in any of the light-emitting systems shown in FIGS. 4 through 6, a white-light-emitting system with small color unevenness can be fabricated.

(Fourth Exemplary Fabrication Method)

The difference in specific gravity between the phosphor and a base material is considered a cause of sedimentation of a YAG-based phosphor. The fact that the YAG-based phosphor is positively charged is also considered another cause of the sedimentation. Specifically, if a resin as the base material is positively charged, as is the YAG-based phosphor, the resin and the YAG-based phosphor repel each other in general, so that the YAG-based phosphor sediments.

On the other hand, considering the fact that silicate phosphor particles containing a compound expressed by $(Sr_{1-a1-b1-x}Ba_{a1}Ca_{b1}Eu_x)_2SiO_4$ as a main component does not sediment in the same resin, and considering the relationship between the electrification and the sedimentation, the attracting relationship between the positively charged resin and the negatively charged silicate phosphor particles presumably contributes to substantially even distribution of the silicate phosphor particles in the resin. Examples of such resins to be positively charged include an epoxy resin and a silicone resin.

In view of this, means for sedimenting the silicate phosphor may be a method for coating the phosphor particles with, for example, an oxide to be positively charged.

Examples of the method for coating the surface of the phosphor with an oxide or a fluoride include the following methods. First, suspensions including phosphor particles and coating particles of a needed oxide or fluoride are mixed and agitated, and then subjected to suction filtration. Thereafter, the substance remaining after the filtration is dried at 125° C. or higher and then is fired at 350° C. In order to improve the adherability between the phosphor particles and the oxide or fluoride, a small amount of a resin, an organic silane or a liquid glass may be added.

To apply the coating, a method utilizing the hydrolysis of an organic metal compound may also be used. For example, if an $Al_2O_3$ film is to be formed, $Al(OC_2H_5)_3$ which is aluminum alkoxide, is used for a phosphor and is mixed and agitated in an alcohol solution, thereby applying $Al_2O_3$ to the surface of the phosphor.

If the amount of positively charged oxide or fluoride coating which is applied to the surfaces of the phosphor particles is too small, only a small effect is achieved, whereas if the amount thereof is too large, the coating absorbs light emitted so that the luminance decreases and therefore such a large amount of the coating is also unfavorable. As a result of experiments, it is found that the amount is preferably in the range from 0.05% to 2.0% of the phosphor particles in weight.

In this manner, it is possible to fabricate a white-light-emitting semiconductor device in which phosphor particles are densely distributed in a portion of a base material located at least over a main light extracting surface of a light-emitting diode and which exhibits small color unevenness. If such a light-emitting semiconductor device is installed in any of the light-emitting systems shown in FIGS. 4 through 6, a white-light-emitting system with small the color unevenness can be fabricated.

According to the fabrication method of the third embodiment, it is possible to obtain a light-emitting semiconductor device in which a luminescent layer has a substantial thickness in the range from 50 μm to 1000 μm, both inclusive, where a light extraction surface of a blue-light-emitting device is located.

Other Embodiments

In the foregoing embodiments, a single blue LED is provided as a blue-light-emitting device in a light-emitting semiconductor device. However, the inventive light-emitting semiconductor device is not limited to these embodiments.

Figure 56:
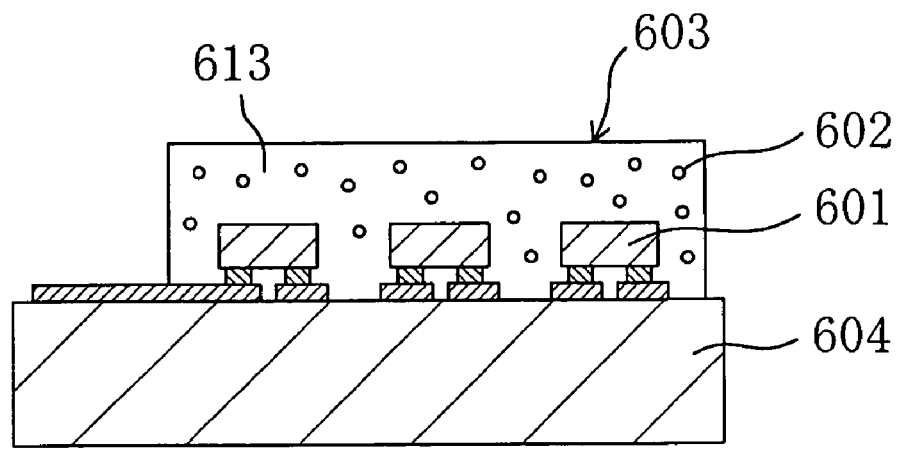
FIG. 56 is a cross-sectional view showing a structure of a light-emitting semiconductor device including a plurality of blue LEDs.

FIG. 56 is a cross-sectional view showing a structure of a light-emitting semiconductor device including a plurality of blue LEDs. As shown in FIG. 56, the light-emitting semiconductor device includes: a plurality of blue LEDs 601 arranged on a substrate 604; and a luminescent layer 603 covering respective main light extracting surfaces (upper surfaces in the state shown in FIG. 56) of the blue LEDs 601. The luminescent layer 603 includes: phosphor particles 602 of a yellow/yellowish phosphor having the composition described in each of the embodiments; and a resin 613 serving as a base material in which the phosphor particles 602 are dispersed. The resin 613 may be made of any of the materials described in the embodiments. A Zener diode may be mounted on the substrate 604.

With this structure, it is possible to improve the luminous intensity of the white-light-emitting semiconductor device, or adjust the luminous intensity depending on the number of the mounted blue LEDs 601.

In the embodiment of the light-emitting system, the example in which a large number of light-emitting semiconductor devices each including one blue LED and one luminescent layer is described. However, the inventive light-emitting system is not limited to the embodiment.

Figure 57:
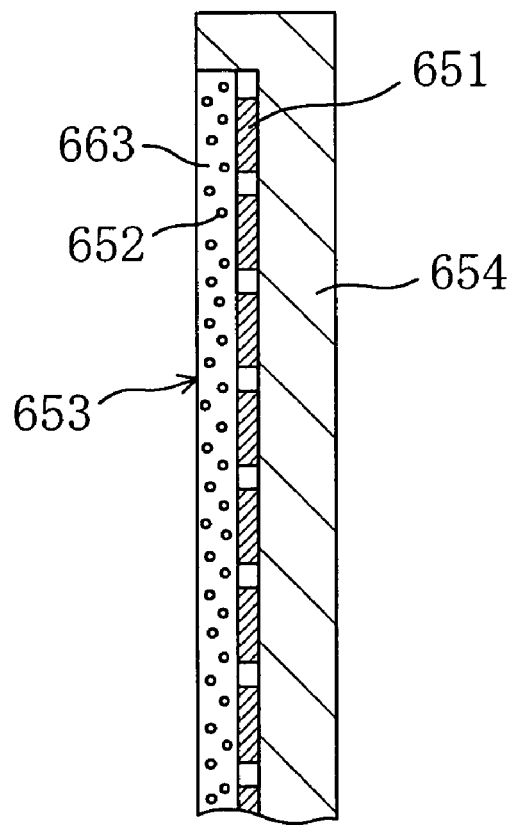
FIG. 57 is a cross-sectional view showing a structure of a light-emitting system including a large number of blue LEDs and a single luminescent layer.

FIG. 57 is a cross-sectional view showing a structure of a light-emitting system including a large number of blue LEDs and a single luminescent layer. As shown in FIG. 57, the light-emitting system includes: a large number of blue LEDs 651 (blue-light-emitting devices) supported by a supporter 654; and a single luminescent layer 653 provided on the entire surfaces of the blue LEDs 651. The luminescent layer 653 includes: two glass substrates; a resin 663 as a base material filled in a gap between the two glass substrates; and phosphor particles 652 dispersed in the resin 663. The periphery of the luminescent layer 653 is supported by the supporter 654. The phosphor particles 652 are constituted by a yellow/yellowish phosphor having the composition described in the embodiments. The resin 613 may be made any of the materials described in the embodiments.

In the structure shown in FIG. 57, the single luminescent layer 653 is sufficient for the large number of blue LEDs 651. Therefore, the fabrication cost is reduced and the fabrication process is simplified.

INDUSTRIAL APPLICABILITY

With respect to the inventive light-emitting semiconductor device, various kinds of displaying systems (e.g., LED information display terminals, LED traffic lights, LED stoplights of vehicles, and LED directional lights) and various kinds of lighting systems (e.g., LED interior/exterior lights, courtesy LED lights, LED emergency lights, and LED surface emitting sources) are defined broadly as light-emitting systems. In particular, the inventive light-emitting semiconductor device is suitable for systems utilizing white light.

What is claimed is:
1. A light-emitting semiconductor device comprising:
a blue-light-emitting diode which emits blue light, the blue-light-emitting diode having a light extraction surface; and
a luminescent layer which includes a yellow/yellowish phosphor that absorbs blue light emitted by the blue-light-emitting diode to emit a yellow/yellowish fluorescence,
wherein the luminescent layer is exposed on the blue-light-emitting diode,
the yellow/yellowish phosphor contains a compound expressed by the chemical formula:

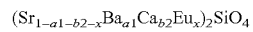
$(Sr_{1-a1-b2-x}Ba_{a1}Ca_{b2}Eu_x)_2SiO_4$ (where $0 \leq a1 \leq 0.3$, $0 \leq b2 \leq 0.6$, $0.005 < x < 0.1$),
the yellow/yellowish phosphor has a particle size in the range from 0.5 μm to 30 μm, both inclusive, and is made of a silicate phosphor having an orthorhombic structure, and
a portion of the luminescent layer located at least on the light extraction surface of the blue-light-emitting diode has a substantial thickness in the range from 50 μm to 1000 μm, both inclusive.

2. The light-emitting semiconductor device of claim 1, wherein the silicate phosphor has a particle size in the range from 1 μm to 20 μm, both inclusive.

3. The light-emitting semiconductor device of claim 1, wherein the luminescent layer has a substantial thickness in the range from 100 μm to 700 μm, both inclusive.

4. The light-emitting semiconductor device of claim 1, wherein the luminescent layer includes a base material made of a translucent resin and particles of the yellow/yellowish phosphor, and
the particles of the yellow/yellowish phosphor are dispersed throughout the base material.

5. The light-emitting semiconductor device of claim 4, wherein the luminescent layer is formed by curing a phosphor paste having the yellow/yellowish phosphor and the resin, and
the phosphor paste contains ultra-fine particles including primary particles having an average particle size in the range from 1 nm to 100 nm, both inclusive.

6. The light-emitting semiconductor device of claim 1, wherein the blue-light-emitting diode emits light having a main emission peak in the wavelength range greater than 430 nm and less than or equal to 500 nm.

7. The light-emitting semiconductor device of claim 6, wherein the yellow/yellowish phosphor emits light having a main emission peak in the wavelength range from 550 nm to 600 nm, both inclusive.

8. The light-emitting semiconductor device of claim 7, wherein the blue-light-emitting diode is made of a semiconductor selected from the group consisting of a gallium nitride-based compound semiconductor, a zinc selenide semiconductor and a zinc oxide semiconductor.

9. The light-emitting semiconductor device of claim 8, wherein the color of light emitted by the light-emitting semiconductor device has an emission chromatical point (x, y) in the ranges $0.21 \leq x \leq 0.48$ and $0.19 \leq y \leq 0.45$, respectively, in a CIE chromaticity diagram.

10. The light-emitting semiconductor device of claim 9, wherein blue light emitted by the blue-light-emitting diode passes through the luminescent layer so that the color of the fluorescence emitted by the phosphor is added to the color of the blue light, thereby producing white light.

11. The light-emitting semiconductor device of claim 10, wherein the luminescent layer further includes a red/reddish phosphor having a main emission peak in the red/reddish wavelength range greater than 600 nm and less than or equal to 660 nm.

12. The light-emitting semiconductor device of claim 10, wherein the luminescent layer further includes a green/greenish phosphor having a main emission peak in the green/greenish wavelength range greater than or equal to 500 nm and less than 550 nm.

13. The light-emitting semiconductor device of claim 12, wherein the green/greenish phosphor is a silicate phosphor containing, as a main component, a compound expressed by the chemical formula:

$$(Sr_{1-a3-b3-x}Ba_{a3}Ca_{b3}Eu_x)_2SiO_4$$

(where $0 \leq a3 \leq 1$, $0 \leq b3 \leq 1$, $0<x<1$).

14. The light-emitting semiconductor device of claim 10, wherein the luminescent layer includes a plurality of said silicate phosphors each of which emits yellow/yellowish light having a main emission peak in the wavelength range from 550 nm to 600 nm, both inclusive and mutually differs in composition.

15. The light-emitting semiconductor device of claim 10, wherein the blue-light-emitting diode is a flip-chip-type blue-light-emitting diode, the flip-chip-type blue-light-emitting diode is mounted on a submount element to be electrically connected thereto, and the luminescent layer within which particles of the yellow/yellowish phosphor exist encapsulates the flip-chip-type blue-light-emitting diode.

16. The light-emitting semiconductor device of claim 10, wherein the blue-light-emitting diode is mounted in a cup provided in a mount lead to be electrically connected to the cup, the luminescent layer within which particles of the yellow/yellowish phosphor exist is provided in the cup.

17. The light-emitting semiconductor device of claim 10, wherein the blue-light-emitting diode is placed in a casing, and the luminescent layer within which particles of the yellow/yellowish phosphor exist is provided in the casing.

18. The light-emitting semiconductor device of claim 10, wherein the surface of the portion of the luminescent layer located at least on the main light-extracting surface of the blue-light-emitting diode is flat and parallel to the main light-extracting surface.

19. A light-emitting semiconductor system comprising the light-emitting semiconductor device of claim 1.

* * * * *

UNITED STATES PATENT AND TRADEMARK OFFICE
CERTIFICATE OF CORRECTION

| | |
|---|---|
| PATENT NO. | : 7,023,019 B2 |
| APPLICATION NO. | : 10/469740 |
| DATED | : April 4, 2006 |
| INVENTOR(S) | : Toshihide Maeda et al. |

Page 1 of 1

It is certified that error appears in the above-identified patent and that said Letters Patent is hereby corrected as shown below:

Title page

Item "(75) Inventors", change " Hirakata " to -- Osaka --

Item "(75) Inventors", change " Suita " to -- Osaka --

Signed and Sealed this

Seventh Day of November, 2006

JON W. DUDAS
*Director of the United States Patent and Trademark Office*